(12) United States Patent
Falster

(10) Patent No.: US 6,342,725 B2
(45) Date of Patent: Jan. 29, 2002

(54) SILICON ON INSULATOR STRUCTURE HAVING A LOW DEFECT DENSITY HANDLER WAFER AND PROCESS FOR THE PREPARATION THEREOF

(75) Inventor: Robert J. Falster, London (GB)

(73) Assignee: MEMC Electronic Materials, Inc., St. Peters, MI (US)

( * ) Notice: Subject to any disclaimer, the term of this patent is extended or adjusted under 35 U.S.C. 154(b) by 0 days.

(21) Appl. No.: 09/737,715

(22) Filed: Dec. 15, 2000

Related U.S. Application Data

(63) Continuation of application No. 09/387,288, filed on Aug. 31, 1999, now Pat. No. 6,236,104.
(60) Provisional application No. 60/098,902, filed on Sep. 2, 1998.

(51) Int. Cl.[7] .......................... H01L 29/06; H01L 27/01; H01L 27/12; H01L 31/0392
(52) U.S. Cl. .......................... 257/618; 257/347; 257/617
(58) Field of Search .................................. 257/347, 618, 257/913, 617

(56) References Cited

U.S. PATENT DOCUMENTS

| | | |
|---|---|---|
| 4,314,595 A | 2/1982 | Yamamoto et al. |
| 4,376,657 A | 3/1983 | Nagasawa et al. |
| 4,437,922 A | 3/1984 | Bishoff et al. |
| 4,505,759 A | 3/1985 | O'Mara |
| 4,548,654 A | 10/1985 | Tobin |
| 4,851,358 A | 7/1989 | Huber |
| 4,868,133 A | 9/1989 | Huber |
| 4,981,549 A | 1/1991 | Yamashita et al. |
| 5,189,500 A | 2/1993 | Kusunoki |
| 5,264,189 A | 11/1993 | Yamashita et al. |
| 5,327,007 A | 7/1994 | Imura et al. |

(List continued on next page.)

FOREIGN PATENT DOCUMENTS

| | | |
|---|---|---|
| DE | 3905626 A1 | 8/1989 |
| DE | 4323964 A1 | 1/1994 |
| DE | 4414947 A1 | 8/1995 |
| DE | 19806045 A1 | 8/1998 |
| EP | 0503816 B1 | 9/1992 |

(List continued on next page.)

OTHER PUBLICATIONS

Eidenzon, A.M., et al., "Defect–free Silicon Crystals Grown by The Czochralski Technique", Inorganic Materials, vol. 33, No. 3 (1977) pp. 219–225.

Eidenzon, A.M., et al., "Influence of Growth Rate on Swirl Defects in Large Dislocation–Free Crystals of Silicon Grown by the Czochralski Method", Sov. Phys. Crystallogr., vol. 30, No. 5 (1985) pp. 576–580, American Institute of Physics.

(List continued on next page.)

Primary Examiner—Ngân V. Ngô
(74) Attorney, Agent, or Firm—Senniger, Powers, Leavitt & Roedel

(57) ABSTRACT

The present invention relates to a process for the preparation of a silicon on insulator wafer. The process including implanting oxygen in a single crystal silicon wafer having an axially symmetric region in which there is a predominant intrinsic point defect which is substantially free of agglomerated intrinsic point defects. Additionally, the present invention relates to a silicon on insulator ("SOI") structure in which the device layer and the handle wafer each have an axially symmetric region which is substantially free of agglomerated intrinsic point defects. Additionally, the present invention is directed to such a SOI structure in which the handle wafer is capable of forming an ideal, non-uniform depth distribution of oxygen precipitates upon being subjected to the heat treatment cycles of essentially any arbitrary electronic device manufacturing process.

42 Claims, 35 Drawing Sheets

U.S. PATENT DOCUMENTS

| | | |
|---|---|---|
| 5,401,669 A | 3/1995 | Falster et al. |
| 5,403,406 A | 4/1995 | Falster et al. |
| 5,436,175 A | 7/1995 | Nakato et al. |
| 5,445,975 A | 8/1995 | Gardner et al. |
| 5,474,020 A | 12/1995 | Bell et al. |
| 5,478,408 A | 12/1995 | Mitani et al. |
| 5,485,803 A | 1/1996 | Habu |
| 5,487,354 A | 1/1996 | von Ammon et al. |
| 5,502,010 A | 3/1996 | Nadahara et al. |
| 5,502,331 A | 3/1996 | Inoue et al. |
| 5,534,294 A | 7/1996 | Kubota et al. |
| 5,539,245 A | 7/1996 | Imura et al. |
| 5,593,494 A | 1/1997 | Falster |
| 5,611,855 A | 3/1997 | Wijaranakula |
| 5,659,192 A | 8/1997 | Sarma et al. |
| 5,667,584 A | 9/1997 | Takano et al. |
| 5,674,756 A | 10/1997 | Satoh et al. |
| 5,704,973 A | 1/1998 | Sakurada et al. |
| 5,728,211 A | 3/1998 | Takano et al. |
| 5,738,942 A | 4/1998 | Kubota et al. |
| 5,788,763 A | 8/1998 | Hayashi et al. |
| 5,939,770 A | 8/1999 | Kageyama |
| 5,944,889 A | 8/1999 | Park et al. |
| 5,954,873 A | 9/1999 | Hourai et al. |
| 5,968,262 A | 10/1999 | Saishouji et al. |
| 5,968,264 A | 10/1999 | Iida et al. |
| 6,045,610 A | 4/2000 | Park et al. |
| 6,236,104 B1 * | 5/2001 | Falster ....................... 257/618 |

FOREIGN PATENT DOCUMENTS

| | | |
|---|---|---|
| EP | 0504837 A2 | 9/1992 |
| EP | 0536958 A1 | 4/1993 |
| EP | 0716168 A1 | 6/1996 |
| EP | 0799913 | 12/1998 |
| EP | 0962556 A1 | 12/1999 |
| GB | 2182262 | 5/1986 |
| JP | 59119822 | 7/1984 |
| JP | 2180789 | 7/1990 |
| JP | 3-9078 | 2/1991 |
| JP | 4108682 | 4/1992 |
| JP | 5-155700 A | 6/1993 |
| JP | 8-330316 | 5/1995 |
| JP | 7-201874 A | 8/1995 |
| JP | 7321120 | 12/1995 |
| JP | 7335657 | 12/1995 |
| JP | 8045944 | 2/1996 |
| JP | 8/045945 | 2/1996 |
| JP | 8045947 | 2/1996 |
| JP | 8/268794 | 10/1996 |
| JP | 8-293589 | 11/1996 |
| JP | 9-199416 | 7/1997 |
| JP | 9/202690 | 8/1997 |
| JP | 9-326396 | 12/1997 |
| JP | 11-067781 A | 3/1999 |
| JP | 11-150119 | 6/1999 |
| JP | 11-157995 A | 6/1999 |
| JP | 11-180800 A | 7/1999 |
| JP | 11-189495 A | 7/1999 |
| JP | 11-199386 A | 7/1999 |
| JP | 11-199387 A | 7/1999 |
| WO | WO 97/26393 | 7/1997 |
| WO | WO 98/38675 | 9/1998 |
| WO | WO 98/45507 | 10/1998 |
| WO | WO 98/45508 | 10/1998 |
| WO | WO 98/45509 | 10/1998 |
| WO | WO 98/45510 | 10/1998 |

OTHER PUBLICATIONS

Hourai, M., et al. "Growth Parameters Determining the Type of Grown–In Defects in Czockralski Silicon Crystals", Materials Science Forum, Vols. 196–201 (1995) pp. 1713–1718.

Park, J.G., et al., "Effect of Crystal Defects on Device Characteristics", Proceedings of the Symposium on Crystalline Defects and Contamination: Their Impact And Control In Device Manufacturing II, Proceed. vol. 97–22 (1997), pp. 173–195.

Puzanov, N.I. et al. "Modelling Microdefect Distribution In Dislocation–Free Si Crystals Grown From The Melt"; Journal of Crystal Growth 178 (1997) pp. 468–478.

Puzanov, N.I. et al. "Formation Of The Bands Of Anomalous Oxygen Precipitation In Czochralski–grown Si Crystals", Journal of Crystal Growth 137 (1994) pp. 642–652.

Puzanov, N.I. et al. "The Role Of Intrinsic Point Defects In The Formation Of Oxygen Precipitation Centers In Dislocation–Free Silicon"; Crystallography Reports; vol. 41; No. 1(1996) pp. 134–141.

Puzanov, N.I. et al. "Harmful Microdefects In The Seed –End Portion Of Large–Diameter Silicon Ingots", Inorganic Materials, vol. 33, No. 8 (1997) pp. 765–769.

Puzanov, N.I., et al., "Role of Vacancies in the Nucleation of Ringlike–patterned Oxidation–induced Stacking Faults in Melt–grown Silicon Crystals", Inorganic Materials, vol. 34, No. 4 (1998) pp. 307–314.

Abe, T., "Innovated Silicon Crystal Growth and Wafering Technologies" Electrochemical Society Proceedings, vol. 97, No. 3, pp. 123–133. (No Month).

Abe, T., et al., "Defect–Free Surfaces of Bulk Wafers by Combination of RTA and Crystal Growth Conditions" (publication information unknown) (No Month/No Year).

Chiou, H.D., et al., "Gettering of Bonded Soi Layers", Proceedings of the International Symposium on Silicon–On –Insulator Technology and Devices, pp. 416–423.

Chiou, Hering–Der, "The Effects of Preheatings on Axial Oxygen Precipitation Uniformity in Czochralski Silicon Crystals", J. Electrochem. Soc., vol. 139, No. 6, Jun. 1992.

de Kock, A.J.R., et al., "The Effect of Doping on the Formation of Swirl Defects in Dislocation–Free Czochralski–Grown Silicon Crystals", Journal of Crystal Growth, vol. 49, pp. 718–734, 1980.

Dornberger, E., et al., "The Dependence Ring Like Distributed Stacking FAults on the Axial Temperature Gradient of Growing Czochralski Dilicon Crystals", Electrochemical Society Proceedings, vol. 95–4, (May 1995) pp. 294–305.

Dornberger, E., et al., "Simulation of Grown–In Voids in Czochralski Silicon Crystals", Electrochemical Society Proceedings, vol. 97, No. 22, pp. 40–49.

Dornberger, E., et al., "Simulation of Non–Uniform Grown–In Void Distributions in Czochralski Silicon Crystals", Electrochemical Society Proceedings, vol. 98, vol. 1, pp. 490–503.

Dornberger, E., et al., "The Impact of Dwell Time Above 900° C During Crystal Growth on the Gate Oxide Integrity of Silicon Wafers", Electrochemical Society Proceedings, vol. 96, No. 13, pp. 140–151.

Falster, R., et al., "The Engineering of Silicon Wafer Material Properties Through Vacancy Concentration Profile Control and the Achievement of Ideal oxygen Precipitation Behavior", Mat. Res. Soc. Symp. Proc. vol. 510, pp. 27–35, 1998 (No Month).

Faslter, R., et al., "Intrinsic Point–Defects and Reactions in the Growth of Large Silicon Crystals", Electrochemical Society Proceedings, vol. 98–1, pp. 468–489.

Hara, A., et al. "Enhancement of Oxygen Precipitation in Quenched Czochralski Silicon Crystals" Journal of Applied Phys. vol. 66 (1989) pp. 3958–3960 (Oct. 1989).

Hawkins, G.A., et al., "Effect of Rapid Thermal Processing on Oxygen Precipitation in Silicon", Mat. Res. Soc. Symp. Proc., vol. 104, pp. 197–200, 1988.

Hawkins, G.A., et al., "The Effect of Rapid Thermal Annealing on the Precipitation of Oxygen in Silicon", J. Appl. Phys., vol. 65, No. 9, pp. 3644–3654, 1989.

Jacob, M., et al. "Influence of RTP on Vacancy Concentrations", Mat. Res. Soc. Symp. Proc. vol. 490, pp. 129–134, 1998. (No Month).

Jacob, et al., "Determination of Vacancy Concentrations in the Bulk of Silicon Wafers by Platinum Diffusion Experiments", J. Appl. Phys., vol. 82, No. 1 (1997), pp. 182–191.

Kissinger, G., et al., "A Method for Studying the Grwon–In Defect Density Spectra in Czochralski Silicon Wafers", J. Electrochem. Soc., vol. 144, No. 4, pp. 1447–1456, 1997.

Mulestagno, L., et al., "Gettering of Copper in Bonded Silicon Wafers", Electrochemical Society Proceedings, vol. 96, No. 3, pp. 176–182.

Nakamura, Kozo, et al., "Formation Process of Grown–In Defects in Czochralski Grown Silicon Crystals", Journal of Crystal Growth, vol. 180, pp. 61–72, 1997.

Pagani, M., et al. "Spatial variations on oxygen precipitation in silicon after high temperature rapid thermal annealing", Appl. Physl. Lett., vol. 70, No. 12, pp. 1572–1574, 1997. (Mar. 1997).

Shimura, F., "Semiconductor Silicon Crystal Technology" Academic Press, Inc., San Diego, CA (1989) pp. 360–377. (No Month).

Sinno, T., et al., "On the Dynamics of the Oxidation–Induced Stacking–Fault Ring in as–grown Czochralski silicon crystals", Applied Physics Letters, vol. 70, No. 17, pp. 2250–2252, 1997.

Sinno, T., et al., "Point Defect Dynamics and the Oxidation–induced Stacking–Fault Ring in Czochralski–Grown Silicon Crystals", J. Electrochem. Soc., vol. 145, No. 1, pp. 302–318, 1998.

Tan, T. Y., "Point Defects, Diffusion Processes, and Swirl Defect Formation in Silicon", Appl. Phys. A., vol. 37, pp. 1–17, 1985.

Vanhellemont, J., et al., "Defects in As–Grown Silicon and Their Evolution During Heat Treatments", Materials Science Forum, Vols. 258–263, pp. 341–346, 1997.

Von Ammon et al. "The Dependence of Bulk Defects on the Axial Temperature Gradient of Silicon Crystals During Czochralski Growth" Journal of Crystal Growth, vol. 151 (1995) pp. 273–277.

Voronkov, "The Mechanism of Swirl Defects Formation in Silicon", Journal of Crystal Growth, vol. 59, pp. 625–643, 1982.

Voronkov, V., et al., "Behavior and Effects of Intrinsic Point Defects in the Growth of Large Silicon Crystals" Electrochemical Society Proceedings, vol. 97–22, (Aug. 1997), pp. 3–17.

Voronkov, V., et al., "Grown–in microdefects, residual vacancies and oxygen precipitation banks in Czochralski silicon" Journal of Crystal Growth, 304 (1999) pp. 462–474.

Winkler et al. "Improvement of the Gate Oxide Integrity by Modifying Crystal Pulling and its Impact on Device Failures" J. Electrochem. Soc., vol. 141, No. 5 (1994) pp. 1398–1401. (May 1994).

Zimmerman al. "Vacancy Concentration Wafer Mapping in Silicon" J. Crystal Growth, vol. 129 (1993) pp. 582–592. (No Month).

International Search Report for Application No. PCT/US 99/19958, filed Aug. 31, 1999, 11 pages.

* cited by examiner

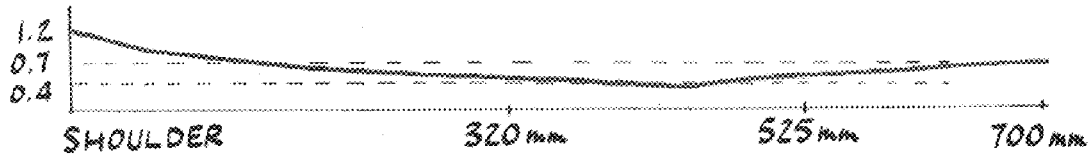
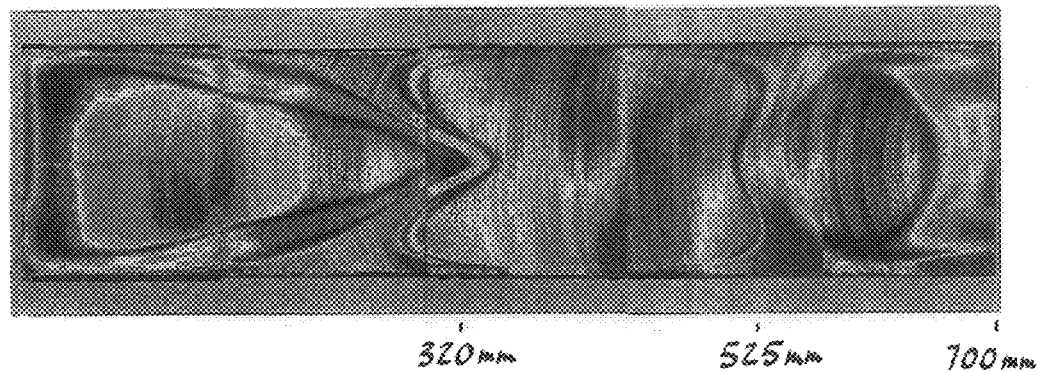
FIG. 24

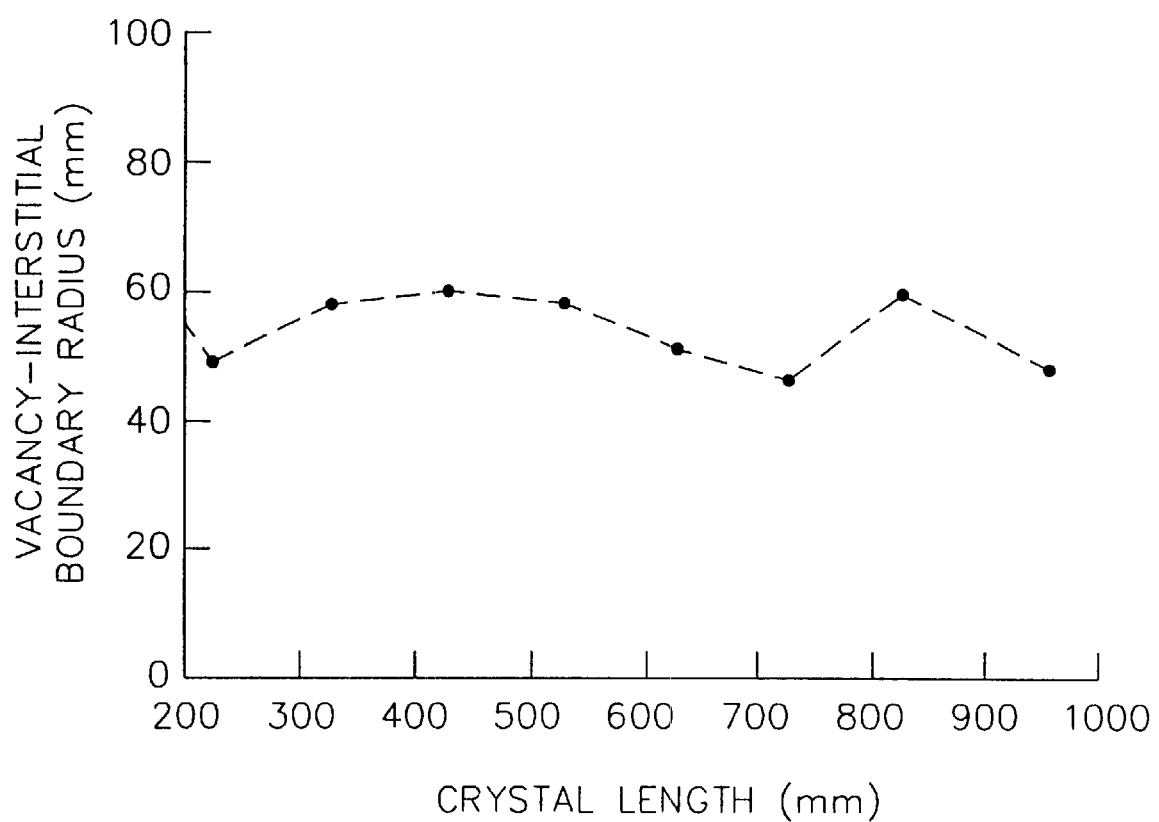

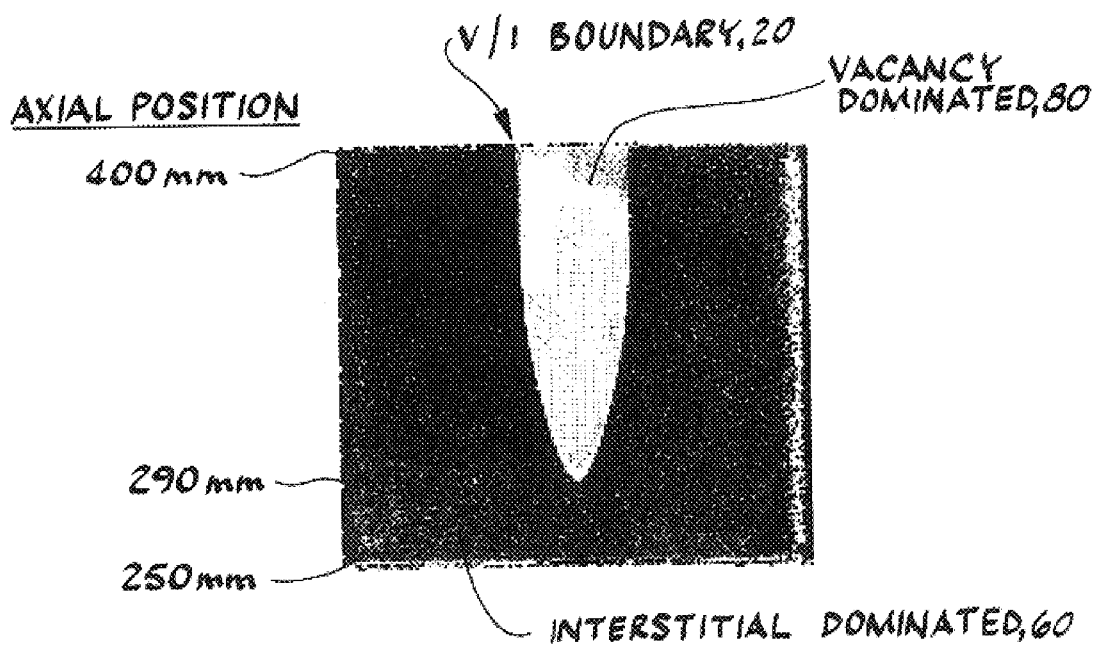

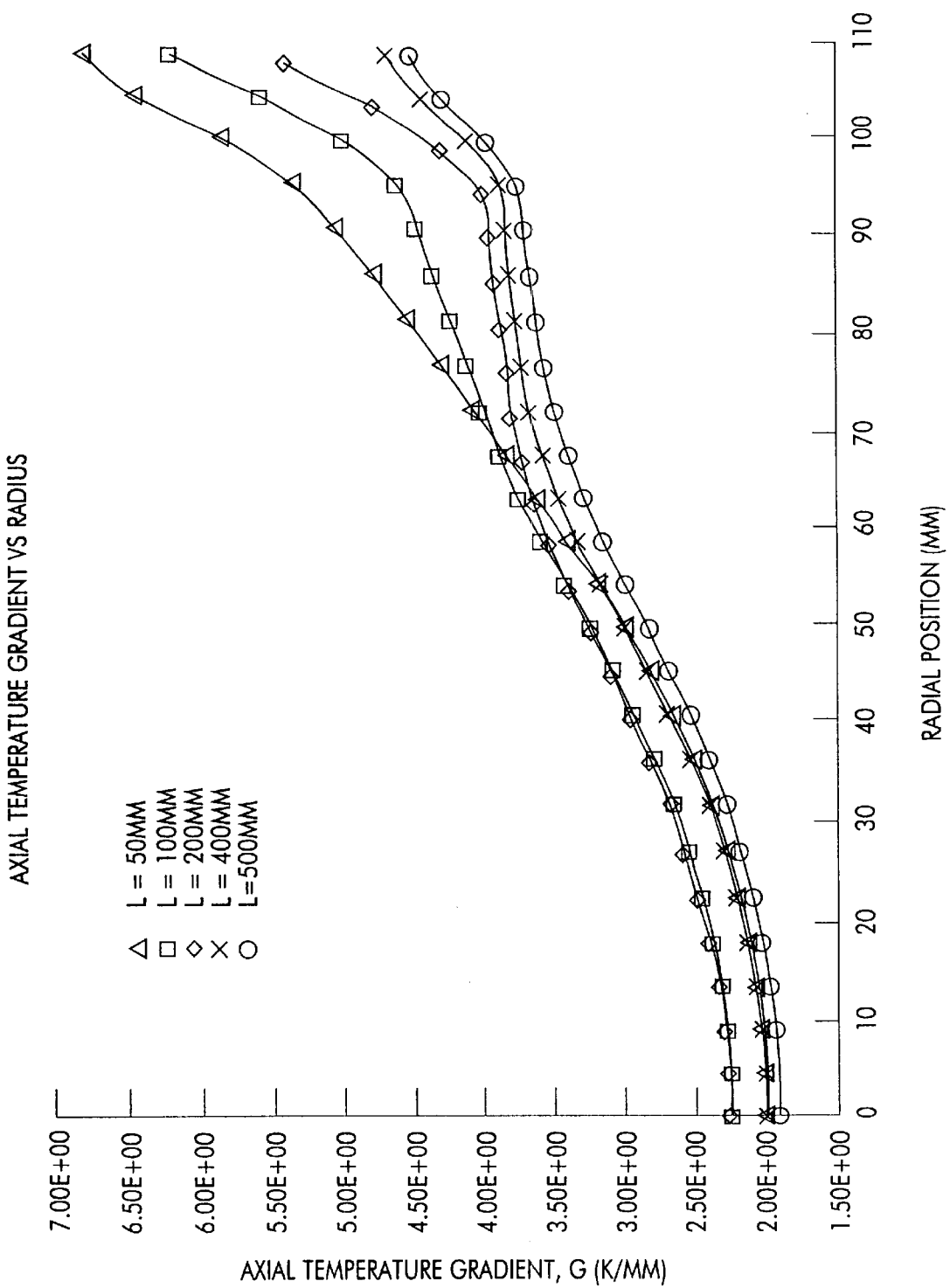

US 6,342,725 B2

SILICON ON INSULATOR STRUCTURE HAVING A LOW DEFECT DENSITY HANDLER WAFER AND PROCESS FOR THE PREPARATION THEREOF

CROSS-REFERENCE TO RELATED APPLICATION

This application claims priority from U.S. provisional application Serial No. 60/098,902, filed on Sep. 2, 1998 and a con't of U.S. application Ser. No. 09/387,288 filed on Aug. 31, 1999, now U.S. Pat. No. 6,236,104.

BACKGROUND OF THE INVENTION

The present invention is directed to a silicon on insulator (SOI) structure having a low defect density device layer. More specifically, the present invention is directed to a SOI structure wherein the device layer is derived from a single crystal silicon wafer which is substantially free of agglomerated intrinsic point defects. Additionally, the present invention is directed to a SOI structure having a single crystal silicon handle wafer which is capable of forming an ideal, non-uniform depth distribution of oxygen precipitates, upon being subjected to the heat treatment cycles of essentially any arbitrary electronic device manufacturing process.

A SOI structure generally comprises a handle wafer, a device layer, and an insulating film, (typically an oxide layer) between the handle wafer and the device layer. Generally, the device layer is between 0.5 and 20 micrometers thick. Such a wafer may be prepared using various techniques known in the art. For example, wafer thinning techniques may be used, often referred to as back etch SOI (i.e., BESOI), wherein a silicon wafer is bound to the handle wafer and then slowly etched away until only a thin layer of silicon on the handle wafer remains. (See, e.g., U.S. Pat. No. 5,189,500). Alternatively, a single wafer may be used wherein molecular oxygen ions ($O_2^+$) or atomic oxygen ions ($O^+$) are implanted below the surface of the wafer to form an oxide layer. This process is generally referred to as SIMOX (i.e., separation by implantation of oxygen; see, e.g., U.S. Pat. No. 5,436,175 and Plasma Immersion Ion Implantation For Semiconductor Processing, Materials Chemistry and Physics 46 (1996) 132–139). Such a process is considered advantageous because it acts to reduce the number of silicon wafers which are consumed, as compared to the more conventional wafer thinning processes, in the preparation of a SOI structure.

SOI structures may be prepared from silicon wafers sliced from single crystal silicon ingots grown in accordance with the Czochralski method. In recent years, it has been recognized that a number of defects in single crystal silicon form during the growth process as the crystal cools after solidification. Such defects arise, in part, due to the presence of an excess (i.e., a concentration above the solubility limit) of intrinsic point defects, which are known as vacancies and self-interstitials. Silicon crystals grown from a melt typically contain an excess of one or the other type of intrinsic point defect, either crystal lattice vacancies or silicon self-interstitials. It has been suggested that the type and initial concentration of these point defects in the silicon are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex and highly integrated circuits, such as those utilizing SOI structures.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

In addition to the above-mentioned vacancy-type defects, it is also believed that agglomerated vacancy defects, or voids, may be the cause of "HF defects" (i.e., metal precipitation defects). HF defects are, like these other vacancy-type defects, considered to be a critical problem with current SOI technology.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

Agglomerated intrinsic point defects can create performance problems for SOI substrates if silicon wafers containing such defects are utilized as the source of the device layer. Performance problems may also result from metallic contaminants present in the handle wafer portion of the SOI structure. During the heat treatments employed by the SOI process, metallic contaminants, present in the handle wafer as a result of cleaning and handling of the SOI structure, may migrate through the silicon matrix until the oxide layer, present between the handle wafer and the device layer, is reached. Although generally speaking these impurities may not pass through the oxide layer and into the device layer, the oxide layer is a preferential site for the precipitation of these impurities. This precipitation acts to disrupt the oxide layer and interfere with the performance of the SOI device.

Accordingly, a need continues to exist for a SOI substrate which contains a device layer which is substantially free of agglomerated intrinsic point defects. Additionally, a need continues to exist for a SOI substrate which contains a handle wafer capable of inhibiting the precipitation of metallic impurities at or near the oxide layer/silicon interface.

SUMMARY OF THE INVENTION

Among the objects of the present invention, therefore, is the provision of a silicon on insulator structure having a device layer containing an axially symmetric region of substantial radial width which is substantially free of defects resulting from an agglomeration of crystal lattice vacancies or silicon self-interstitials; the provision of such a structure having a handle wafer with improved gettering capabilities; the provision of such a structure wherein the handle wafer comprises a silicon wafer which is capable, during the heat treatment cycles of essentially any arbitrary electronic device manufacturing process, of forming an ideal, non-uniform depth distribution of oxygen precipitates; and, the provision of such a structure which is less susceptible to the formation of metal precipitate defects during device fabrication.

Briefly, therefore, the present invention is directed to a silicon on insulator structure which comprises (i) a handle wafer, (ii) a single crystal silicon device layer having a central axis, a circumferential edge, a radius extending from the central axis to the circumferential edge, and a first axially symmetric region which is substantially free of agglomerated intrinsic point defects, and (iii) an insulating layer between the handle wafer and the device layer.

The present invention is further directed to a silicon on insulator structure which comprises (i) a handle wafer, the handle wafer comprising a Czochralski single crystal silicon wafer having two major, generally parallel surfaces, one of which is the front surface and the other of which is the back surface of the silicon wafer, a central plane between the front and back surfaces, a circumferential edge joining the front and back surfaces, a surface layer which comprises a first region of the silicon wafer between the front surface and a distance, $D_1$, of at least about 10 micrometers, as measured from the front surface and toward the central plane, and a bulk layer which comprises a second region of the silicon wafer between the central plane and the first region, the silicon wafer being characterized in that it has a non-uniform distribution of crystal lattice vacancies with the concentration of vacancies in the bulk layer being greater than the concentration of vacancies in the surface layer, with the vacancies having a concentration profile in which the peak density of the vacancies is at or near the central plane with the concentration generally decreasing from the position of peak density in the direction of the front surface of the handle wafer, (ii) a single crystal silicon device layer, and (iii) an insulating layer between the handle wafer and the device layer.

The present invention is still further directed to a silicon on insulator structure which comprises (i) a handle wafer, the handle wafer comprising a Czochralski single crystal silicon wafer having two major, generally parallel surfaces, one of which is the front surface and the other of which is the back surface of the silicon wafer, a central plane between the front and back surfaces, a circumferential edge joining the front and back surfaces, a denuded zone which comprises the region of the silicon wafer from the front surface to a distance, $D_1$, of at least about 10 micrometers, as measured in the direction of the central plane, and which contains interstitial oxygen, the silicon wafer being characterized in that the concentration of interstitial oxygen in the denuded zone at a distance equal to about one-half of $D_1$ is at least about 75% of the maximum concentration of interstitial oxygen in the denuded zone, (ii) a single crystal silicon device layer; and (iii) an insulating layer between the handle wafer and the device layer.

Other objects and features of this invention will be in part apparent and in part pointed out hereinafter.

BRIEF DESCRIPTION OF THE DRAWINGS

FIG. 24 is an image produced by a scan of the minority carrier lifetime of an axial cut of an entire ingot following a series of oxygen precipitation heat treatments, as described in Example 9.

FIG. 25 is a graph illustrating the position of the V/I boundary as a function of the length of the single crystal silicon ingot, as described in Example 10.

FIG. 26b is an image produced by a scan of the minority carrier lifetime of an axial cut of a segment of an ingot, ranging from about 250 mm to about 400 mm from the shoulder of the ingot, following a series of oxygen precipitation heat treatments, as described in Example 11.

FIG. 27 is a graph of the axial temperature gradient, $G_0$, at various axial positions for an ingot, as described in Example 12.

DETAILED DESCRIPTION OF THE PREFERRED EMBODIMENTS

Figure 1:
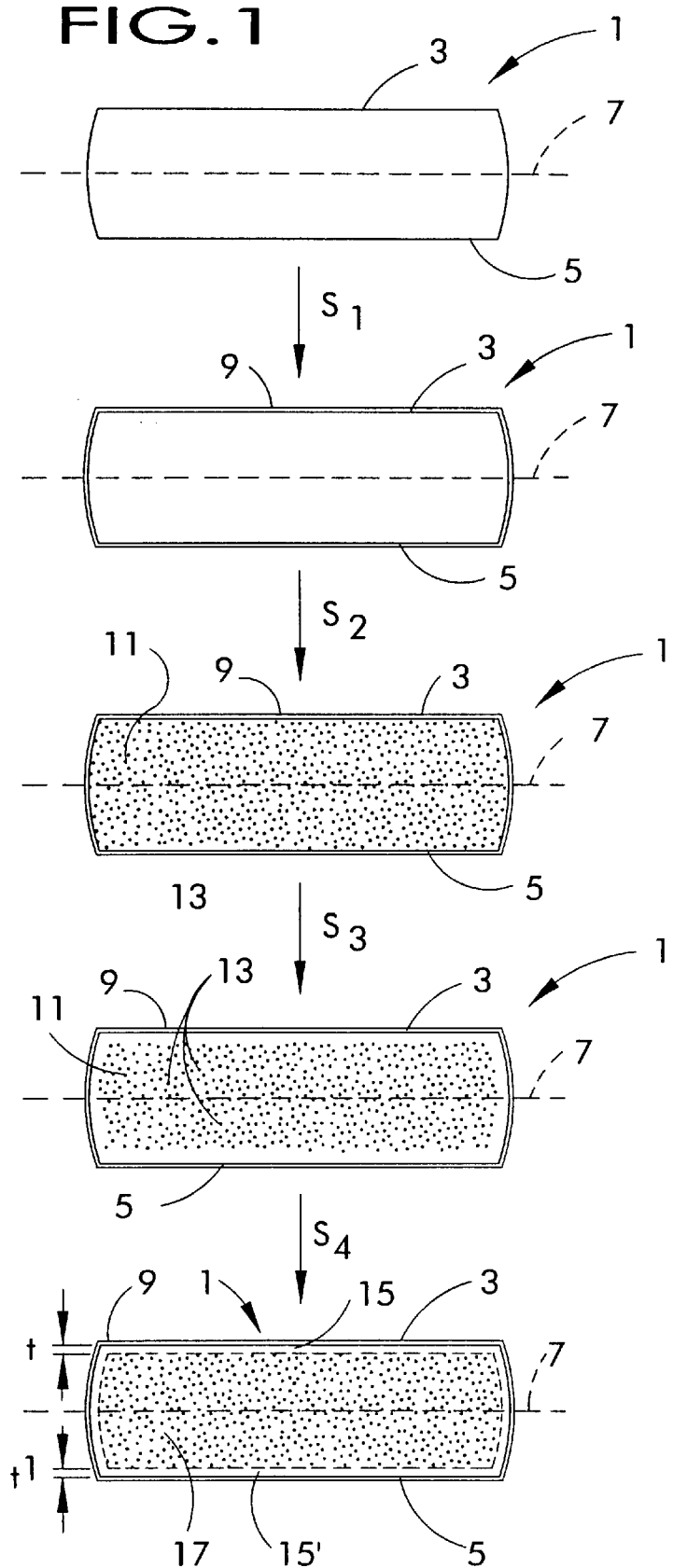
FIG. 1 is a schematic depiction of the ideal precipitating wafer process.

In accordance with the present invention, a silicon on insulator structure possesses a device layer of single crystal silicon having an axially symmetric region of substantial radial width which is substantially free of agglomerated intrinsic point defects, such as vacancies or silicon self-interstitials. Such a device layer is preferred because, due to the absence of these agglomerated defects, a SOI structure may be obtained having improved performance capabilities. Additionally, the SOI structure may possess a handle wafer with improved gettering, the handle wafer being capable of forming an ideal, non-uniform depth distribution of oxygen precipitates upon being subjected to a heat treatment cycle of essentially any arbitrary electronic device manufacturing process.

Handle Wafer

The handle wafer of the present invention may be obtained from essentially any material common in the art for preparing SOI structures, such as quartz or sapphire. Preferably, however, the handle wafer of the present invention will be prepared using an "ideal precipitating" single crystal silicon wafer. As described elsewhere (see, e.g., PCT/US98/03686), such a wafer may be prepared which, during essentially any electronic device manufacturing process, will form a denuded zone of sufficient depth and a wafer bulk containing a sufficient density of oxygen precipitates for internal gettering ("IG") purposes. Advantageously, this ideal precipitating wafer may be prepared in a matter of minutes using tools which are in common use in the semiconductor silicon manufacturing industry. This process creates a "template" in the silicon which determines or "prints" the manner in which oxygen will precipitate during the electronic device manufacturing process.

The starting material for the ideal precipitating wafer is a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference).

Czochralski-grown silicon typically has an oxygen concentration within the range of about $5 \times 10^{17}$ to about $9 \times 10^{17}$ atoms/cm$^3$ (ASTM standard F-121-83). Because the oxygen precipitation behavior of the wafer becomes essentially decoupled from the oxygen concentration in the ideal precipitating wafer, the starting wafer may have an oxygen concentration falling anywhere within or even outside the range attainable by the Czochralski process.

Depending upon the cooling rate of the single crystal silicon ingot from the temperature of the melting point of silicon (about 1410° C.) through the range of about 750° C. to about 350° C., oxygen precipitate nucleation centers may form in the single crystal silicon ingot from which the wafer is sliced. The presence or absence of these nucleation centers in the starting material is not critical to the present invention provided, however, these centers are capable of being dissolved by heat-treating the silicon at temperatures not in excess of about 1300° C. Certain heat-treatments, such as annealing the silicon at a temperature of about 800° C. for about four hours, can stabilize these centers such that they are incapable of being dissolved at temperatures not in excess of about 1150° C. The detection limit for oxygen precipitates is currently about $5 \times 10^6$ precipitates/cm$^3$. The presence (or density) of oxygen precipitation nucleation centers cannot be directly measured using presently available techniques. Various techniques may be used, however, to indirectly detect their presence. As previously discussed, preexisting oxygen precipitate nucleation centers in the silicon can be stabilized and precipitates can be grown at these sites by subjecting the silicon to an oxygen precipitation heat treatment. Thus, the presence of these nucleation centers can indirectly be measured after an oxygen precipitation heat treatment, e.g., annealing the wafer at a temperature of 800° C. for four hours and then at a temperature of 1000° C. for sixteen hours.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

Referring now to FIG. 1, the starting material for the ideal precipitating wafer, single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In a first embodiment, wafer 1 is heat-treated in an oxygen-containing atmosphere in step $S_1$ to grow a superficial oxide layer 9 which envelopes wafer 1. In general, the oxide layer will have a thickness which is greater than the native oxide layer which forms upon silicon (about 15 Ångstroms); preferably, the oxide layer has a thickness of at least about 20 Ångstroms and, in some embodiments, at least about 25 Ångstroms or even at least about 30 Ångstroms. Experimental evidence obtained to-date, however, suggests that oxide layers having a thickness greater than about 30 Ångstroms, while not interfering with the desired effect, provide little or no additional benefit.

In step $S_2$, the wafer is subjected to a heat-treatment step in which the wafers are heated to an elevated temperature to form and thereby increase the number density of crystal lattice vacancies 13 in wafer 1. Preferably, this heat-treatment step is carried out in a rapid thermal annealer in which the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

In the first embodiment, the rapid thermal annealing step is carried out in the presence of a nitriding atmosphere, that is, an atmosphere containing nitrogen gas ($N_2$) or a nitrogen-containing compound gas such as ammonia which is capable of nitriding an exposed silicon surface. The atmosphere may thus consist entirely of nitrogen or nitrogen compound gas, or it may additionally comprise a non-nitriding gas such as argon. An increase in vacancy concentration throughout the wafer is achieved nearly, if not immediately, upon achieving the annealing temperature. The wafer will generally be maintained at this temperature for at least one second, typically for at least several seconds (e.g., at least 3), preferably for several tens of seconds (e.g., 20, 30, 40, or 50 seconds) and, depending upon the desired characteristics of the wafer, for a period which may range up to about 60 seconds (which is near the limit for commercially available rapid thermal annealers). The resulting wafer will have a relatively uniform vacancy concentration (number density) profile in the wafer.

Based upon experimental evidence obtained to-date, the atmosphere in which the rapid thermal annealing step is carried out preferably has no more than a relatively small partial pressure of oxygen, water vapor and other oxidizing gases; that is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced, or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

Intrinsic point defects (vacancies and silicon self-interstitials) are capable of diffusing through single crystal silicon with the rate of diffusion being temperature dependant. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the effective diffusion rate of vacancies slows considerably at temperatures less than about 700° C. and perhaps as great as 800° C., 900° C., or even 1,000° C., the vacancies can be considered to be immobile for any commercially practical time period.

Upon completion of step $S_2$, the wafer is rapidly cooled in step $S_3$ through the range of temperatures at which crystal lattice vacancies are relatively mobile in the single crystal silicon. As the temperature of the wafer is decreased through this range of temperatures, the vacancies diffuse to the oxide layer 9 and are annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout wafer bulk 11 with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at or near central plane 7 and the vacancy concentration decreasing in the direction of the front surface 3 and back surface 5 of the wafer. In general, the average cooling rate within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

In step $S_4$, the wafer is subjected to an oxygen precipitation heat-treatment. For example, the wafer may be annealed at a temperature of 800° C. for four hours and then at a temperature of 1000° C. for sixteen hours. Alternatively, the wafer is loaded into a furnace which is at a temperature of about 800° C. as the first step of an electronic device manufacturing process. When loaded into a furnace at this temperature, the previously rapidly thermal annealed wafer will have separate zones which behave differently with respect to oxygen precipitation. In the high vacancy regions (the wafer bulk), oxygen clusters rapidly as the wafer enters the furnace. By the time the loading temperature is reached, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates and are thereby consumed, whereas in the vacancy lean zone nothing happens. By dividing the wafer into various zones of vacancy concentration, a template is effectively created through which is written an oxygen precipitate pattern which is fixed the moment the wafer is loaded into the furnace.

As illustrated in FIG. 1, the resulting depth distribution of oxygen precipitates in the handle wafer is characterized by clear regions of oxygen precipitate-free material (denuded zones) 15 and 15' extending from the front surface 3 and back surface 5 to a depth t, t', respectively. Between the oxygen precipitate-free regions, 15 and 15', there is a region 17 which contains a substantially uniform density of oxygen precipitates.

The concentration of oxygen precipitates in region 17 is primarily a function of the heating step and secondarily a function of the cooling rate. In general, the concentration of oxygen precipitates increases with increasing temperature and increasing annealing times in the heating step, with precipitate densities in the range of about $1 \times 10^7$ to about $5 \times 10^{10}$ precipitates/cm$^3$ being routinely obtained.

The depth t, t' from the front and back surfaces, respectively, of oxygen precipitate-free material (denuded zones) 15 and 15' is primarily a function of the cooling rate through the temperature range at which crystal lattice vacancies are relatively mobile in silicon. In general, the depth t, t' increases with decreasing cooling rates, with denuded zone depths of at least about 10, 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced.

While the rapid thermal treatments employed in this process may result in the out-diffusion of a small amount of oxygen from the surface of the front and back surfaces of the wafer, the amount of out-diffusion is significantly less than what is observed in conventional processes for the formation of denuded zones. As a result, the ideal precipitating wafers have a substantially uniform interstitial oxygen concentration as a function of distance from the silicon surface. For example, prior to the oxygen precipitation heat-treatment, the wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

Typically, oxygen precipitation heat-treatments do not result in a substantial amount of oxygen outdiffusion from the heat-treated wafer. As a result, the concentration of interstitial oxygen in the denuded zone at distances more than several microns from the wafer surface will not significantly change as a consequence of the precipitation heat-treatment. For example, if the denuded zone of the wafer consists of the region of the wafer between the surface of the silicon and a distance, $D_1$ (which is at least about 10 micrometers) as measured from the front surface and toward the central plane, the oxygen concentration at a position within the denuded zone which is at a distance from the silicon surface equal to one-half of $D_1$ will typically be at least about 75% of the peak concentration of the interstitial oxygen concentration anywhere in the denuded zone. For some oxygen precipitation heat-treatments, the interstitial oxygen concentration at this position will be even greater, i.e., at least 80%, 85%, 90% or even 95% of the maximum oxygen concentration anywhere in the denuded zone.

In a second embodiment, a non-nitriding atmosphere is used instead of the nitriding atmosphere used in the heating (rapid thermal annealing) and cooling steps of the first embodiment. Suitable non-nitriding atmospheres include argon, helium, neon, carbon dioxide, and other such non-oxidizing, non-nitriding elemental and compound gases, or mixtures of such gases. The non-nitriding atmosphere, like the nitriding atmosphere, may contain a relatively small partial pressure of oxygen, i.e., a partial pressure less than 0.01 atm. (10,000 ppma), more preferably less than 0.005 atm. (5,000 ppma), more preferably less than 0.002 atm. (2,000 ppma), and most preferably less than 0.001 atm. (1,000 ppma).

In a third embodiment, step $S_1$ (the thermal oxidation step) is omitted and the starting wafer has no more than a native oxide layer. When such a wafer is annealed in a nitrogen atmosphere, however, the effect differs from that which is observed when a wafer having an oxide layer which is greater in thickness than a native oxide layer ("enhanced oxide layer") is annealed in nitrogen. When the wafer containing an enhanced oxide layer is annealed in a nitrogen atmosphere, a substantially uniform increase in the vacancy concentration is achieved throughout the wafer nearly, if not immediately, upon reaching the annealing temperature; furthermore, the vacancy concentration does not appear to significantly increase as a function of annealing time at a given annealing temperature. If the wafer lacks anything more than a native oxide layer and if the front and back surfaces of the wafer are annealed in nitrogen, however, the resulting wafer will have a vacancy concentration (number density) profile which is generally "U-shaped" for a cross-section of the wafer; that is, a maximum concentration will occur at or within several micrometers of the front and back surfaces and a relatively constant and lesser concentration will occur throughout the wafer bulk with the minimum concentration in the wafer bulk initially being approximately equal to the concentration which is obtained in wafers having an enhanced oxide layer. Furthermore, an increase in annealing time will result in an increase in vacancy concentration in wafers lacking anything more than a native oxide layer.

Experimental evidence further suggests that this difference in behavior for wafers having no more than a native oxide layer and wafers having an enhanced oxide layer can be avoided by including molecular oxygen or another oxidizing gas in the atmosphere. Stated another way, when wafers having no more than a native oxide are annealed in a nitrogen atmosphere containing a small partial pressure of oxygen, the wafer behaves the same as wafers having an enhanced oxide layer. Without being bound to any theory, it appears that superficial oxide layers which are greater in thickness than a native oxide layer serve as a shield which inhibits nitridization of the silicon. This oxide layer may thus be present on the starting wafer or formed, in situ, by growing an enhanced oxide layer during the annealing step.

In accordance with the ideal precipitating wafer process, therefore, the atmosphere during the rapid thermal annealing step preferably contains a partial pressure of at least about 0.0001 atm. (100 ppma), more preferably a partial pressure of at least about 0.0002 atm. (200 ppma). For the reasons previously discussed, however, the partial pressure of oxygen preferably does not exceed 0.01 atm. (10,000 ppma), and is more preferably less than 0.005 atm. (5,000 ppma), still more preferably less than 0.002 atm. (2,000 ppma), and most preferably less than 0.001 atm. (1,000 ppma).

However, it is to be noted that as an alternative to utilizing an atmosphere having a partial pressure of oxygen, the silicon wafer may simply be subjected to a thermal anneal, or rapid thermal anneal, treatment under an oxygen atmosphere after annealing under a nitrogen atmosphere or a neutral atmosphere, in accordance with step $S_2$, is complete. The oxygen annealing step may be performed after the wafer has been allowed to cool or, alternatively, may be performed at temperature (i.e., while the wafer is still hot after the initial thermal anneal step has been completed). Furthermore, this oxygen anneal step may optionally be performed for any of the above-described embodiments as a means by which to further tailor or profile the vacancy concentration within the silicon wafer and, as such, the resulting oxygen precipitate pattern in the wafer.

Without being held to any particular theory, it is believed that oxygen annealing results in the oxidation of the silicon surface and, as a result, acts to create an inward flux of silicon self-interstitials. This inward flux of self-interstitials has the effect of gradually altering the vacancy concentration profile by causing recombinations to occur, beginning at the surface and then moving inward. A region of low vacancy concentration may therefore be created which, following an oxygen precipitation heat treatment, results in a denuded zone having a depth optimized for the particular end use of the device which is to be fabricated from the silicon wafer.

For silicon wafers having the peak concentration of vacancies within the bulk 17 of the silicon wafer, the depth t and t' of regions 15 and 15', respectively, may be selectively increased by controlling the rate at which oxidation of the surfaces occurs. The rate of oxidation is in turn dependent upon a number of factors, such as the atmospheric conditions, temperature and duration of this oxidation step. For example, the rate of oxidation will increase as the concentration of oxygen in the atmosphere increases, with the rate being greatest when pyrogenic steam is employed.

It is to be noted that the precise conditions for the oxidative treatment may be empirically determined by adjusting the temperature, duration of the anneal and atmospheric conditions (i.e., the composition of the atmosphere, as well as the oxygen partial pressure) in order to optimize the depth t and/or t'. However, if something other than pure oxygen or pyrogenic steam is employed, preferable the pressure of oxygen in the atmosphere will be at least about 0.0001 (100 ppma), and more preferably at least about 0.0002 (200 ppma). In this regard it is to be noted that the limitations placed upon the oxygen content, or partial pressure, for the thermal anneal step $S_2$ are not applicable for this optional step of the process. Furthermore, if the peak concentration of vacancies for region 17 is to be substantially retained, the temperature of this oxidative treatment is preferably in excess of about 1150° C. More preferably, the temperature is at least about equal to the temperature employed during the thermal treatment of step $S_2$. Without being held to any particular theory, it is believed that if the temperature is less than that employed during the thermal treatment, the peak concentration of vacancies in region 17 may actually decrease because of the direct recombination of vacancies and self-interstitials.

Once the oxidative treatment has been completed, the wafer may be rapidly cooled, as in step $S_3$ above, through the range of temperatures at which crystal lattice vacancies are relatively mobile in the single crystal silicon. By rapidly cooling the wafer, the vacancy concentration profile is effectively "frozen" within the silicon matrix, thus establishing a non-uniform distribution of crystal lattice vacancies. It is therefore desirable to cool at an average rate within this range of temperatures of at least about 5° C. per second, in order to avoid the vacancy concentration profile which has been established from being lost or erased. Preferably, however, the cooling rate is at least about 20° C. per second. It is to be noted that as the cooling rate is changed, the resulting profile may be further modified. Accordingly, depending upon the desired profile to be obtained, the average cooling rate may be at least about 50° C. per second, about 100° C. per second, or up to about 200° C. per second or more.

Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical. Conveniently, the cooling step may be carried out in the same atmosphere in which the heating step is carried out.

This separate oxidative treatment is an acceptable alternative to controlling the vacancy concentration profile by means of adjusting the rate of cooling, as described in detail above. Accordingly, when this oxidative treatment is employed the cooling rate of step $S_4$ may be greater than that herein described. In addition, it is to be noted that this oxidative treatment is preferred when the desired depth of t or t' is in excess of tens of microns, several tens of microns, or more.

It is to be further noted that the flexibility offered by oxidative treatment enables this approach to be successfully performed on a wafer having a vacancy concentration (number density) profile which is generally "U-shaped." More specifically, as noted above, if a wafer having only a native oxide layer on the wafer surface is subjected to the thermal anneal step $S_2$, the resulting wafer will possess a vacancy profile which is generally "U-shaped." By subjecting such a wafer to this oxidative anneal treatment, the vacancy concentration profile may be altered, the exposure conditions being selectively determined in order to yield a desired vacancy profile which comports with the ideal precipitating wafer process.

In other embodiments of the ideal precipitating wafer process, the front and back surfaces of the wafer may be exposed to different atmospheres, each of which may contain one or more nitriding or non-nitriding gases. For example, the back surface of the wafer may be exposed to a nitriding atmosphere as the front surface is exposed to a non-nitriding atmosphere. Alternatively, multiple wafers (e.g., 2, 3 or more wafers) may be simultaneously annealed while being stacked in face-to-face arrangement; when annealed in this manner, the faces which are in face-to-face contact are mechanically shielded from the atmosphere during the annealing. Alternatively, and depending upon the atmosphere employed during the rapid thermal annealing step and the desired oxygen precipitation profile of the wafer, the oxide layer may be formed only upon the side of the wafer at which the denuded zone is desired, e.g., front surface 3 of the wafer (see FIG. 1).

The starting material for the preparation of an ideal precipitating wafer may be a polished silicon wafer, or alternatively, a silicon wafer which has been lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy of dominated material surrounded by an axially symmetric ring of self-interstitial dominated material.

Utilization of an ideal precipitating wafer as the handle wafer for the SOI structure of the present invention is preferred because it affords the means by which to effectively trap metallic impurities within the bulk of the wafer, away for the insulating oxide layer of the present invention. As a result, precipitates forming due to the precipitation of metallic impurities occurs within the wafer bulk and away from the critical oxide layer and device layer of the SOI structure.

Device Layer

The device layer of the SOI structure of the present invention is single crystal silicon, preferably containing a region which is substantially free of agglomerated intrinsic point defects. With regard to the formation of a single crystal silicon wafer which is substantially free of such defects, from which this device layer may be obtained, it is to be noted that the type and initial concentration of intrinsic point defects appear to be initially determined as the ingot cools from the temperature of solidification (i.e., about 1410° C.) to a temperature greater than 1300° C. (i.e., at least about 1325° C., at least about 1350° C. or even at least about 1375° C.); that is, the type and initial concentration of these defects are controlled by the ratio $v/G_0$, where v is the growth velocity and $G_0$ is the average axial temperature gradient over this temperature range.

Figure 11:
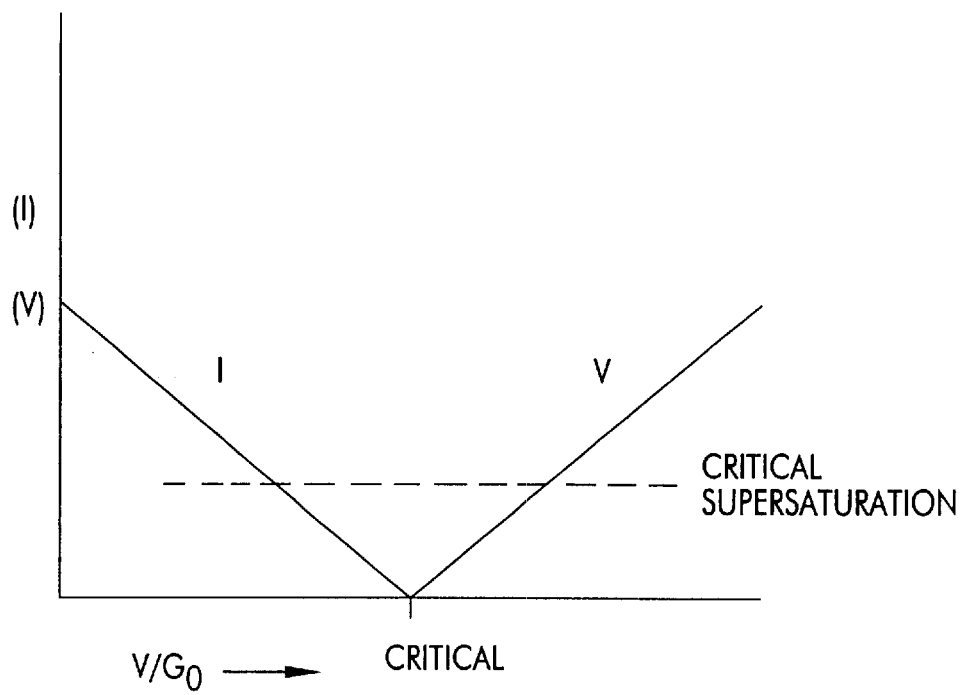
FIG. 11 is a graph which shows an example of how the initial concentration of self-interstitials, [I], and vacancies, [V], changes with an increase in the value of the ratio $v/G_0$, where v is the growth rate and $G_0$ is the average axial temperature gradient.
Figure 12:
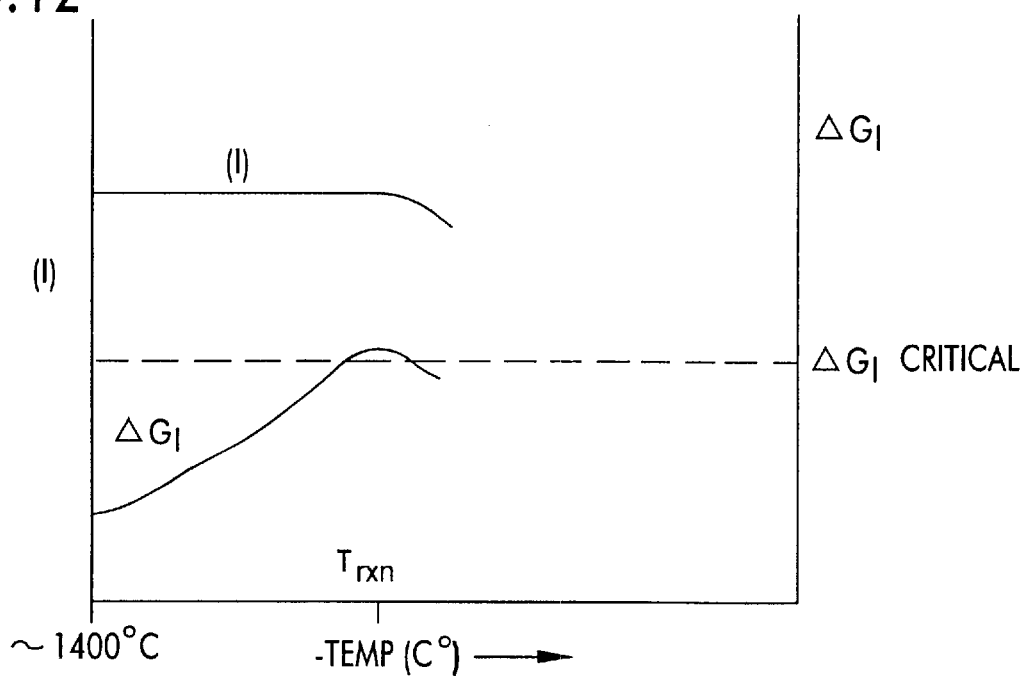
FIG. 12 is a graph which shows an example of how $\Delta G_I$, the change in free energy required for the formation of agglomerated interstitial defects, increases as the temperature, T, decreases, for a given initial concentration of self-interstitials, [I].

Referring now to FIG. 11, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. At this critical value, the concentrations of these intrinsic point defects are at equilibrium. However, as the value of $v/G_0$ exceeds the critical value, the concentration of vacancies increases. Likewise, as the value of $v/G_0$ falls below the critical value, the concentration of self-interstitials increases. If these concentrations reach a level of critical supersaturation in the system, and if the mobility of the point defects is sufficiently high, a reaction, or an agglomeration event, will likely occur.

Accordingly, as reported elsewhere (see, e.g., PCT/US98/07365 and PCT/US98/07304), it has been discovered that the reactions in which vacancies or self-interstitials agglomerate to produce defects can be suppressed. Without being bound to a particular theory, it is generally believed that these reactions can be suppressed if the concentration of vacancies or self-interstitials is controlled during the growth and cooling of the crystal ingot, such that the change in free energy ($\Delta G$) of the system never exceeds a critical value at which these agglomeration reactions spontaneously occur. In other words, it is believed that the agglomeration of vacancies and interstitials can be avoided as the ingot cools from the temperature of solidification by preventing the system from becoming critically supersaturated in vacancies or interstitials.

Preventing the formation of such defects can be achieved by establishing an initial concentration of vacancies or interstitials (controlled by $v/G_0(r)$, where $v/G_0(r)$ represent $v/G_0$ as a function of radial position, as further discussed below) which is sufficiently low such that critical supersaturation is never achieved. In practice, however, such concentrations are difficult to achieve across an entire crystal radius and, in general therefore, critical supersaturation may be avoided by suppressing the initial vacancy concentration or the initial interstitial concentration subsequent to crystal solidification (i.e., subsequent to establishing the initial concentration as determined by $v/G_0(r)$).

Due to the relatively large mobility of self-interstitials (which is generally about $10^{-4}$ cm$^2$/second), and to a lesser extent the mobility of vacancies, it is possible to affect the suppression of interstitials and vacancies over relatively large distances (i.e., distances of about 5 cm to about 10 cm or more) by the radial diffusion of self-interstitials to sinks located at the crystal surface or to vacancy dominated regions located within the crystal. Radial diffusion can be effectively used to suppress the concentration of self-interstitials and vacancies, provided sufficient time is allowed for the radial diffusion of the initial concentration of intrinsic point defects. In general, the diffusion time will depend upon the radial variation in the initial concentration of self-interstitials and vacancies, with lesser radial variations requiring shorter diffusion times.

Figure 13:
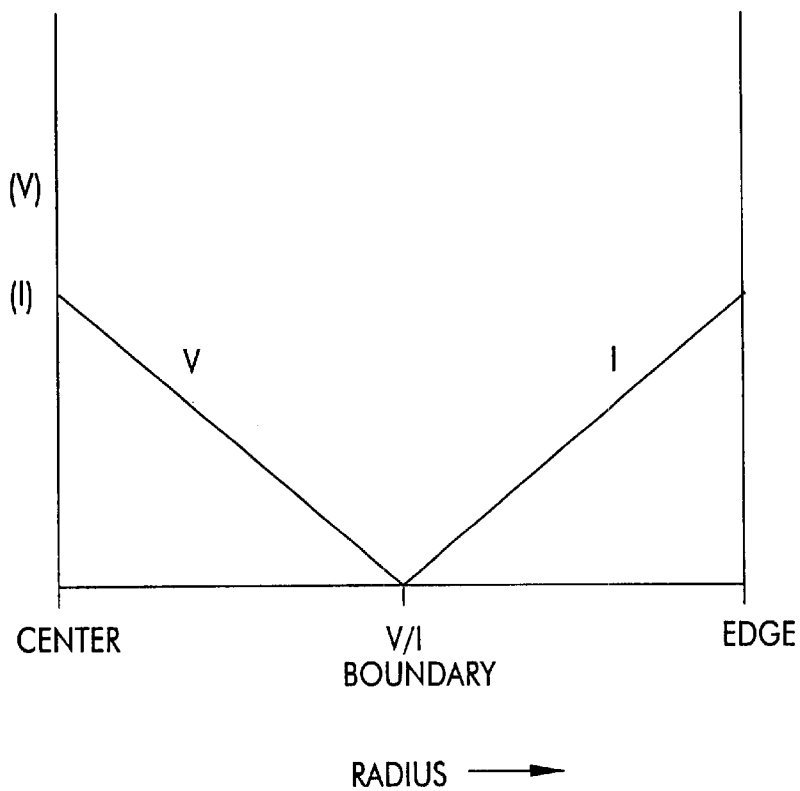
FIG. 13 is a graph which shows an example of how the initial concentration of self-interstitials, [I], and vacancies, [V], can change along the radius of an ingot or wafer, as the value of the ratio $v/G_0$ decreases, due to an increase in the value of $G_0$. Note that at the V/I boundary a transition occurs from vacancy dominated material to self-interstitial dominated material.
Figure 14:
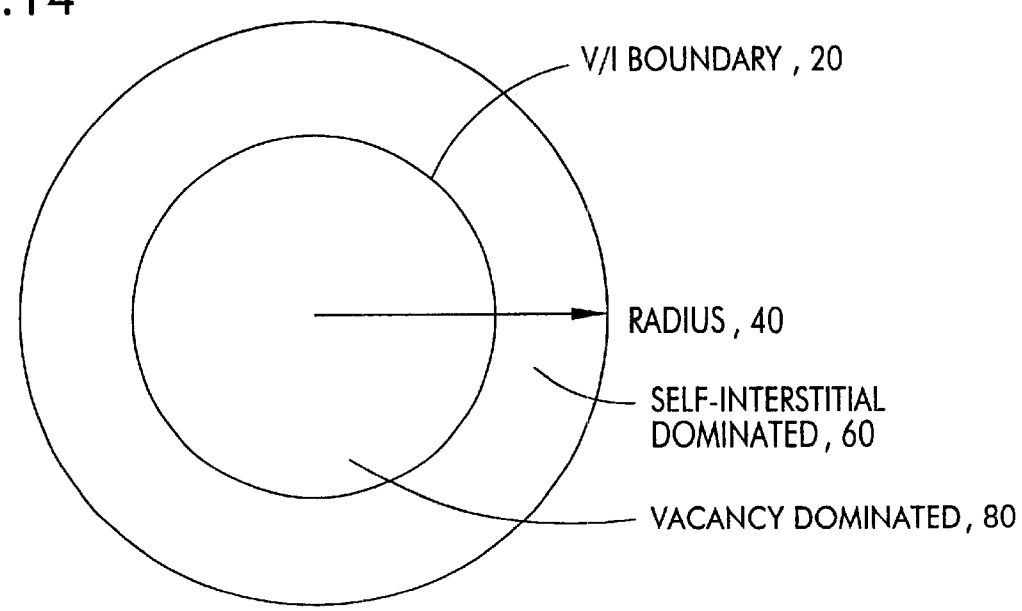
FIG. 14 is a top plan view of a single crystal silicon ingot or wafer showing regions of vacancy, V, and self-interstitial, I, dominated materials respectively, as well as the V/I boundary that exists between them.

Typically, the average axial temperature gradient, $G_0$, increases as a function of increasing radius for single crystal silicon, which is grown according to the Czochralski method. This means that the value of $v/G_0$ is typically not singular across the radius of an ingot. As a result of this variation, the type and initial concentration of intrinsic point defects is not constant. If the critical value of $v/G_0$, denoted in FIGS. 13 and 14 as the V/I boundary 20, is reached at some point along the radius 40 of the ingot, the material will switch from being vacancy dominated to self-interstitial dominated. In addition, the ingot will contain an axially symmetric region of self-interstitial dominated material 60 (in which the initial concentration of silicon self-interstitial atoms increases as a function of increasing radius), surrounding a generally cylindrical region of vacancy dominated material 80 (in which the initial concentration of vacancies decreases as a function of increasing radius).

As an ingot containing a V/I boundary is cooled from the temperature of solidification, radial diffusion of interstitial atoms and vacancies causes a radially inward shift in the V/I boundary due to a recombination of self-interstitials with vacancies. In addition, radial diffusion of self-interstitials to the surface of the crystal will occur as the crystal cools. The surface of the crystal is capable of maintaining near equilibrium point defect concentrations as the crystal cools. Radial diffusion of point defects will tend to reduce the self-interstitial concentration outside the V/I boundary and the vacancy concentration inside the V/I boundary. If enough time is allowed for diffusion, therefore, the concentration of vacancy and interstitials everywhere may be such that the free energy of these respective systems will be less than the critical values at which agglomeration reactions occur.

Figure 15:
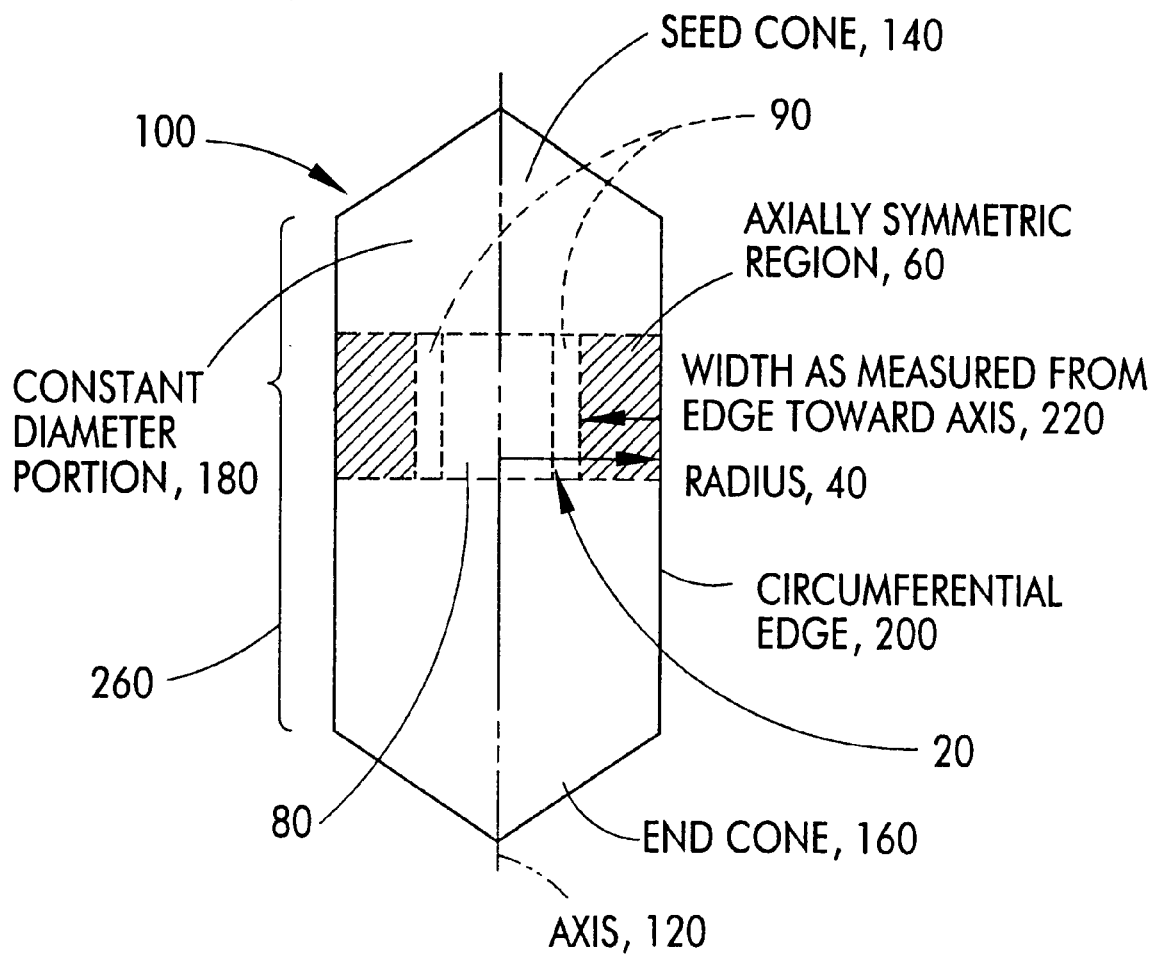
FIG. 15 is a longitudinal, cross-sectional view of a single crystal silicon ingot showing, in detail, an axially symmetric region of a constant diameter portion of the ingot.
Figure 16:
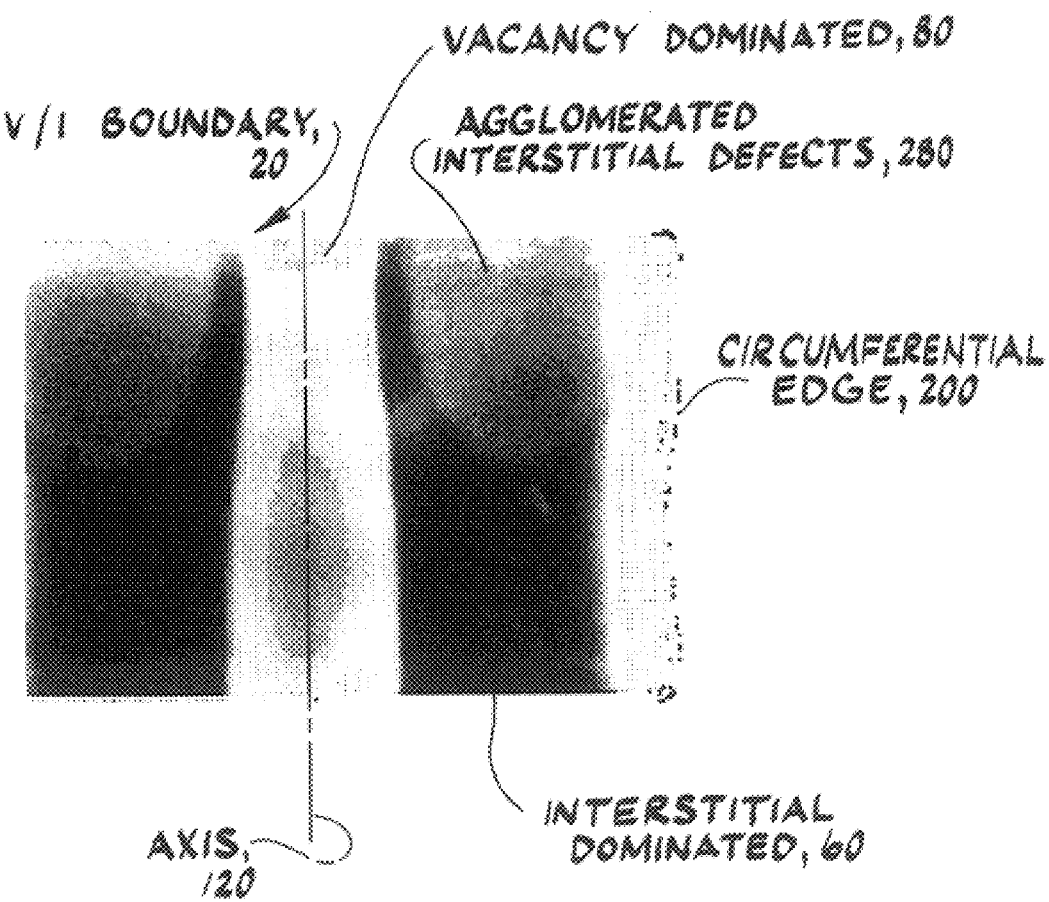
FIG. 16 is an image produced by a scan of the minority carrier lifetime of an axial cut of the ingot following a series of oxygen precipitation heat treatments, showing in detail a generally cylindrical region of vacancy dominated material, a generally annular shaped axially symmetric region of self-interstitial dominated material, the V/I boundary present between them, and a region of agglomerated interstitial defects.

Referring to FIG. 15, the crystal growth conditions, including growth velocity, v, the average axial temperature gradient, $G_0$, and the cooling rate are preferably controlled to cause the formation of a single crystal silicon ingot 100, grown in accordance with the Czochralski method, comprising a central axis 120, a seed-cone 140, an end-cone 160 and a constant diameter portion 180 between the seed-cone and the end-cone. The constant diameter portion of the ingot, from which the wafer of the present invention can be obtained, has a circumferential edge 200 and a radius 40 extending from the central axis 120 to the circumferential edge 200. The growth conditions may be controlled to cause the formation of (i) a substantially defect-free axially symmetric region of interstitial dominated material 60, and/or (ii) an axially symmetric region of vacancy dominated material 80, at least a portion 90 of which is substantially defect-free. When present, the axially symmetric regions 60 and 90 may have varying widths, as further discussed in detail below.

The growth velocity, v, and the average axial temperature gradient, $G_0$, (as previously defined) are typically controlled such that the ratio $v/G_0$ ranges in value from about 0.5 to about 2.5 times the critical value of $v/G_0$ (i.e., about $1\times10^{-5}$ cm$^2$/sK to about $5\times10^{-5}$ cm$^2$/sK based upon currently available information for the critical value of $v/G_0$). Preferably, the ratio $v/G_0$ will range in value from about 0.6 to about 1.5 times the critical value of $v/G_0$ (i.e., about $1.3\times10^{-5}$ cm$^2$/sK to about $3\times10^{-5}$ cm$^2$/sK based upon currently available information for the critical value of $v/G_0$). Most preferably, the ratio $v/G_0$ will range in value from about 0.75 to about 1.25 times the critical value of $v/G_0$ (i.e., about $1.6\times10^{-5}$ cm$^2$/sK to about $2.1\times10^{-5}$ cm$^2$/sK based upon currently available information for the critical value of $v/G_0$). In one particularly preferred embodiment, $v/G_0$ within the axially symmetric region 90 has a value falling between the critical value of $v/G_0$ and 1.1 times the critical value of $v/G_0$. In another particularly preferred embodiment, $v/G_0$ within the axially symmetric region 60 has a value falling between about 0.75 times the critical value of $v/G_0$ and the critical value of $v/G_0$.

To maximize the width of the axially symmetric region 60 or 90, it is preferred that the ingot be cooled from the solidification temperature to a temperature in excess of about 1050° C. over a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, and (iii) at least about 20 hours, preferably at least about 40 hours, more preferably at least about 60 hours, and most preferably at least about 75 hours for silicon crystals having a nominal diameter greater than 200 mm. Control of the cooling rate can be achieved by using any means currently known in the art for minimizing heat transfer, including the use of insulators, heaters, radiation shields, and magnetic fields.

Control of the average axial temperature gradient, $G_0$, may be achieved through the design of the "hot zone" of the crystal puller, i.e., the graphite (or other materials) that makes up the heater, insulation, heat and radiation shields, among other things. Although the design particulars may vary depending upon the make and model of the crystal puller, in general, $G_0$ may be controlled using any of the means currently known in the art for controlling heat transfer at the melt/solid interface, including reflectors, radiation shields, purge tubes, light pipes, and heaters. In general, radial variations in $G_0$ are minimized by positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. In addition, when a heater is employed, $G_0$ may be further controlled by adjusting the power supplied to the heater. Any, or all, of these methods can be used during a batch Czochralski process in which melt volume is depleted during the process.

It is generally preferred for some embodiments of the process for preparing a substantially defect-free wafer that the average axial temperature gradient, $G_0$, be relatively constant as a function of the diameter of the ingot. However, it should be noted that as improvements in hot zone design allow for variations in $G_0$ to be minimized, mechanical issues associated with maintaining a constant growth rate become an increasingly important factor. This is because the growth process becomes much more sensitive to any variation in the pull rate, which in turn directly affects the growth rate, v. In terms of process control, this means that it is favorable to have values for $G_0$ which differ over the radius of the ingot. Significant differences in the value of $G_0$, however, can result in a large concentration of self-interstitials generally increasing toward the wafer edge and, thereby, increase the difficultly in avoiding the formation of agglomerated intrinsic point defects.

In view of the foregoing, the control of $G_0$ involves a balance between minimizing radial variations in $G_0$ and maintaining favorable process control conditions. Typically, therefore, the pull rate after about one diameter of the crystal length will range from about 0.2 mm/minute to about 0.8 mm/minute. Preferably, the pull rate will range from about 0.25 mm/minute to about 0.6 mm/minute and, more preferably, from about 0.3 mm/minute to about 0.5 mm/minute. It is to be noted that the pull rate is dependent upon both the crystal diameter and crystal puller design. The stated ranges are typical for 200 mm diameter crystals. In general, the pull rate will decrease as the crystal diameter increases. However, the crystal puller may be designed to allow pull rates in excess of those stated here. As a result, most preferably the crystal puller will be designed to enable the pull rate to be as fast as possible while still allowing for the formation of an axially symmetric region or regions in accordance with the present invention.

The amount of self-interstitial diffusion is controlled by controlling the cooling rate as the ingot is cooled from the solidification temperature (about 1410° C.) to the temperature at which silicon self-interstitials become immobile for commercially practical purposes. Silicon self-interstitials appear to be extremely mobile at temperatures near the solidification temperature of silicon, i.e., about 1410° C. This mobility, however, decreases as the temperature of the single crystal silicon ingot decreases. Generally, the diffusion rate of self-interstitials slows such a considerable degree that they are essentially immobile for commercially practical time periods at temperatures less than about 700° C., and perhaps at temperatures as great as 800° C., 900° C., 1000° C., or even 1050° C.

It is to be noted in this regard that, although the temperature at which a self-interstitial agglomeration reaction occurs may in theory vary over a wide range of temperatures, as a practical matter this range appears to be relatively narrow for conventional, Czochralski-grown silicon. This is a consequence of the relatively narrow range of initial self-interstitial concentrations which are typically obtained in silicon grown according to the Czochralski method. In general, therefore, a self-interstitial agglomeration reaction may occur, if at all, at temperatures within the range of about 1100° C. to about 800° C., and typically at a temperature of about 1050° C.

Accordingly, within the range of temperatures at which self-interstitials appear to be mobile, and depending upon the temperature in the hot zone, the cooling rate will typically range from about 0.1° C./minute to about 3° C./minute. Preferably, the cooling rate will range from about 0.1° C./minute to about 1.5° C./minute, more preferably from about 0.1° C./minute to about 1° C./minute, and still more preferably from about 0.1° C./minute to about 0.5° C./minute.

By controlling the cooling rate of the ingot within a range of temperatures in which self-interstitials appear to be mobile, the self-interstitials may be given more time to diffuse to sinks located at the crystal surface, or to vacancy dominated regions, where they may be annihilated. The concentration of such interstitials may therefore be suppressed, which act to prevent an agglomeration event from occurring. Utilizing the diffusivity of interstitials by controlling the cooling rate acts to relax the otherwise stringent $v/G_0$ requirements that may be needed in order to obtain an axially symmetric region free of agglomerated defects. Stated another way, as a result of the fact that the cooling rate may be controlled in order to allow interstitials more time to diffuse, a larger range of $v/G_0$ values, relative to the critical value, are acceptable for purposes of obtaining an axially symmetric region free of agglomerated defects.

To achieve such cooling rates over appreciable lengths of the constant diameter portion of the crystal, consideration must also be given to the growth process of the end-cone of the ingot, as well as the treatment of the ingot once end-cone growth is complete. Typically, upon completion of the growth of the constant diameter portion of the ingot, the pull rate will be increased in order to begin the tapering necessary to form the end-cone. However, such an increase in pull rate may result in the lower segment of the constant diameter portion cooling more quickly within the temperature range in which interstitials are sufficiently mobile, as discussed above. As a result, these interstitials may not have sufficient time to diffuse to sinks to be annihilated; that is, the concentration in this lower segment may not be suppressed to a sufficient degree and agglomeration of interstitial defects may result.

In order to prevent the formation of such defects from occurring in this lower segment of the ingot, it is preferred that the constant diameter portion of the ingot have a uniform thermal history in accordance with the Czochralski method. A uniform thermal history may be achieved by pulling the ingot from the silicon melt at a relatively constant rate during the growth of not only the constant diameter portion, but also during the growth of the end-cone of the crystal and possibly subsequent to the growth of the end-cone. More specifically, it is preferred that when the growth of the end-cone is initiated a pull rate for the end-cone is established which ensures any segment of the constant diameter portion of the ingot remaining at a temperature in excess of about 1050° C. will experience the same thermal history as other segment(s) of the constant diameter portion of the ingot which contain an axially symmetric region free of agglomerated intrinsic point defects which have already cooled to a temperature of less than about 1050° C. A relatively constant pull rate may be achieved, for example, by (i) reducing the rates of rotation of the crucible and crystal during the growth of the end-cone relative to the crucible and crystal rotation rates during the growth of the constant diameter portion of the crystal, and/or (ii) increasing the power supplied to the heater used to heat the silicon melt during the growth of the end-cone relative to the power conventionally supplied during end-cone growth. These additional adjustments of the process variables may occur either individually or in combination.

As previously noted, a minimum radius of the vacancy dominated region exists for which the suppression of agglomerated interstitial defects may be achieved. The value of the minimum radius depends on $v/G_0(r)$ and the cooling rate. As crystal puller and hot zone designs will vary, the ranges presented above for $v/G_0(r)$, pull rate, and cooling rate will also vary. Likewise these conditions may vary along the length of a growing crystal. Also as noted above, the width of the interstitial dominated region free of agglomerated interstitial defects is preferably maximized, in some embodiments. Thus, it is desirable to maintain the width of this region to a value which is as close as possible to, without exceeding, the difference between the crystal radius and the minimum radius of the vacancy dominated region along the length of the growing crystal in a given crystal puller.

The crystal pull rate profile needed in order to maximize the width of axially symmetric regions 60 and 90 for a given crystal puller hot zone design may be determined empirically. Generally speaking, this empirical approach involves first obtaining readily available data on the axial temperature profile for an ingot grown in a particular crystal puller, as well as the radial variations in the average axial temperature gradient for an ingot grown in the same puller. Collectively, this data is used to pull one or more single crystal silicon ingots, which are then analyzed for the presence of agglomerated interstitial defects. In this way, an optimum pull rate profile can be determined.

In addition to the radial variations in $v/G_0$ resulting from an increase in $G_0$ over the radius of the ingot, $v/G_0$ may also vary axially as a result of a change in v, or as a result of natural variations in $G_0$ due to the Czochralski process. For a standard Czochralski process, v is altered as the pull rate is adjusted throughout the growth cycle, in order to maintain the ingot at a constant diameter. These adjustments, or changes, in the pull rate in turn cause $v/G_0$ to vary over the length of the constant diameter portion of the ingot. Accordingly, it is therefore desirable in the present process to control the pull rate in order to maximize the width of the axially symmetric region of the ingot. As a result, however, variations in the radius of the ingot may occur. In order to ensure that the resulting ingot has a constant diameter, the ingot is therefore preferably grown to a diameter larger than that which is desired. The ingot is then subjected to processes standard in the art to remove excess material from the surface, thus ensuring that an ingot having a constant diameter portion is obtained.

Referring again to FIG. 15, wafers from which the device layer of the present invention may be obtained are sliced from a single crystal silicon ingot 100. This ingot may contain an axially symmetric region of self-interstitial dominated material 60, which may additionally surround a generally cylindrical region of vacancy dominated material 80, a portion or all of which may also contain region 90 which is substantially free of agglomerated intrinsic point defects; alternatively, the self-interstitial dominated region 60 may extend from center to edge, or the vacancy dominated region 90 may extend from center to edge.

In another embodiment, an axially symmetric region 90 has a width, as measured along the radius 40 extending from V/I boundary 20 to axis 120, which is at least about 15 mm in width, and preferably has a width which is at least about 7.5%, more preferably at least about 15%, still more preferably at least about 25%, and most preferably at least about 50% of the radius of the constant diameter portion of the ingot. In a particularly preferred embodiment, axially symmetric region 90 includes axis 120 of the ingot, i.e., the axially symmetric region 90 and the generally cylindrical region 80 coincide. Stated another way, ingot 100 includes a generally cylindrical region of vacancy dominated material 80, at least a portion of which is free of agglomerated defects. In addition, axially symmetric region 90 extends over a length of at least about 20%, preferably at least about 40%, more preferably at least about 60%, and still more preferably at least about 80% of the length of the constant diameter portion of the ingot.

In yet another embodiment, such wafers may be obtained from a single crystal silicon ingot 100 comprising an axially symmetric region 60 which generally has a width 220, as measured from circumferential edge 200 radially inward toward central axis 120, of at least about 30%, and in some embodiments at least about 40%, at least about 60%, or even at least about 80% of the radius of the constant diameter portion of the ingot. In addition, the axially symmetric region generally extends over a length 260 of at least about 20%, preferably at least about 40%, more preferably at least about 60%, and still more preferably at least about 80% of the length of the constant diameter portion of the ingot.

It is to be noted that the width of axially symmetric regions 60 and 90 may have some variation along the length of the central axis 120. For an axially symmetric region of a given length, therefore, the width 220 of axially symmetric region 60 is determined by measuring the distance from the circumferential edge 200 of the ingot 100 radially toward a point which is farthest from the central axis. In other words, the width is measured such that the minimum distance within the given length of the axially symmetric region 60 is determined. Similarly, the width of axially symmetric region 90 is determined by measuring the distance from the V/I boundary 20 radially toward a point which is farthest from the central axis 120. In other words, the width is measured such that the minimum distance within the given length of the axially symmetric region 90 is determined.

By controlling the growth conditions, a single crystal silicon wafer may be obtained which is substantially free of agglomerated intrinsic point defects. Using such a wafer as the source for the device layer of a SOI structure yields a structure having a device layer which contains an axially symmetric region of substantial radial width with is substantially free of agglomerated intrinsic point defects. Such a device layer is advantageous because it eliminates many of the performance problems associated with the present of such defects in the device layer.

It is to be noted that, if the handle wafer of the SOI structure of the present invention comprises an ideal precipitating wafer, as further discussed below, preferably the ideal precipitating wafer process will be carried out before the device layer of the SOI structure has been attached to the handle wafer. If this embodiment is employed, it may be desirable to stabilize the oxygen precipitate nucleation centers in the handle wafer after the process is complete and before preparation of the SOI structure begins. Additionally, if this approach is employed, the oxygen precipitation heat treatment of step $S_4$ may be achieved during formation of the SOI structure, such as in wafer bonding, provide the treatment time and temperature employed by the SOI process are sufficient for oxygen precipitate formation.

It is to be further noted, however, that the ideal precipitating wafer process may also be performed after the SOI structure has been prepared. Without being held to any particular theory, it is believed that the SOI structure will behave as a typical single crystal silicon wafer, with the oxide layer acting as a free surface from which vacancies and self-interstitials may be injected and to which they may diffuse.

Preparation of SOI Structures

A SOI structure having a device layer which is substantially free of agglomerated defects may be obtained directly from a "low defect density" single crystal silicon wafer, as described above, by means of subjecting the wafer to an ion implantation process which, as noted above, is standard in the art. (See, e.g., U.S. Pat. No. 5,436,175.) If such a structure is to additionally comprise an "ideal precipitating" handle wafer, preferably the ideal precipitating wafer process will be performed on the low defect density silicon wafer prior to implantation. When such a process is employed, the resulting oxide layer will be located within the denuded zone.

Alternatively, the low defect density wafer may be used to prepare the SOI structure of the present invention by bonding such a wafer to a handle wafer and then etching away a portion of the low defect density wafer using wafer thinning techniques, also common in the art. (See, e.g., U.S. Pat. No. 5,024,723.) If the SOI structure is to additionally comprise an "ideal precipitating" handle wafer, preferably the low defect density silicon wafer will be bound to the handle wafer after the handle wafer has been subjected to the ideal precipitating wafer process. Alternatively, however, the low defect density silicon wafer may first be bound to a Czochralski-type single crystal silicon wafer, and then the entire SOI structure may be subjected to the ideal precipitating wafer process.

Measurement of Crystal Lattice Vacancies

The measurement of crystal lattice vacancies in single crystal silicon can be carried out by platinum diffusion analysis. In general, platinum is deposited on the samples and diffused in a horizontal surface with the diffusion time and temperature preferably being selected such that the Frank-Turnball mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes may be used, although more accurate tracking appears to be attainable at a lesser temperature, e.g., about 680° C. In addition, to minimize a possible influence by silicidation processes, the platinum deposition method preferably results in a surface concentration of less than one monolayer. Platinum diffusion techniques are described elsewhere, for example, by Jacob et al., *J. Appl. Phys.,* vol. 82, p. 182 (1997); Zimmermann and Ryssel, "The Modeling of Platinum Diffusion In Silicon Under Non-Equilibrium Conditions," *J. Electrochemical Society,* vol. 139, p. 256 (1992); Zimmermann, Goesele, Seilenthal and Eichiner, "Vacancy Concentration Wafer Mapping In Silicon," *Journal of Crystal Growth,* vol. 129, p. 582 (1993); Zimmermann and Falster, "Investigation Of The Nucleation of Oxygen Precipitates in Czochralski Silicon At An Early Stage," *Appl. Phys. Lett.,* vol. 60, p. 3250 (1992); and Zimmermann and Ryssel, *Appl. Phys. A,* vol. 55, p. 121 (1992).

Visual Detection of Agglomerated Defects

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect agglomerated interstitial defects. When this technique is used, such defects appear as large pits on the surface of the sample when present.

Agglomerated defects may also be detected using laser scattering techniques, such as laser scattering tomography, which typically have a lower defect density detection limit that other etching techniques.

Additionally, agglomerated intrinsic point defects may be visually detected by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat-treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

Definitions

As used herein, the following phrases or terms shall have the given meanings: "agglomerated intrinsic point defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration of agglomerated defects which is less than the detection limit of these defects, which is currently about $10^3$ defects/cm$^3$; "V/I boundary" means the position along the radius of an ingot or wafer at which the material changes from vacancy dominated to self-interstitial dominated; and "vacancy dominated" and "self-interstitial dominated" mean material in which the intrinsic point defects are predominantly vacancies or self-interstitials, respectively.

EXAMPLES

Examples 1 through 5 illustrate the ideal oxygen precipitation process. Examples 6 through 12 illustrate the preparation of single crystal silicon containing an axially symmetric region of vacancy dominated material, self-interstitial dominated material, or both, which is substantially free of agglomerated intrinsic point defects, as previously discussed. All of these Examples should therefore not be interpreted in a limiting sense.

IDEAL OXYGEN PRECIPITATION PROCESS

Example 1

Silicon single crystals were pulled by the Czochralski method, sliced and polished to form silicon wafers. These wafers were then subjected to a surface oxidation step ($S_1$), rapid thermal annealing step in nitrogen or argon ($S_2$), rapidly cooled ($S_3$), and subjected to an oxygen stabilization and growth step ($S_4$) under the conditions set forth in Table I. The initial oxygen concentration of the wafers ($O_i$) before steps $S_1$–$S_4$, the oxygen precipitate density in the bulk of the wafers after step $S_4$ (OPD), and the depth of the denuded zone after step $S_4$ (DZ) are also reported in Table I.

TABLE I

| Sample | 4-7 | 4-8 | 3-14 |
| --- | --- | --- | --- |
| $S_1$ | 15 min at 1,000° C. in $N_2$ + ~1% $O_2$ | 15 min at 1,000° C. in $N_2$ + ~1% $O_2$ | none |
| $S_2$ | 35 seconds at 1250° C. in $N_2$ | 35 seconds at 1250° C. in Ar | 35 seconds at 1250° C. in $N_2$ |
| $S_3$ | 100° C./sec | 100° C./sec | 100° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm$^3$) | 7 × 10$^{17}$ | 6.67 × 10$^{17}$ | 7.2 × 10$^{17}$ |
| OPD (atoms/cm$^3$) | 1 × 10$^{10}$ | 4.4 × 10$^9$ | 1.69 × 10$^{10}$ |
| DZ (depth in µm) | 70 | 95 | 0 |

Figure 2:
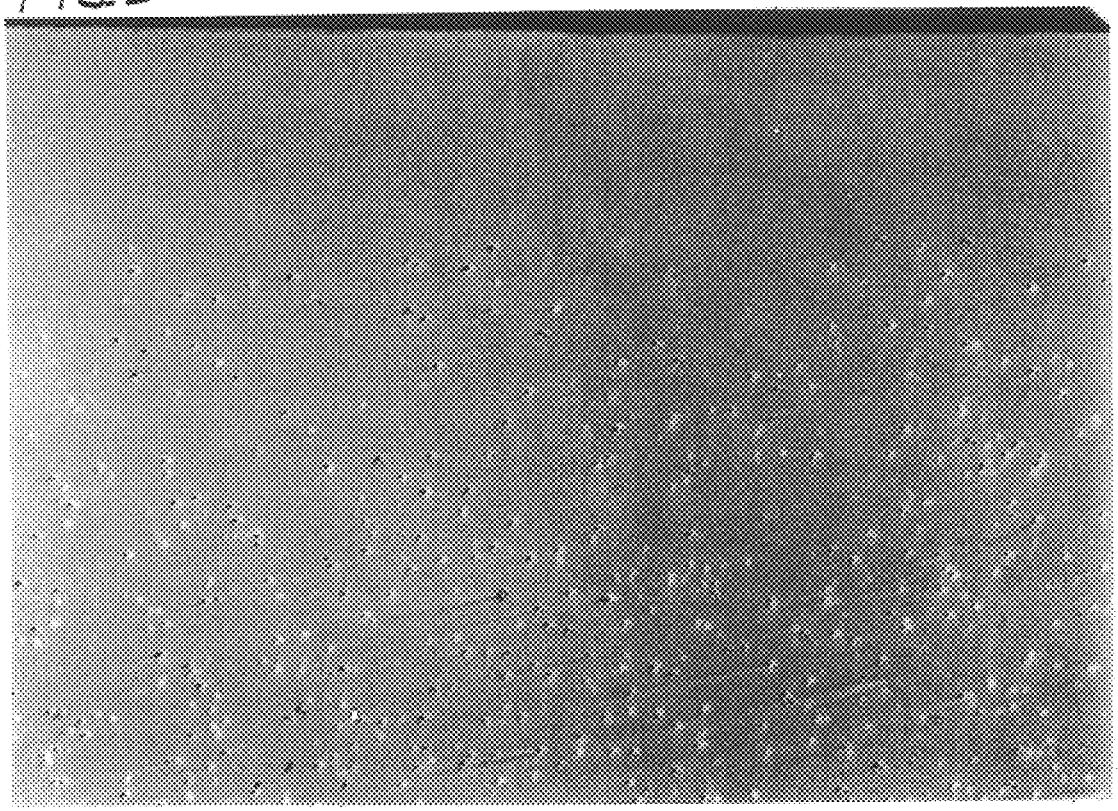
FIG. 2 is a photograph of a cross-section of a wafer (sample 4–7) which was processed as described in Example 1.
Figure 3:
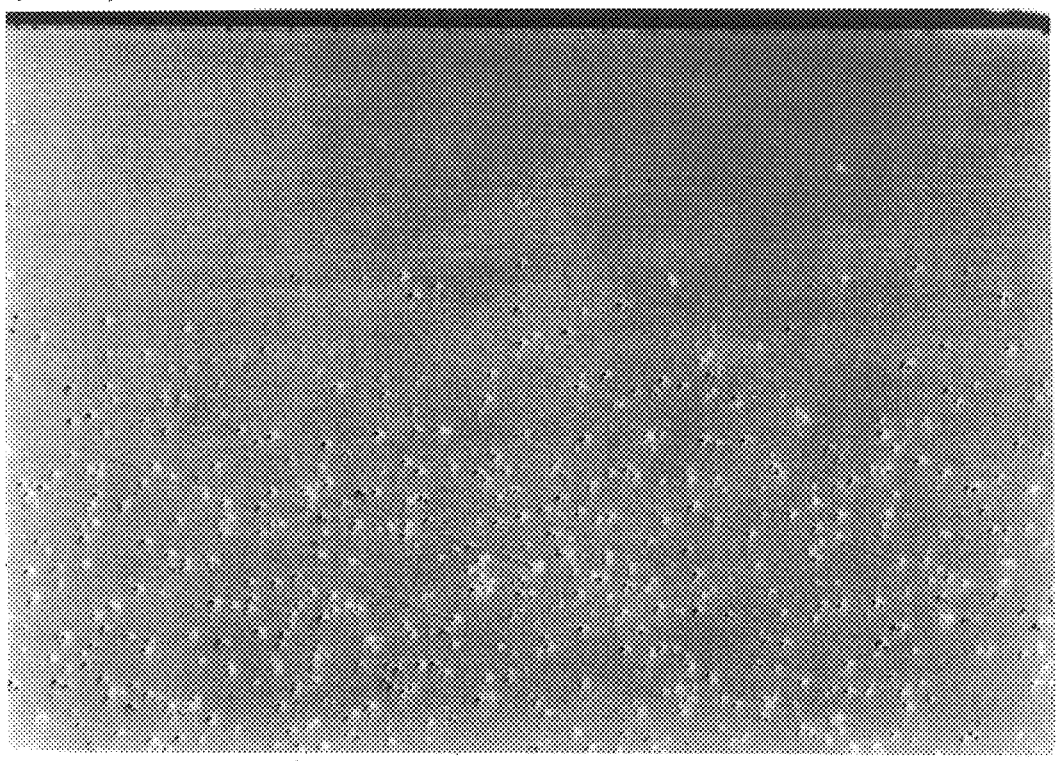
FIG. 3 is a photograph of a cross-section of a wafer (sample 4–8) which was subjected to the series of steps described in Example 1.
Figure 4:
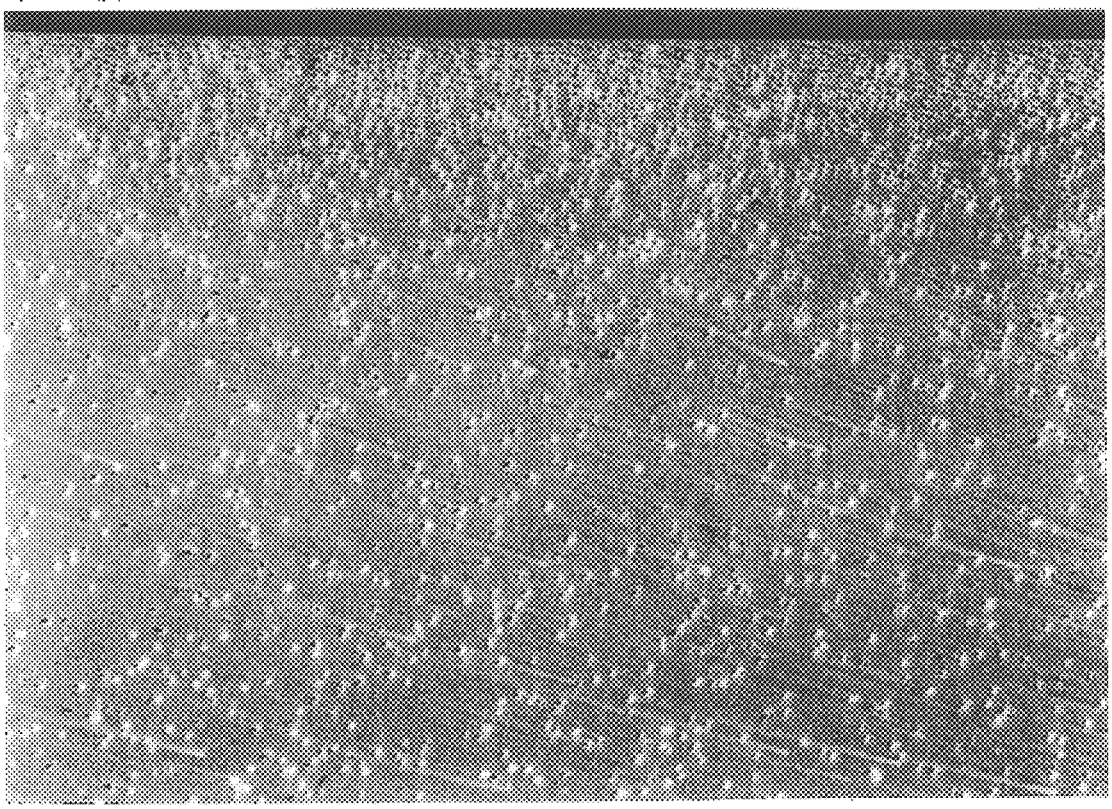
FIG. 4 is a photograph of a cross-section of a wafer (sample 3–14) which was subjected to the series of steps described in Example 1.

FIGS. 2, 3, and 4 show cross-sections of the resulting wafers (these figures are enlargements of photographs taken at a magnification of 200×); sample 4–7 is shown in FIG. 2, sample 4–8 is shown in FIG. 3, and sample 3–14 is shown in FIG. 4.

Figure 5:
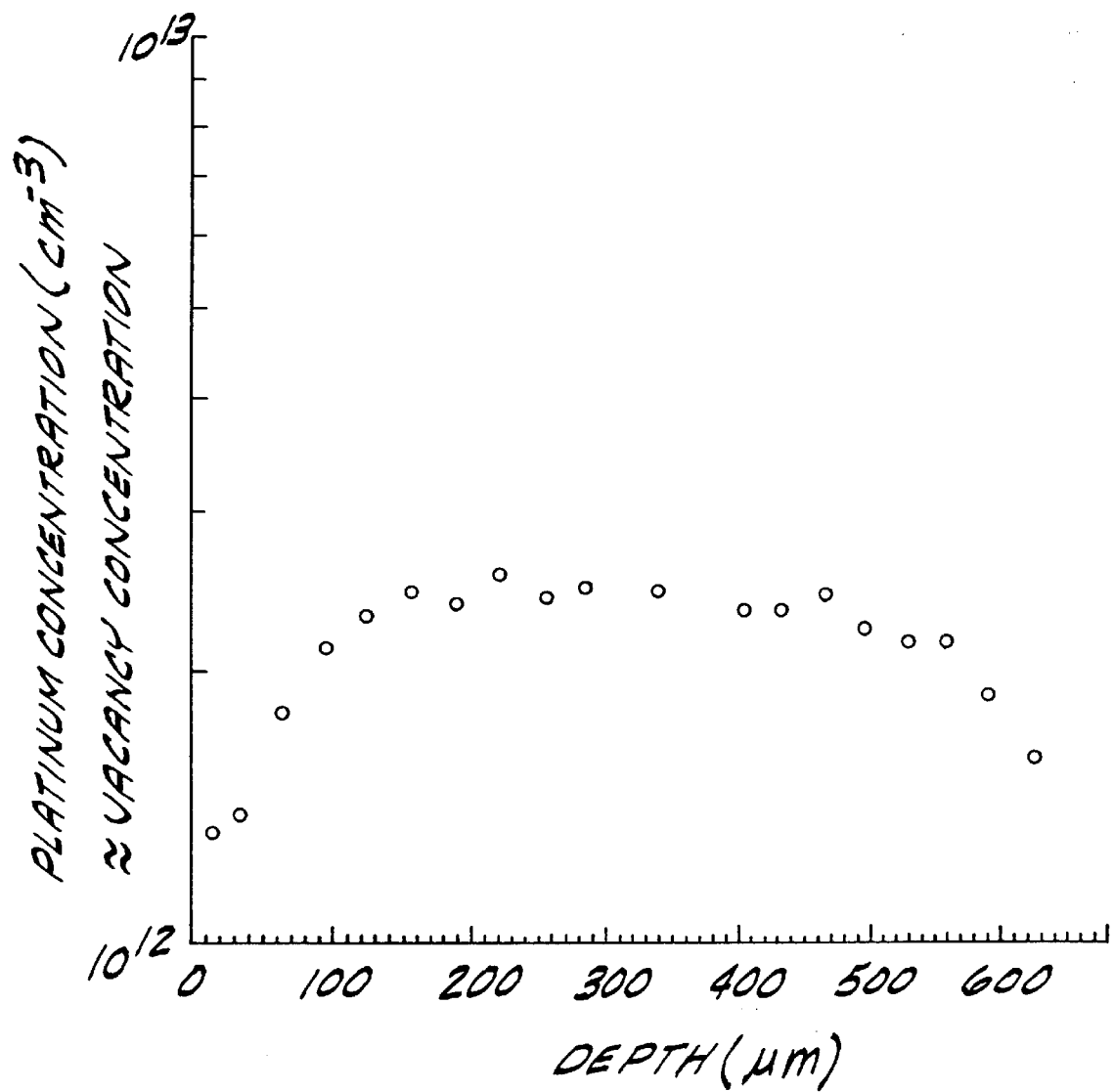
FIG. 5 is a graph of the log of platinum concentration (atoms/cm$^3$) versus depth from the surface of a wafer (sample 4–7) which was subjected to the series of steps set forth in Example 1.

In addition, the concentration of crystal lattice vacancies in the sample 4–7 was mapped using a platinum diffusion technique. A plot of platinum concentration versus depth from the surface of the wafer (a depth of 0 micrometers corresponding to the front side of the wafer) appears in FIG. 5.

Example 2

Figure 6:
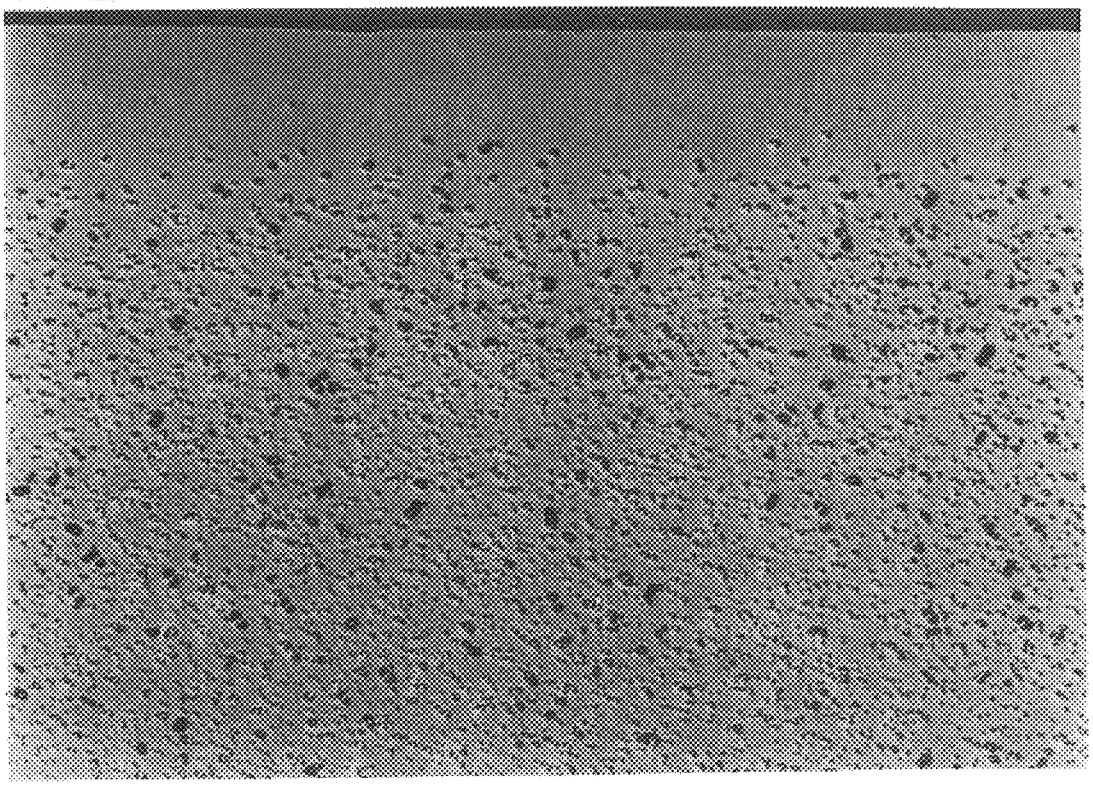
FIG. 6 is a photograph of a cross-section of a wafer (sample 3–4) which was subjected to the series of steps set forth in Example 2.
Figure 7:
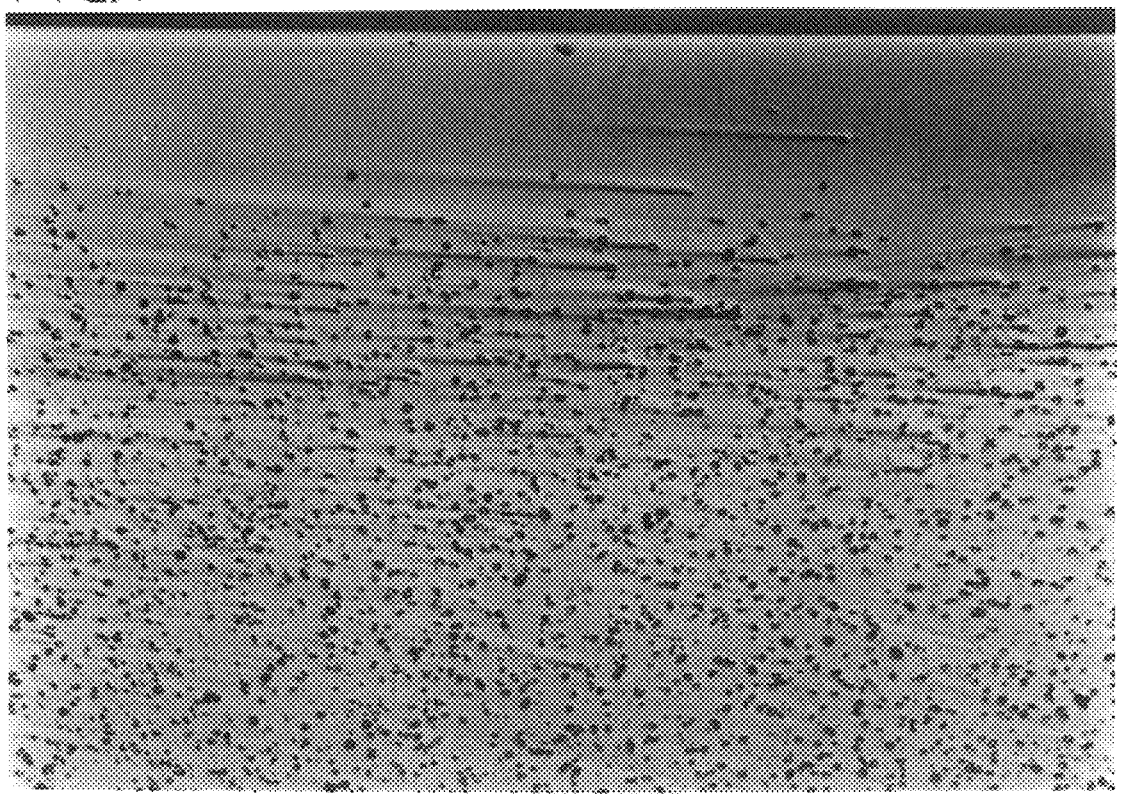
FIG. 7 is a photograph of a cross-section of a wafer (sample 3–5) which was subjected to the series of steps set forth in Example 2.
Figure 8:
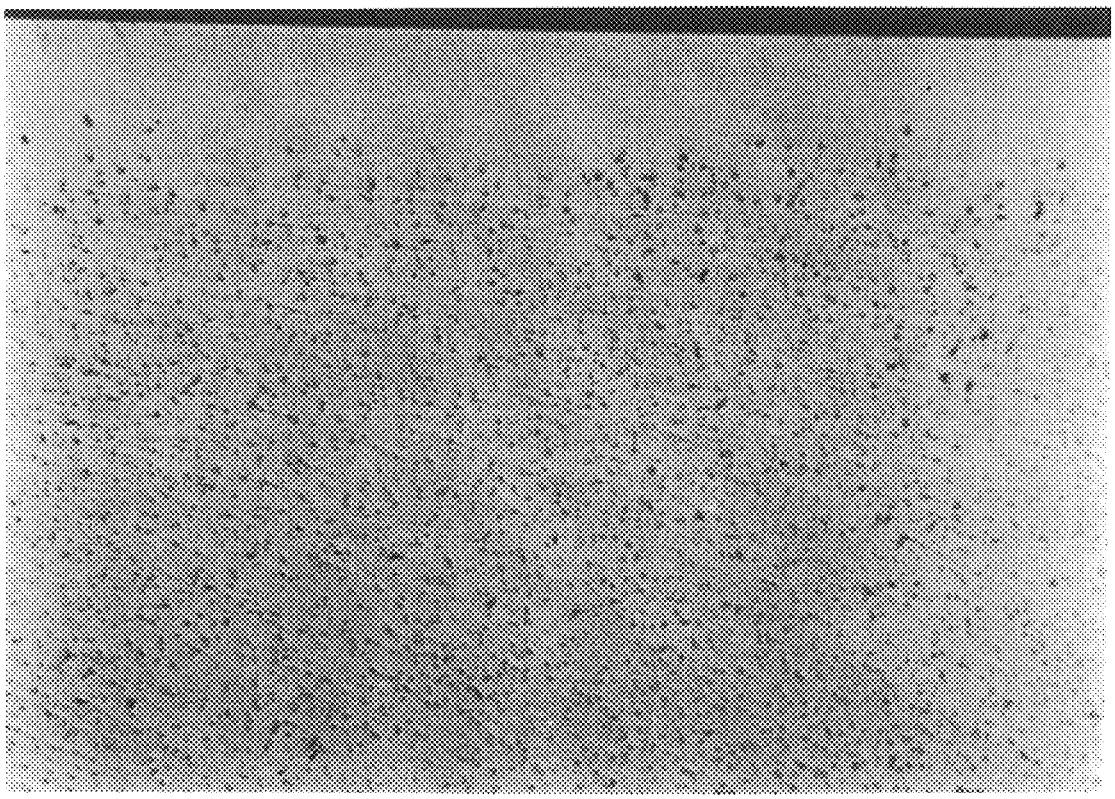
FIG. 8 is a photograph of a cross-section of a wafer (sample 3–6) which was subjected to the series of steps set forth in Example 2.

To demonstrate that the process of the present invention is relatively independent of oxygen concentration for Czochralski-grown silicon wafers, three wafers having different oxygen concentrations were subjected to the same series of steps described in Example 1. The conditions for each of these steps, the initial oxygen concentration of the wafers ($O_i$) before steps $S_1$–$S_4$, the oxygen precipitate density (OPD) in the bulk of the wafers after step $S_4$, and the depth of the denuded zone (DZ) after step $S_4$ as measured from the surface of the wafer are reported in Table II. FIGS. 6, 7, and 8 show cross-sections of the resulting wafers (these figures are enlargements of photographs taken at a magnification of 200×); sample 3–4 is shown in FIG. 6, sample 3–5 is shown in FIG. 7, and sample 3–6 is shown in FIG. 8.

TABLE II

| Sample | 3-4 | 3-5 | 3-6 |
| --- | --- | --- | --- |
| $S_1$ | 15 min at 1,000° C. in $N_2$ + ~1% $O_2$ | 15 min at 1,000° C. in $N_2$ + ~1% $O_2$ | 15 min at 1,000° C. in $N_2$ + ~1% $O_2$ |
| $S_2$ | 35 seconds at 1250° C. in $N_2$ | 35 seconds at 1250° C. in $N_2$ | 35 seconds at 1250° C. in $N_2$ |
| $S_3$ | 125° C./sec | 125° C./sec | 125° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm$^3$) | 6 × 10$^{17}$ | 7 × 10$^{17}$ | 8 × 10$^{17}$ |
| OPD atoms/cm$^3$) | 4 × 10$^{10}$ | 1 × 10$^{10}$ | 6 × 10$^{10}$ |
| DZ (depth in µm) | ~40 | ~40 | ~40 |

Example 3

Figure 9:
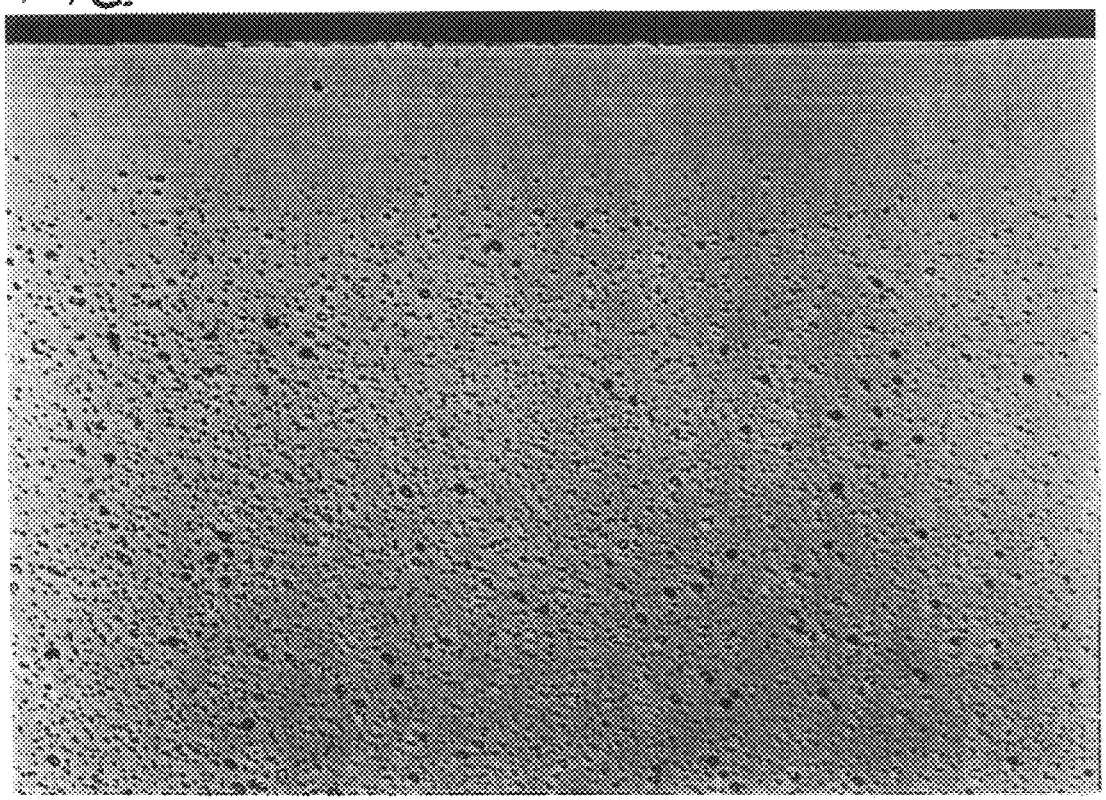
FIG. 9 is a photograph of a cross-section of a wafer (sample 1–8) which was subjected to the series of steps set forth in Example 3.
Figure 10:
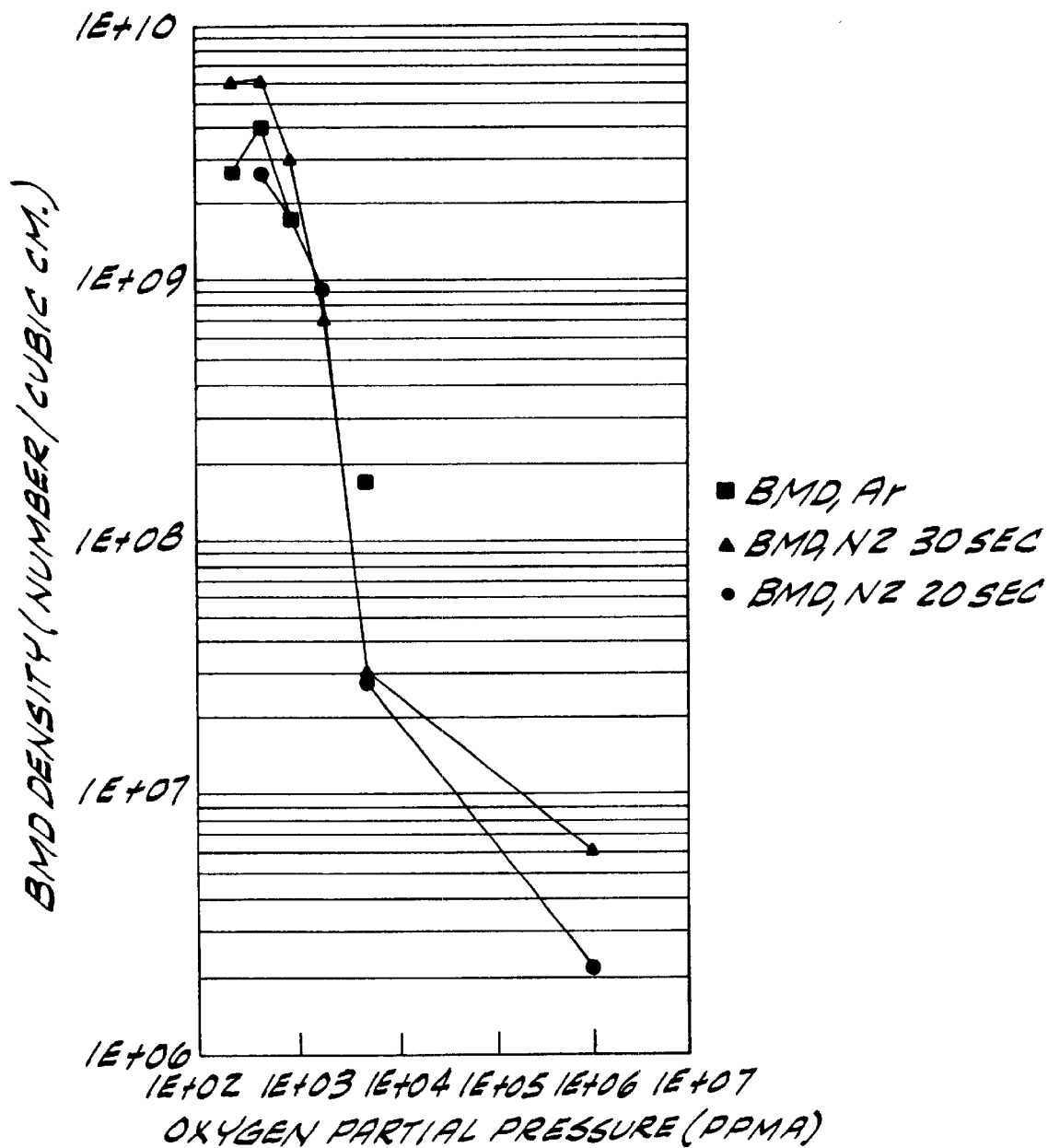
FIG. 10 is logarithmic graph of the number density of bulk microdefects (BMD) versus the partial pressure of oxygen present in the atmosphere during rapid thermal annealing of single crystal silicon wafers in accordance with the ideal precipitating wafer process, as described in Example 4.

To demonstrate that the process of the present invention was relatively independent of the conditions used for the oxygen precipitate stabilization and growth step ($S_4$), a wafer (sample 1–8) having the same initial oxygen concentration was subjected to the same series of steps described in Example 2 for sample 3–4 except that a proprietary, commercial 16 Mb DRAM process was used as the oxygen precipitate stabilization and growth step ($S_4$). FIG. 9 shows a cross-section of the resulting wafer (this figure is an enlargement of a photograph taken at a magnification of 200×). After step $S_4$, samples 1–8 and 3–4 had comparable bulk oxygen precipitate densities (7×10$^{10}$ /cm$^3$ for sample 1–8 versus 4×10$^{10}$/cm$^3$ for sample 3–4) and comparable denuded zone depths (approximately 40 micrometers).

Example 4

This example illustrates the trend that may be observed in the density of bulk microdefects (BMD), i.e., the density of oxygen precipitants, and the depth of the denuded zone (DZ) resulting from an increase in the concentration of oxygen in the atmosphere during the heat-treatment. Three different sets of wafers were subjected to rapid thermal annealing under varying process conditions. The wafers in Set A were annealed at 1200° C. for 30 seconds under a nitrogen atmosphere; the wafers in Set B were annealed under the same conditions for 20 seconds; and, the wafers in Set C were annealed at 1200° C. for 30 seconds under an argon atmosphere. A pre-oxidation step was not performed on any of the wafers in the three sets in this Example.

As indicated by Table III, below, the oxygen partial pressure was increased for each wafer within a given Set. Once annealing was completed, the BMD density and DZ depth for each wafer was determined by means standard in the art. The results are present in Table III, below.

TABLE III

| Wafer Set | Oxygen Partial Pressure | BMD Density (defects/cm$^{-3}$) | DZ Depth (microns) |
|---|---|---|---|
| A | 250 ppma | $6.14 \times 10^9$ | 70 |
| A | 500 ppma | $6.24 \times 10^9$ | 80 |
| A | 1000 ppma | $2.97 \times 10^9$ | 80 |
| A | 2000 ppma | $7.02 \times 10^8$ | 100 |
| A | 5000 ppma | $2.99 \times 10^7$ | ND |
| A | $1 \times 10^6$ ppma | $6.03 \times 10^6$ | ND |
| B | 500 ppma | $2.59 \times 10^9$ | 80 |
| B | 1000 ppma | $1.72 \times 10^9$ | 100 |
| B | 2000 ppma | $9.15 \times 10^8$ | 100 |
| B | 5000 ppma | $2.65 \times 10^7$ | ND |
| B | $1 \times 10^6$ ppma | $2.17 \times 10^6$ | ND |
| C | 250 ppma | $2.65 \times 10^9$ | 90 |
| C | 500 ppma | $4.03 \times 10^9$ | 70 |
| C | 1000 ppma | $1.72 \times 10^9$ | 140 |
| C | 5000 ppma | $1.69 \times 10^8$ | 120 |

ND = not determined.

The above data shows that as the partial pressure of oxygen in the atmosphere increases, the number density of bulk microdefects decreases. In addition, when the oxygen partial pressure reaches 10,000 ppma, the number density of bulk microdefects is indistinguishable from the number density of bulk microdefects which is observed in wafers which have been subjected to an oxygen precipitation heat-treatment without a prior rapid thermal annealing in accordance with the present invention.

Example 5

Oxidative Thermal Anneal Treatment

Figure 36:
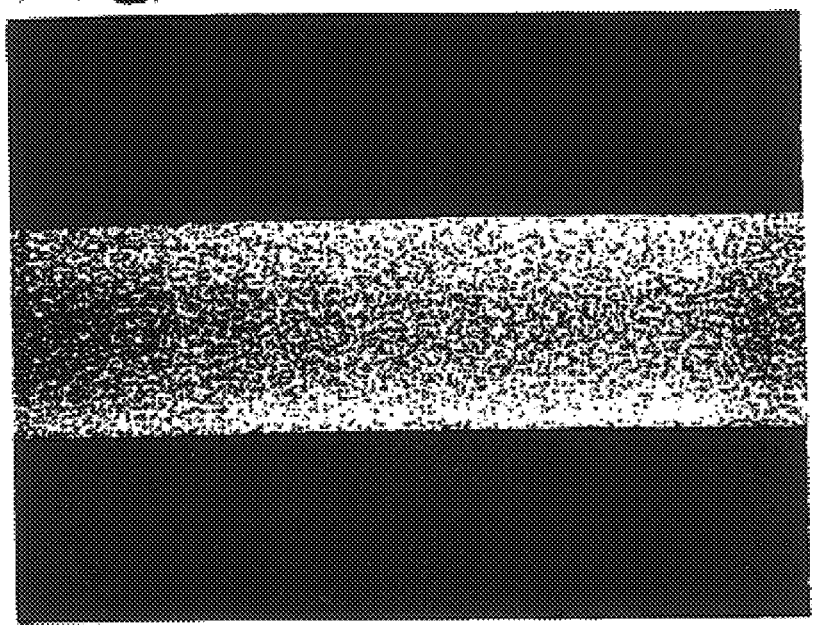
FIG. 36 is a photograph taken under magnification of a cross-section of a wafer (white background) which has been thermally annealed, in accordance with the present process, in a nitriding atmosphere in the absence of an enhanced oxide layer, following an NEC-1 treatment.
Figure 37:
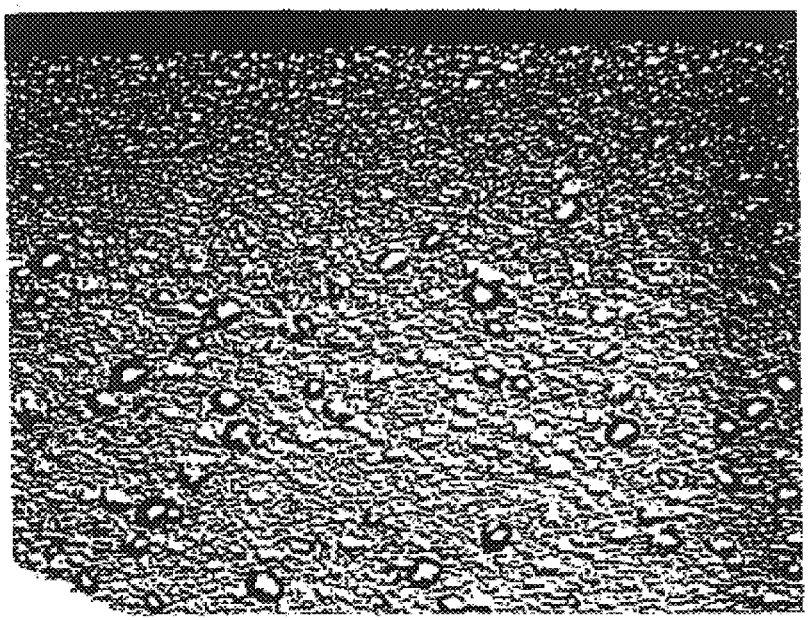
FIG. 37 is a photograph, taken under greater magnification than in FIG. 36, of a portion of the wafer cross-section shown in FIG. 36, showing in detail the essential absence of a denuded zone.

For purposes of illustrating the oxidative thermal anneal treatment of the present invention, silicon wafers, obtained from single crystal silicon ingots grown in accordance with the Czochralski method, having only a native oxide layer were subjected to a thermal annealing step ($S_2$). In each case, the wafers were annealed in a rapid thermal annealer under an ammonia-containing atmosphere at about 1180° C. for about 3 minute, and then rapidly cooled ($S_3$). Referring now to FIGS. 36 and 37, it may be observed that, following an oxygen stabilization and growth step ($S_4$) and a NEC-1 treatment, such process conditions yield a silicon wafer having essentially no denuded zone and a bulk oxygen precipitate density (OPD) which is greater than about $1 \times 10^{10}$ atoms/cm$^3$.

Figure 38:
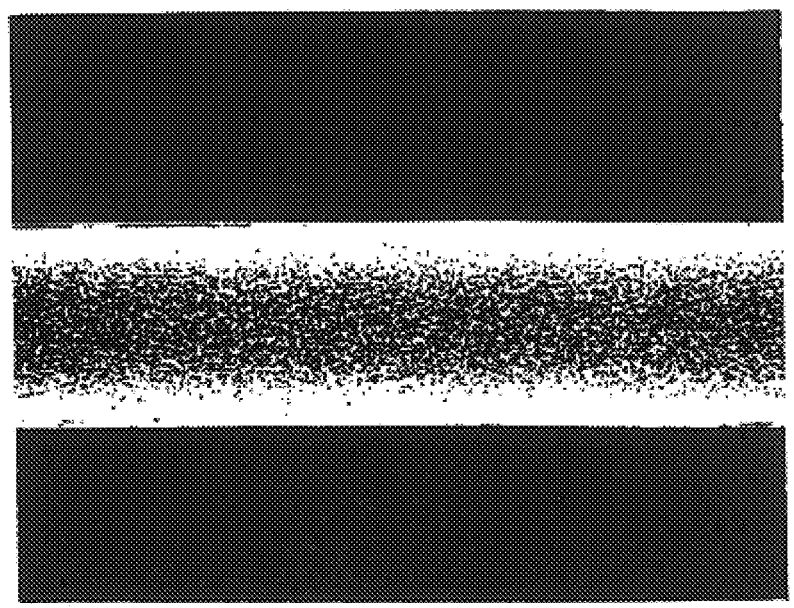
FIG. 38 is a photograph taken under magnification of a cross-section of a wafer (white background) which has been thermally annealed, in accordance with the present invention, in a nitriding atmosphere in the absence of an enhanced oxide layer and which was subsequently subjected to a thermal oxidation treatment.
Figure 39:
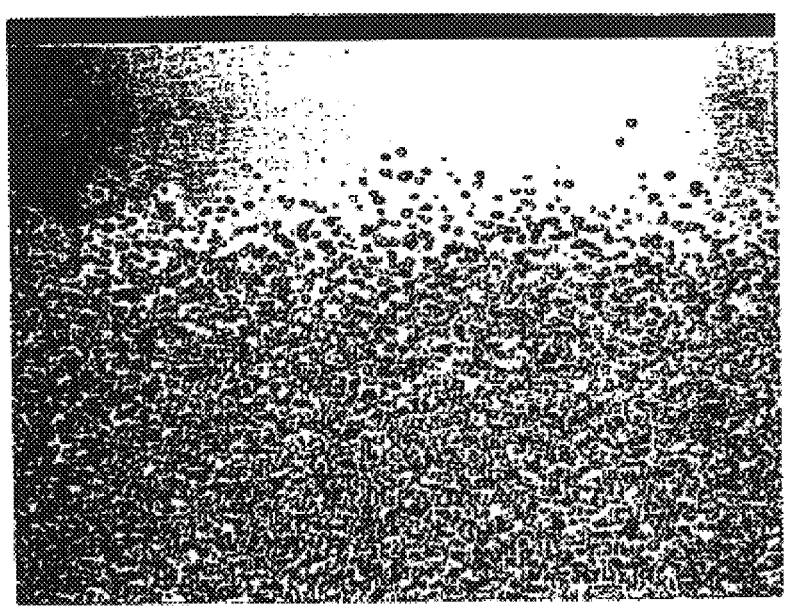
FIG. 39 is a photograph, taken under greater magnification than in FIG. 38, of a portion of the wafer cross-section shown in FIG. 38, showing in detail the presence of a denuded zone.

In contrast to the wafer of FIGS. 36 and 37, a denuded zone may be formed if, after cooling ($S_3$) is complete and prior to step $S_4$, the wafer is subjected to an oxidative thermal step. Referring now to FIGS. 38 and 39, after cooling was complete the surface of a wafer etched slightly in order to remove any nitride layer present. The wafer was then heated to about 1180° C. for about 3 minutes under an oxygen-containing ambient, having an oxygen concentration in this Example of about 100%, in a rapid thermal annealer. It may be observed that, following an oxygen stabilization and growth step ($S_4$) and a NEC-1 treatment, such process conditions yield a silicon wafer having a denuded zone depth of about 60 μm and a bulk oxygen precipitate density (OPD) which is greater than about $1 \times 10^{10}$ atoms/cm$^3$.

Figure 40:
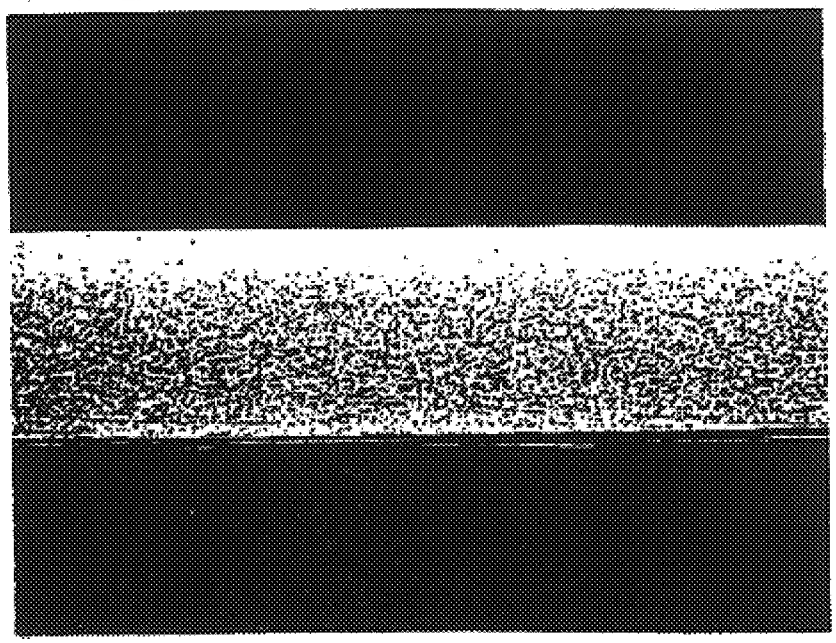
FIG. 40 is a photograph taken under magnification of a cross-section of a wafer (white background) which has been thermally annealed, in accordance with the present invention, in a nitriding atmosphere in the absence of an enhanced oxide layer and which was subsequently subjected to a thermal oxidation treatment on only one side of the wafer.
Figure 41:
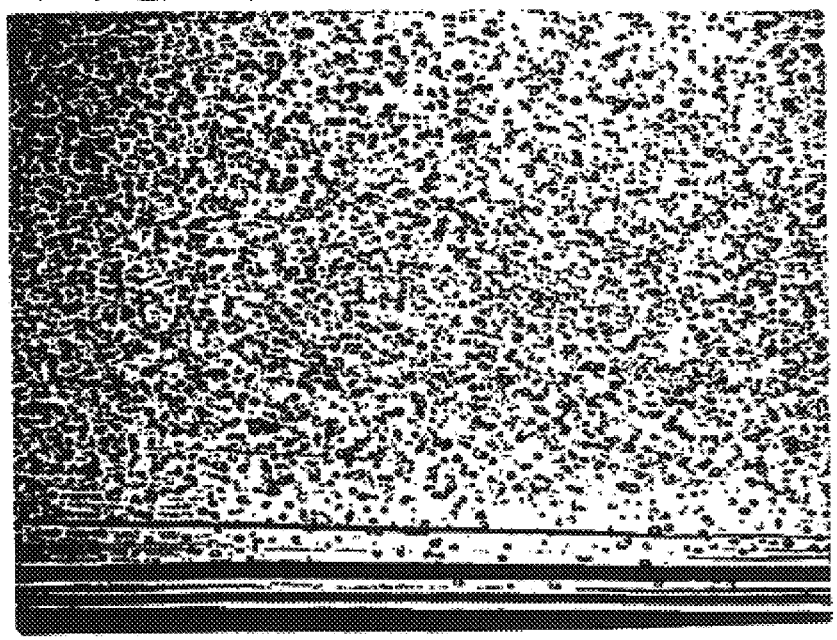
FIG. 41 is a photograph, taken under greater magnification than in FIG. 40, of a portion of the wafer cross-section shown in FIG. 40, showing in detail the essential absence of a denuded zone on the shielded side of the wafer.

Referring now to FIGS. 40 and 41, it may be observed that the oxidative thermal anneal step may be performed on only one side of the silicon wafer. Single-sided treatment is achieved by shielding the side of the wafer which is not to be treated. The wafer shown in FIGS. 40 and 41 was treated in the same manner as the wafer shown in FIGS. 38 and 39, with the exception that one side of the wafer was shielded by first forming a silicon nitride coating using a low temperature, chemical vapor phase deposition (CVD) process. It may be observed that, following an oxygen stabilization and growth step ($S_4$) and a NEC-1 treatment, the resulting wafer has a denuded zone depth of about 60 μm on the side which was not shielded (front-side), while the shielded side (back-side) of the wafer essentially had no denuded zone. The bulk oxygen precipitate density (OPD) of the wafer was greater than about $1 \times 10^{10}$ atoms/cm$^3$.

It is to be noted that surface etching of the wafer to remove any nitride layer present is not necessary in order to achieve the results of the present process. Rather, the surface etch is optional and, accordingly, is not to be viewed in a limiting sense.

It is to be further noted that, in view of Example 15, that a denuded zone may be effectively formed by thermally annealing the wafer in the presence of an oxidizing atmosphere. Additionally, a denuded zone formed by other embodiments of the present invention may be further modified by this thermal oxidation treatment. For example, the depth of the denuded zones of samples 4–7 and 4–8 (Example 1) may be increased by subjecting the samples to this thermal oxidation treatment prior to the oxygen precipitation heat treatment of step $S_4$. Likewise, for sample 3–14 (Example 1), a denuded zone may be formed by subjecting the wafer to this thermal oxidation treatment.

SINGLE CRYSTAL SILICON CONTAINING A SUBSTANTIALLY DEFECT-FREE AXIALLY SYMMETRIC REGION

Example 6

Figure 17:
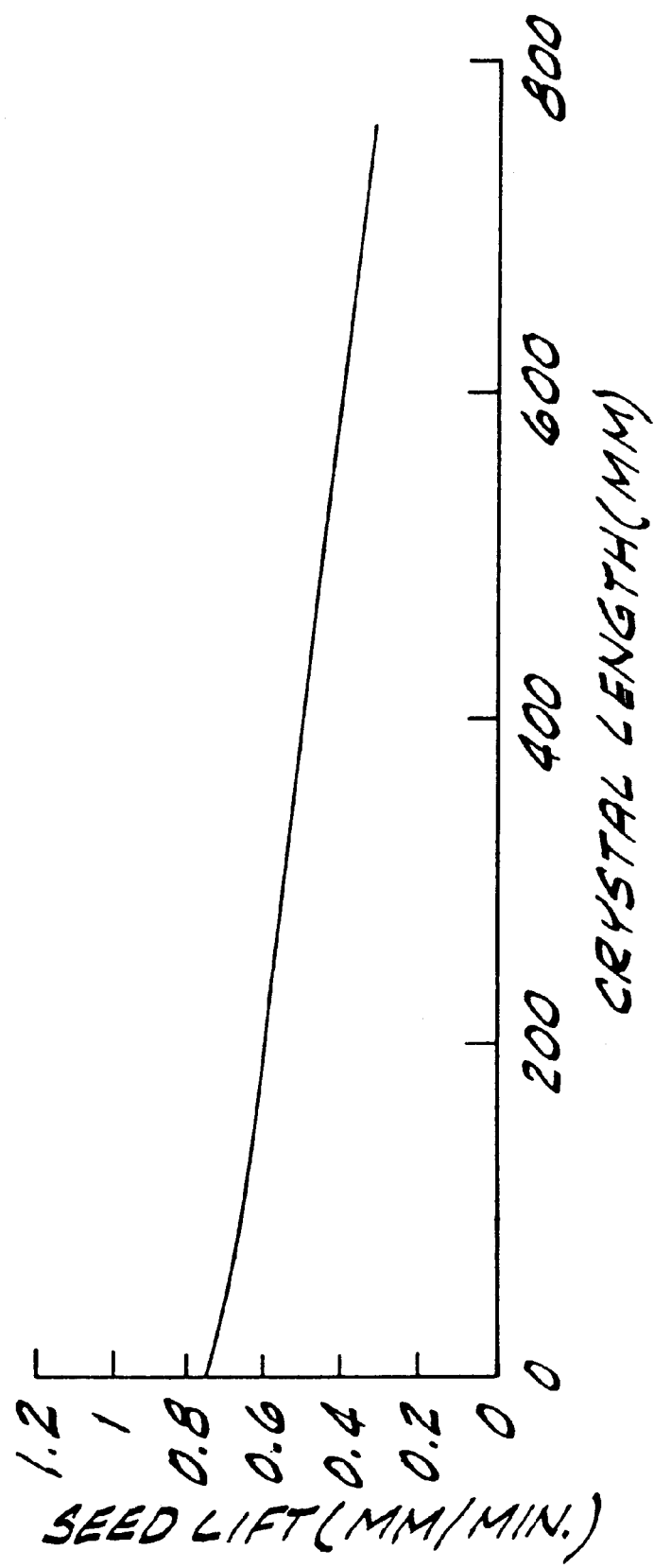
FIG. 17 is a graph of pull rate (i.e., seed lift) as a function of crystal length, showing how the pull rate is decreased linearly over a portion of the length of the crystal.

Optimization Procedure For A Crystal Puller Having A Pre-existing Hot Zone Design A first 200 mm single crystal silicon ingot was grown under conditions in which the pull rate was ramped linearly from about 0.75 mm/min. to about 0.35 mm/min. over the length of the crystal. FIG. 17 shows the pull rate as a function of crystal length. Taking into account the pre-established axial temperature profile of a growing 200 mm ingot in the crystal puller and the pre-established radial variations in the average axial temperature gradient, $G_0$, i.e., the axial temperature gradient at the melt/solid interface, these pull rates were selected to insure that ingot would be vacancy dominated material from the center to the edge at one end of the ingot and interstitial dominated material from the center to the edge of the other end of the ingot. The grown ingot was sliced longitudinally and analyzed to determine where the formation of agglomerated interstitial defects begins.

Figure 18:
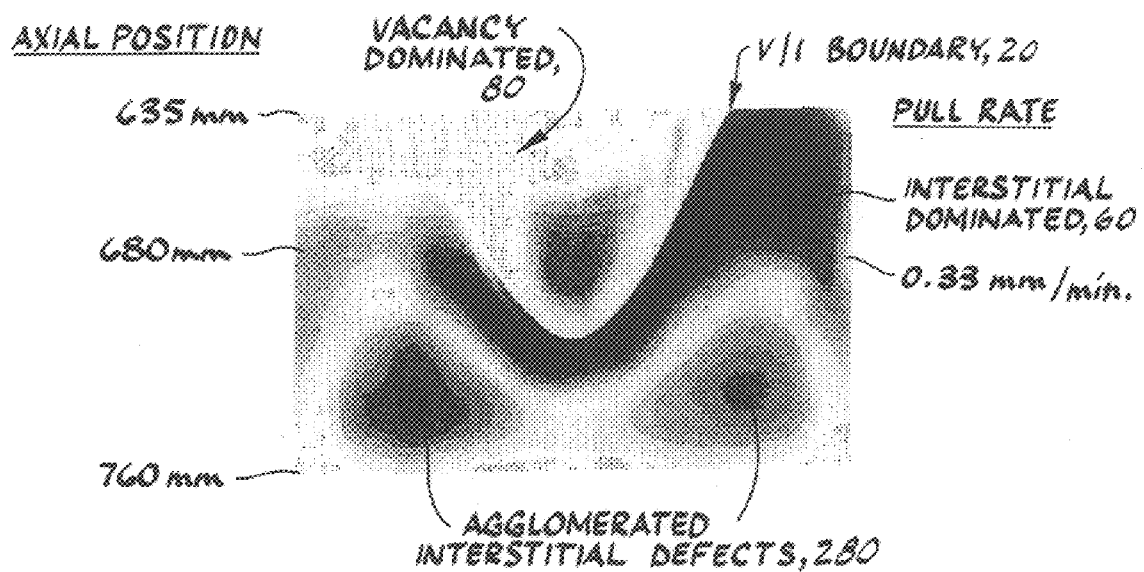
FIG. 18 is an image produced by a scan of the minority carrier lifetime of an axial cut of the ingot following a series of oxygen precipitation heat treatments, as described in Example 6.

FIG. 18 is an image produced by a scan of the minority carrier lifetime of an axial cut of the ingot over a section ranging from about 635 mm to about 760 mm from the shoulder of the ingot following a series of oxygen precipitation heat-treatments which reveal defect distribution patterns. At a crystal position of about 680 mm, a band of agglomerated interstitial defects 280 can be seen. This position corresponds to a critical pull rate of v*(680 mm)= 0.33 mm/min. At this point, the width of the axially symmetric region 60 (a region which is interstitial dominated material but which lacks agglomerated interstitial defects) is at its maximum; the width of the vacancy dominated region 80, $R_v^*(680)$ is about 35 mm and the width of the axially symmetric region, $R_1^*(680)$ is about 65 mm.

Figure 19:
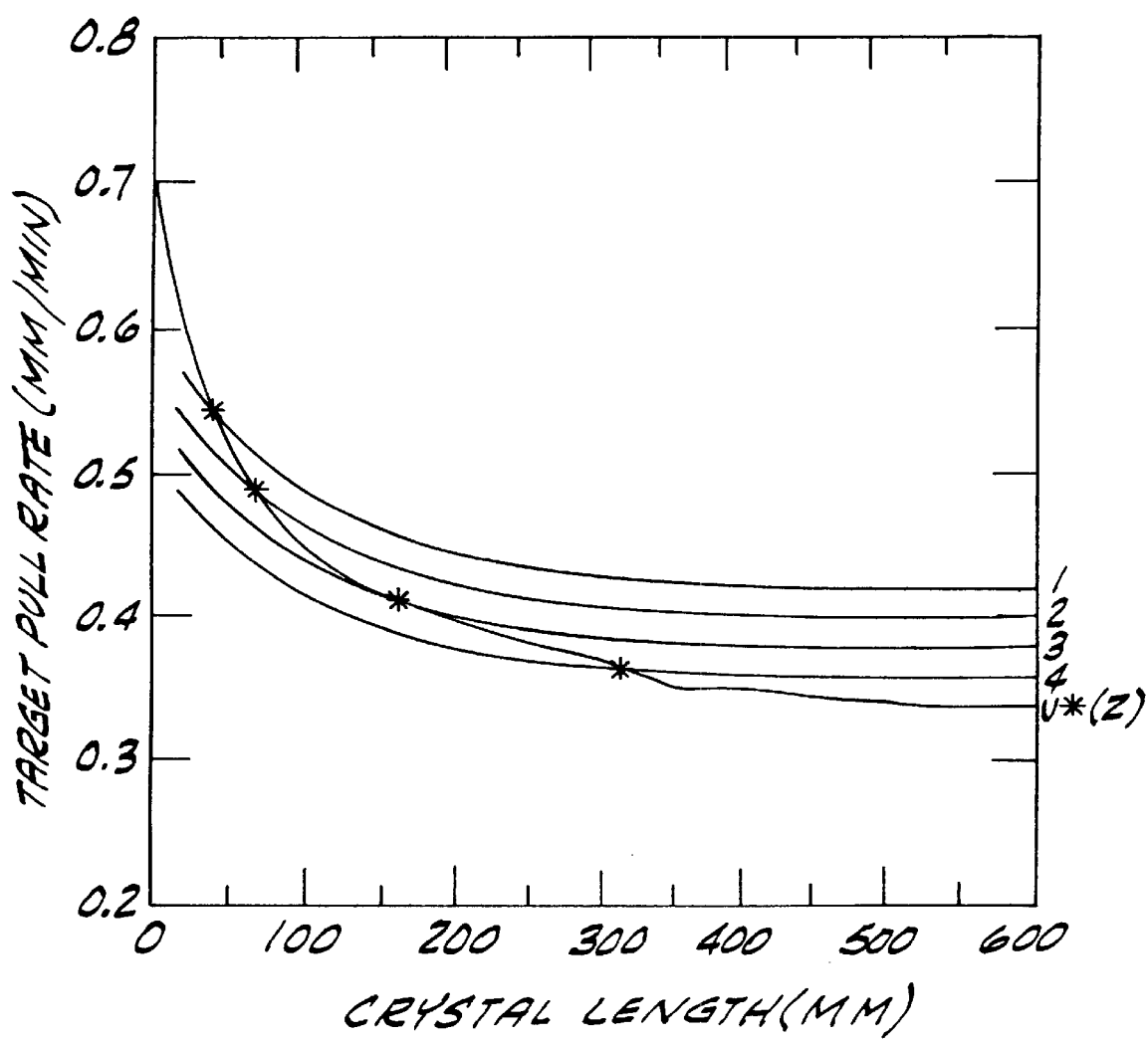
FIG. 19 is a graph of pull rate as a function of crystal length for each of four single crystal silicon ingots, labeled 1–4 respectively, which are used to yield a curve, labeled v*(Z), as described in Example 6.

A series of four single crystal silicon ingots were then grown at steady state pull rates which were somewhat greater than and somewhat less than the pull rate at which the maximum width of the axially symmetric region of the first 200 mm ingot was obtained. FIG. 19 shows the pull rate as a function of crystal length for each of the four crystals, labeled, respectively, as 1–4. These four crystals were then analyzed to determine the axial position (and corresponding pull rate) at which agglomerated interstitial defects first appear or disappear. These four empirically determined points (marked "*") are shown in FIG. 19. Interpolation between and extrapolation from these points yielded a curve, labeled v*(Z) in FIG. 19. This curve represents, to a first approximation, the pull rate for 200 mm crystals as a function of length in the crystal puller at which the axially symmetric region is at its maximum width.

Growth of additional crystals at other pull rates and further analysis of these crystals would further refine the empirical definition of v*(Z).

Example 7

Reduction of Radial Variation in $G_0(r)$

Figure 20:
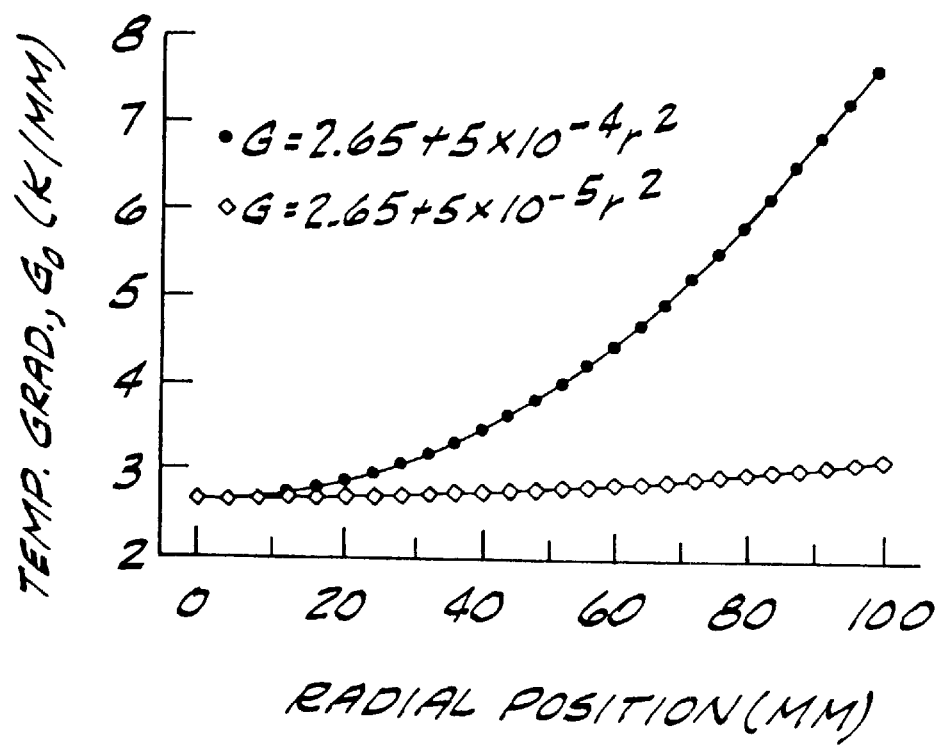
FIG. 20 is a graph of the average axial temperature gradient at the melt/solid interface, $G_0$, as a function of radial position, for two different cases as described in Example 7.
Figure 21:
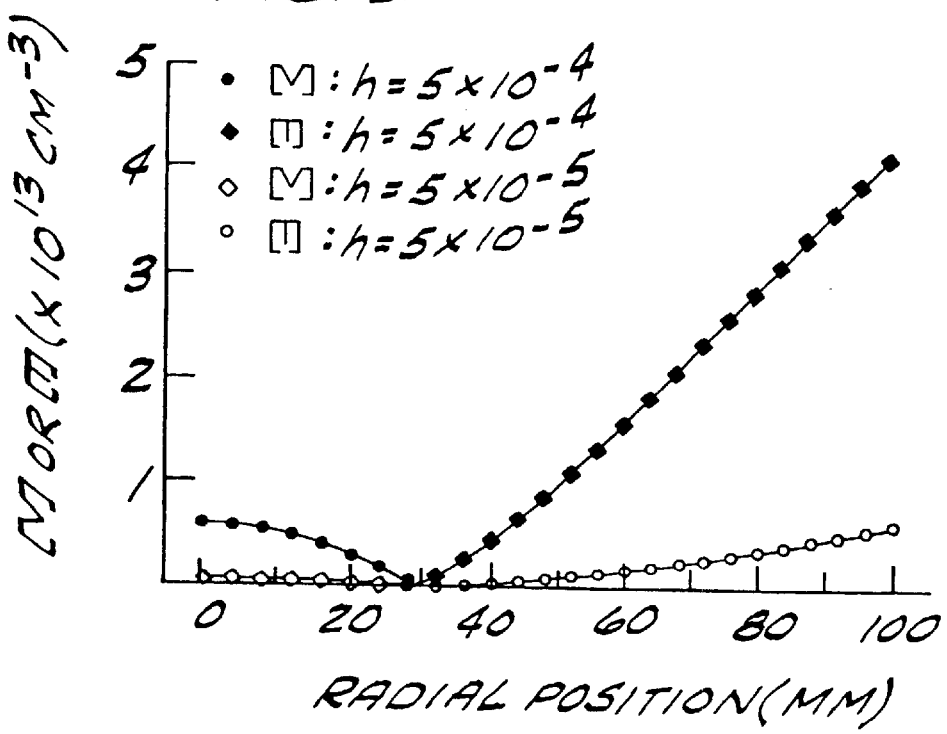
FIG. 21 is a graph of the initial concentration of vacancies, [V], or self-interstitials, [I], as a function of radial position, for two different cases as described Example 7.

FIGS. 20 and 21 illustrate the improvement in quality that can be achieved by reduction of the radial variation in the axial temperature gradient at the melt/solid interface, $G_0(r)$. The initial concentration (about 1 cm from the melt/solid interface) of vacancies and interstitials are calculated for two cases with different $G_0(r)$: (1) $G_0(r)=2.65+5\times10^{-4}r^2$ (K/mm) and (2) $G_0(r)=2.65+5\times10^{-5}r^2$ (K/mm). For each case the pull rate was adjusted such that the boundary between vacancy-rich silicon and interstitial-rich silicon is at a radius of 3 cm. The pull rate used for case 1 and 2 were 0.4 and 0.35 mm/min, respectively. From FIG. 21 it is clear that the initial concentration of interstitials in the interstitial-rich portion of the crystal is dramatically reduced as the radial variation in the initial axial temperature gradient is reduced. This leads to an improvement in the quality of the material since it becomes easier to avoid the formation of interstitial defect clusters due to supersaturation of interstitials.

Example 8

Increased Out-diffusion Time for Interstitials

Figure 22:
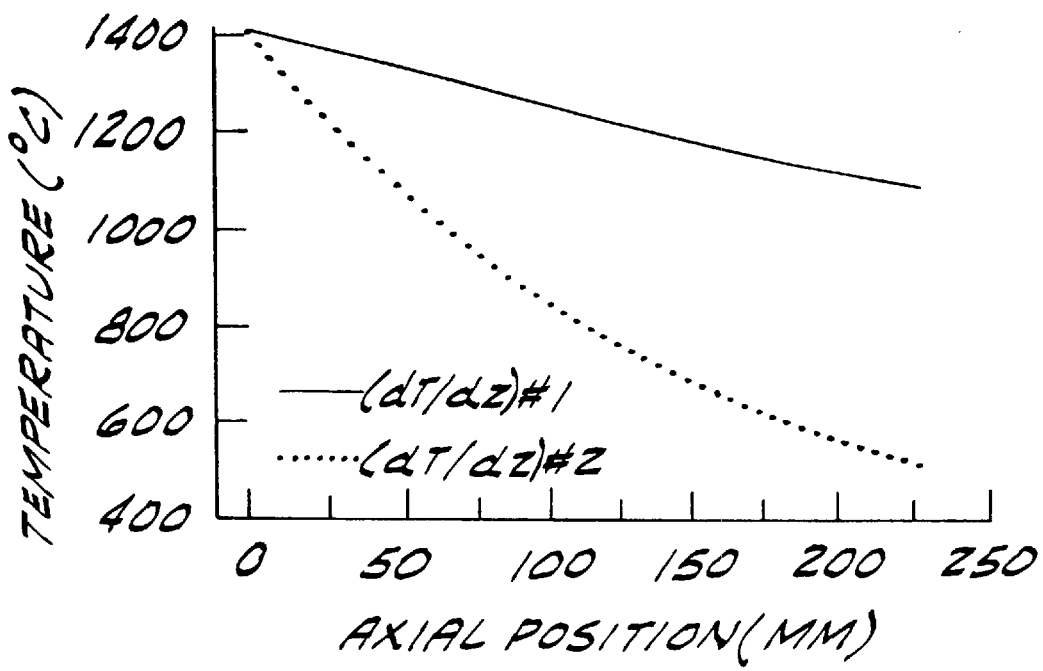
FIG. 22 is a graph of temperature as a function of axial position, showing the axial temperature profile in ingots for two different cases as described in Example 8.
Figure 23:
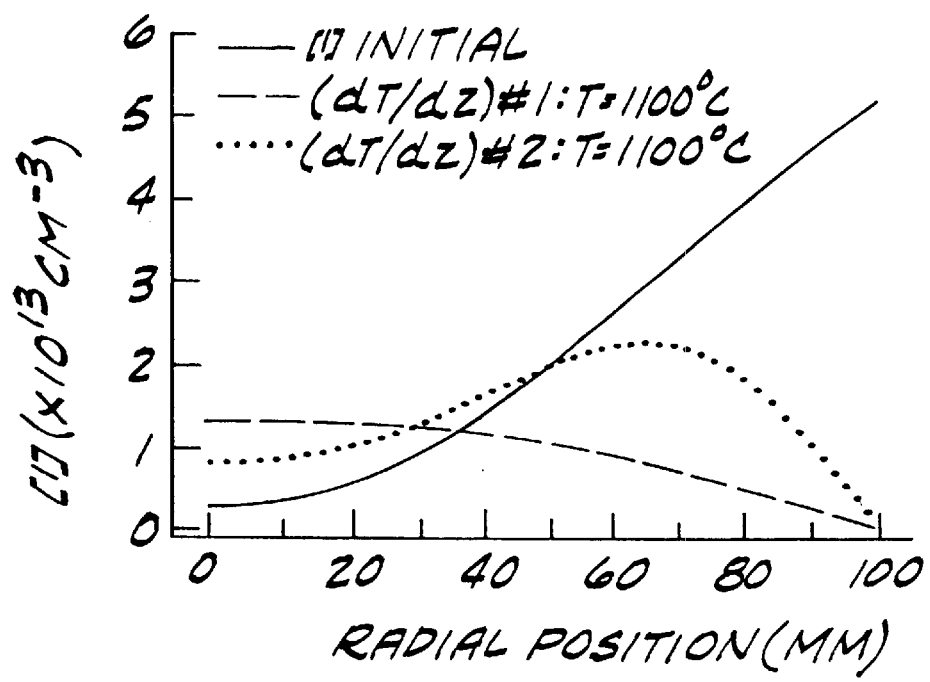
FIG. 23 is a graph of the self-interstitial concentrations resulting from the two cooling conditions illustrated in FIG. 22 and as more fully described in Example 8.

FIGS. 22 and 23 illustrate the improvement in quality that can be achieved by increasing the time for out-diffusion of interstitials. The concentration of interstitials is calculated for two cases with differing axial temperature profiles in the crystal, dT/dz. The axial temperature gradient at the melt/solid interface is the same for both cases, so that the initial concentration (about 1 cm from the melt/solid interface) of interstitials is the same for both cases. In this example, the pull rate was adjusted such that the entire crystal is interstitial-rich. The pull rate was the same for both cases, 0.32 mm/min. The longer time for interstitial out-diffusion in case 2 results in an overall reduction of the interstitial concentration. This leads to an improvement in the quality of the material since it becomes easier to avoid the formation of interstitial defect clusters due to supersaturation of interstitials.

Example 9

A 700 mm long, 150 mm diameter crystal was grown with a varying pull rate. The pull rate varied nearly linearly from about 1.2 mm/min at the shoulder to about 0.4 mm/min at 430 mm from the shoulder, and then nearly linearly back to about 0.65 mm/min at 700 mm from the shoulder. Under these conditions in this particular crystal puller, the entire radius is grown under interstitial-rich conditions over the length of crystal ranging from about 320 mm to about 525 mm from the shoulder of the crystal. Referring to FIG. 24, at an axial position of about 525 mm and a pull rate of about 0.47 mm/min, the crystal is free of agglomerated intrinsic point defects clusters across the entire diameter. Stated another way, there is one small section of the crystal in which the width of the axially symmetric region, i.e., the region which is substantially free of agglomerated defects, is equal to the radius of the ingot.

Example 10

As described in Example 6, a series of single crystal silicon ingots were grown at varying pull rates and then analyzed to determine the axial position (and corresponding pull rate) at which agglomerated interstitial defects first appeared or disappeared. Interpolation between and extrapolation from these points, plotted on a graph of pull rate v. axial position, yielded a curve which represents, to a first approximation, the pull rate for a 200 mm crystal as a function of length in the crystal puller at which the axially symmetric region is at its maximum width. Additional crystals were then grown at other pull rates and further analysis of these crystals was used to refine this empirically determined optimum pull rate profile.

Using this data and following this optimum pull rate profile, a crystal of about 1000 mm in length and about 200 mm in diameter was grown. Slices of the grown crystal, obtained from various axial position, were then analyzed using oxygen precipitation methods standard in the art in order to (i) determine if agglomerated interstitial defects were formed, and (ii) determine, as a function of the radius of the slice, the position of the V/I boundary. In this way the presence of an axially symmetric region was determined, as well as the width of this region a function of crystal length or position.

The results obtained for axial positions ranging from about 200 mm to about 950 mm from the shoulder of the ingot are present in the graph of FIG. 25. These results show that a pull rate profile may be determined for the growth of a single crystal silicon ingot such that the constant diameter portion of the ingot may contain an axially symmetric region having a width, as measured from the circumferential edge radially toward the central axis of the ingot, which is at least about 40% the length of the radius of the constant diameter portion. In addition, these results show that this axially symmetric region may have a length, as measured along the central axis of the ingot, which is about 75% of the length of the constant diameter portion of the ingot.

Example 11

A single crystal silicon ingot have a length of about 1100 mm and a diameter of about 150 mm was grown with a decreasing pull rate. The pull rate at the shoulder of the constant diameter portion of the ingot was about 1 mm/min. The pull rate decreased exponentially to about 0.4 mm/min., which corresponded to an axial position of about 200 mm from the shoulder. The pull rate then decreased linearly until a rate of about 0.3 mm/min. was reached near the end of the constant diameter portion of the ingot.

Figure 26A:
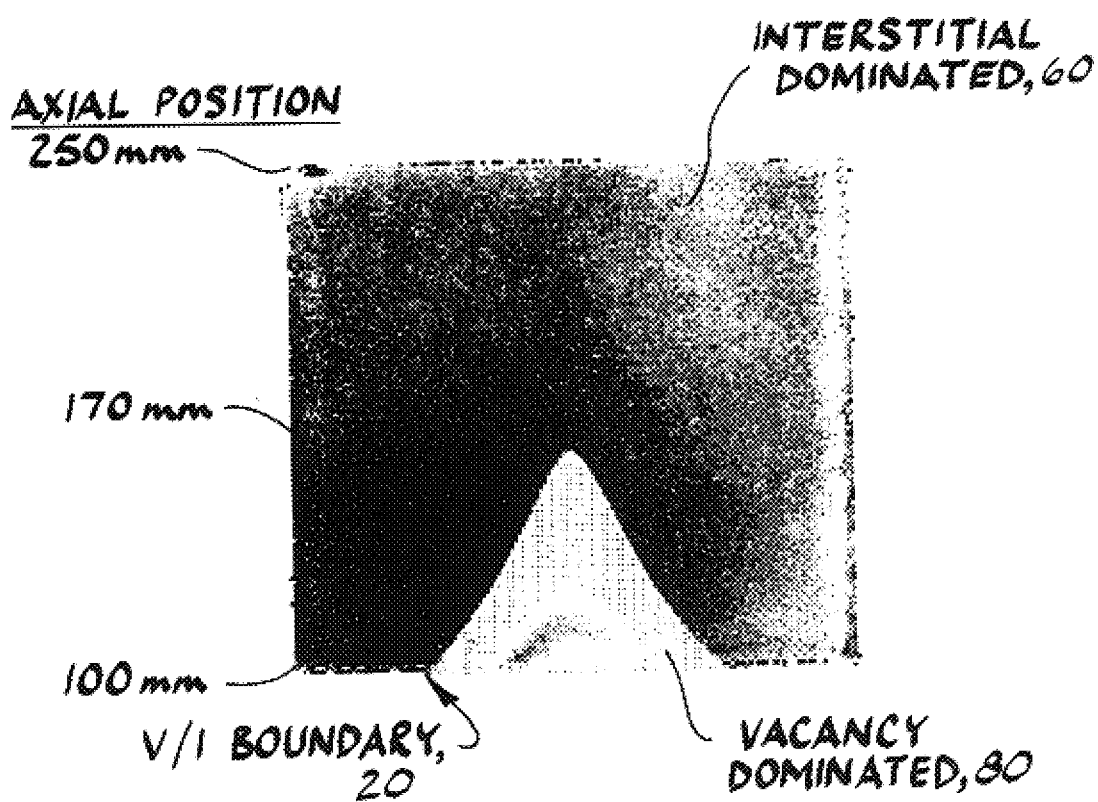
FIG. 26a is an image produced by a scan of the minority carrier lifetime of an axial cut of a segment of an ingot, ranging from about 100 mm to about 250 mm from the shoulder of the ingot, following a series of oxygen precipitation heat treatments, as described in Example 11.

Under these process conditions in this particular hot zone configuration, the resulting ingot contains a region wherein the axially symmetric region has a width which about equal to the radius of the ingot. Referring now to FIGS. 26a and 26b, which are images produced by a scan of the minority carrier lifetime of an axial cut of a portion of the ingot following a series of oxygen precipitation heat treatments, consecutive segments of the ingot, ranging in axial position from about 100 mm to about 250 mm and about 250 mm to about 400 mm are present. It can be seen from these figures that a region exists within the ingot, ranging in axial position from about 170 mm to about 290 mm from the shoulder, which is free of agglomerated intrinsic point defects across the entire diameter. Stated another way, a region is present within the ingot wherein the width of the axially symmetric region, i.e., the region which is substantially free of agglomerated interstitial defects, is about equal to the radius of the ingot.

In addition, in a region ranging from an axial position of about 125 mm to about 170 mm and of about 290 mm to greater than 400 mm there are axially symmetric regions of interstitial dominated material free of agglomerated intrinsic point defects surrounding a generally cylindrical core of vacancy dominated material which is also free of agglomerated intrinsic point defects.

Finally, in a region ranging from an axial position of about 100 mm to about 125 mm there is an axially symmetric region of interstitial dominated material free of agglomerated defects surrounding a generally cylindrical core of vacancy dominated material. Within the vacancy dominated material, there is an axially symmetric region which is free of agglomerated defects surrounding a core containing agglomerated vacancy defects.

Example 12

Cooling Rate and Position of V/I Boundary

A series of single crystal silicon ingots (150 mm and 200 mm nominal diameter), were grown in accordance with the Czochralski method using different hot zone configurations, designed by means common in the art, which affected the residence time of the silicon at temperatures in excess of about 1050° C. The pull rate profile for each ingot was varied along the length of the ingot in an attempt to create a transition from a region of agglomerated vacancy point defects to a region of agglomerated interstitial point defects.

Once grown, the ingots were cut longitudinally along the central axis running parallel to the direction of growth, and then further divided into sections which were each about 2 mm in thickness. Using the copper decoration technique previously described, one set of such longitudinal sections was then heated and intentionally contaminated with copper, the heating conditions being appropriate for the dissolution of a high concentration of copper interstitials. Following this heat treatment, the samples were then rapidly cooled, during which time the copper impurities either outdiffused or precipitated at sites where oxide clusters or agglomerated interstitial defects where present. After a standard defect delineating etch, the samples were visually inspected for the presence of precipitated impurities; those regions which were free of such precipitated impurities corresponded to regions which were free of agglomerated interstitial defects.

Another set of the longitudinal sections was subjected to a series of oxygen precipitation heat treatments in order to cause the nucleation and growth of new oxide clusters prior to carrier lifetime mapping. Contrast bands in lifetime mapping were utilized in order to determine and measure the shape of the instantaneous melt/solid interface at various axial positions in each ingot. Information on the shape of the melt/solid interface was then used, as discussed further below, to estimate the absolute value of, and the radial variation in, the average axial temperature gradient, $G_0$. This information was also used, in conjunction with the pull rate, to estimate the radial variation in $v/G_0$.

To more closely examine the effect growth conditions have on the resulting quality of a single crystal silicon ingot, several assumptions were made which, based on experimental evidence available to-date, are believed to be justified. First, in order to simplify the treatment of thermal history in terms of the time taken to cool to a temperature at which the agglomeration of interstitial defects occurs, it was assumed that about 1050° C. is a reasonable approximation for the temperature at which the agglomeration of silicon self-interstitials occurs. This temperature appears to coincide with changes in agglomerated interstitial defect density observed during experiments in which different cooling rates were employed. Although, as noted above, whether agglomeration occurs is also a factor of the concentration of interstitials, it is believed that agglomeration will not occur at temperatures above about 1050° C. because, given the range of interstitial concentrations typical for Czochralski-type growth processes, it is reasonable to assume that the system will not become critically supersaturated with interstitials above this temperature. Stated another way, for concentrations of interstitials which are typical for Czochralski-type growth processes, it is reasonable to assume that the system will not become critically supersaturated, and therefore an agglomeration event will not occur, above a temperature of about 1050° C.

The second assumption that was made to parameterize the effect of growth conditions on the quality of single crystal silicon is that the temperature dependence of silicon self-interstitial diffusivity is negligible. Stated another way, it is assumed that self-interstitials diffuse at the same rate at all temperatures between about 1400° C. and about 1050° C. Understanding that about 1050° C. is considered a reasonable approximation for the temperature of agglomeration, the essential point of this assumption is that the details of the cooling curve from the melting point does not matter. The diffusion distance depends only on the total time spent cooling from the melting point to about 1050° C.

Using the axial temperature profile data for each hot zone design and the actual pull rate profile for a particular ingot, the total cooling time from about 1400° C. to about 1050° C. may be calculated. It should be noted that the rate at which the temperature changes for each of the hot zones was reasonably uniform. This uniformity means that any error in the selection of a temperature of nucleation for agglomerated interstitial defects, i.e., about 1050° C., will arguably lead only to scaled errors in the calculated cooling time.

In order to determine the radial extent of the vacancy dominated region of the ingot ($R_{vacancy}$), or alternatively the width of the axially symmetric region, it was further assumed that the radius of the vacancy dominated core, as determined by the lifetime map, is equivalent to the point at solidification where $v/G_0=v/G_0$ critical. Stated another way, the width of the axially symmetric region was generally assumed to be based on the position of the V/I boundary after cooling to room temperature. This is pointed out because, as mentioned above, as the ingot cools recombination of vacancies and silicon self-interstitials may occur. When recombination does occur, the actual position of the V/I boundary shifts inwardly toward the central axis of the ingot. It is this final position which is being referred to here.

To simplify the calculation of $G_0$, the average axial temperature gradient in the crystal at the time of solidification, the melt/solid interface shape was assumed to be the melting point isotherm. The crystal surface temperatures were calculated using finite element modeling (FEA) techniques and the details of the hot zone design. The entire temperature field within the crystal, and therefore $G_0$, was deduced by solving Laplace's equation with the proper boundary conditions, namely, the melting point along the melt/solid interface and the FEA results for the surface temperature along the axis of the crystal. The results obtained at various axial positions from one of the ingots prepared and evaluated are presented in FIG. 27.

To estimate the effect that radial variations in $G_0$ have on the initial interstitial concentration, a radial position R', that is, a position halfway between the V/I boundary and the crystal surface, was assumed to be the furthest point a silicon self-interstitial can be from a sink in the ingot, whether that sink be in the vacancy dominated region or on the crystal surface. By using the growth rate and the $G_0$ data for the above ingot, the difference between the calculated $v/G_0$ at the position R' and $v/G_0$ at the V/I boundary (i.e., the critical $v/G_0$ value) provides an indication of the radial variation in the initial interstitial concentration, as well as the effect this has on the ability for excess interstitials to reach a sink on the crystal surface or in the vacancy dominated region.

Figure 28:
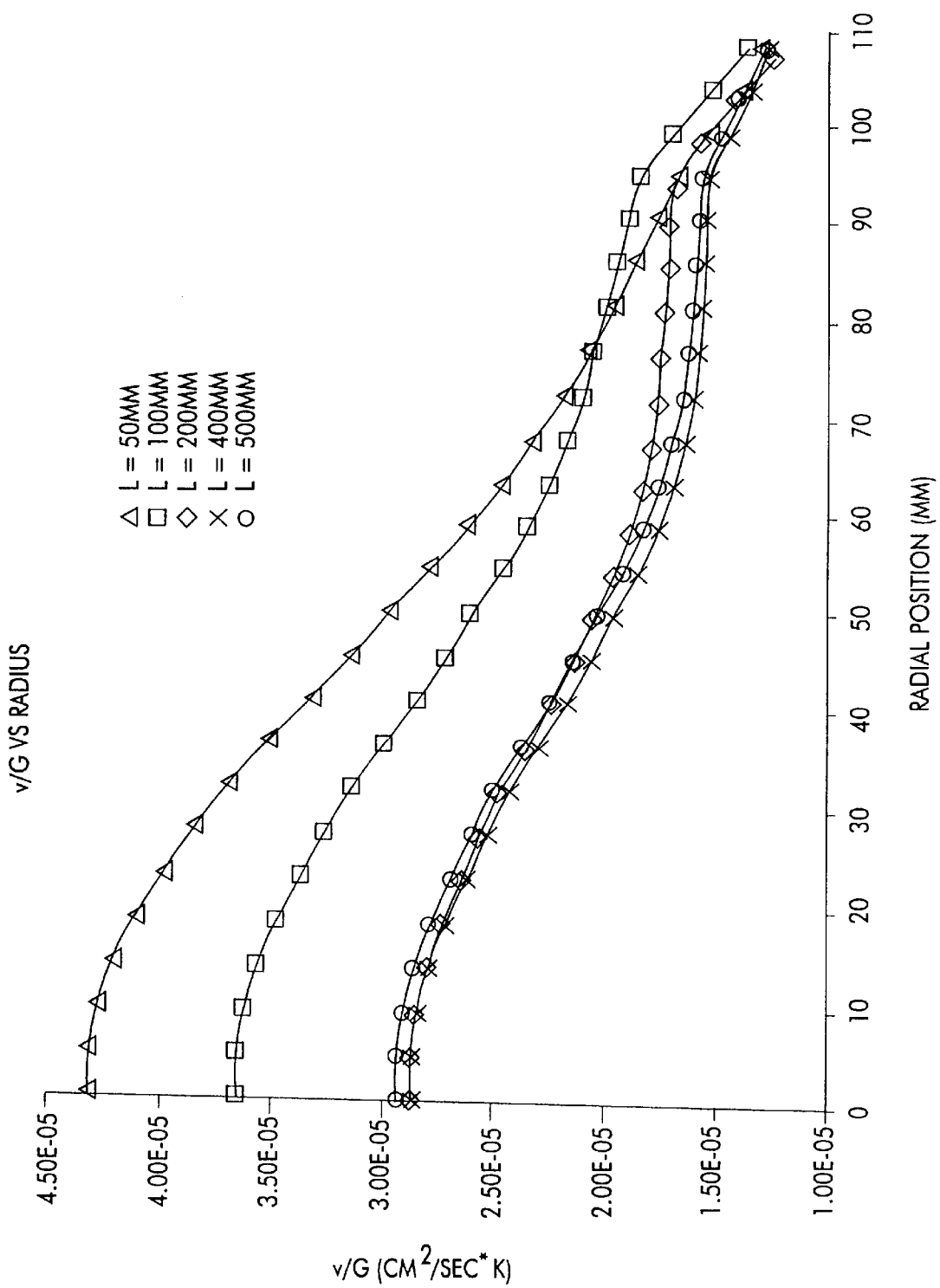
FIG. 28 is a graph of the radial variations in the average axial temperature gradient, $G_0$, at various for an ingot, as described in Example 12.

For this particular data set, it appears there is no systematic dependence of the quality of the crystal on the radial variation in $v/G_0$. As can be seen in FIG. 28, the axial dependence in the ingot is minimal in this sample. The growth conditions involved in this series of experiments represent a fairly narrow range in the radial variation of $G_0$. As a result, this data set is too narrow to resolve a discernable dependence of the quality (i.e., the presence of absence of a band of agglomerated intrinsic point defects) on the radial variation of $G_0$.

Figure 29:
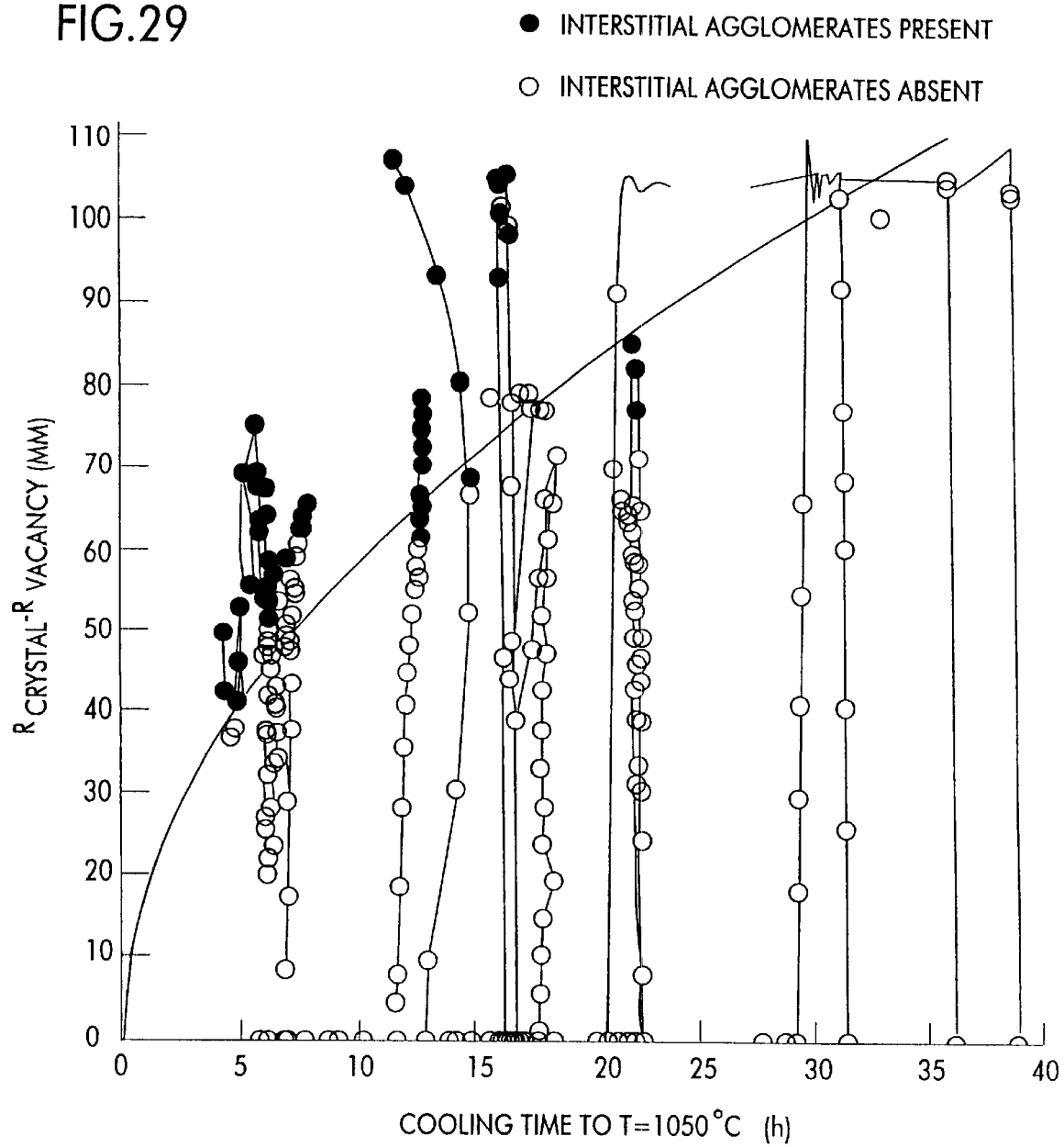
FIG. 29 is a graph illustrating the relationship between the width of the axially symmetric region and the cooling rate, as described in Example 12.

As noted, samples of each ingot prepared were evaluated at various axial positions for the present or absence of agglomerated interstitial defects. For each axial position examined, a correlation may be made between the quality of the sample and the width of the axially symmetric region. Referring now to FIG. 29, a graph may be prepared which compares the quality of the given sample to the time the sample, at that particular axial position, was allowed to cool from solidification to about 1050° C. As expected, this graph shows the width of the axially symmetric region (i.e., $R_{crystal}-R_{vacancy}$) has a strong dependence on the cooling history of the sample within this particular temperature range. In order of the width of the axially symmetric region to increase, the trend suggests that longer diffusion times, or slower cooling rates, are needed.

Based on the data present in this graph, a best fit line may be calculated which generally represents a transition in the quality of the silicon from "good" (i.e., defect-free) to "bad" (i.e., containing defects), as a function of the cooling time allowed for a given ingot diameter within this particular temperature range. This general relationship between the width of the axially symmetric region and the cooling rate may be expressed in terms of the following equation:

$$(R_{crystal}-R_{transition})^2=D_{eff}*t_{1050° C.}$$

wherein
$R_{crystal}$ is the radius of the ingot,
$R_{transition}$ is the radius of the axially symmetric region at an axial position in the sample where a transition occurs in the interstitial dominated material from being defect-free to containing defects, or vice versa,
$D_{eff}$ is a constant, about $9.3*10^{-4}$ cm$^2$sec$^{-1}$, which represents the average time and temperature of interstitial diffusivity, and
$t_{1050° C.}$ is the time required for the given axial position of the sample to cool from solidification to about 1050° C.

Referring again to FIG. 29, it can be seen that, for a given ingot diameter, a cooling time may be estimated in order to obtain an axially symmetric region of a desired diameter. For example, for an ingot having a diameter of about 150 mm, an axially symmetric region having a width about equal to the radius of the ingot may be obtained if, between the temperature range of about 1410° C. and about 1050° C., this particular portion of the ingot is allowed to cool for about 10 to about 15 hours. Similarly, for an ingot having a diameter of about 200 mm, an axially symmetric region having a width about equal to the radius of the ingot may be obtained if between this temperature range this particular portion of the ingot is allowed to cool for about 25 to about 35 hours. If this line is further extrapolated, cooling times of about 65 to about 75 hours may be needed in order to obtain an axially symmetric region having a width about equal to the radius of an ingot having a diameter of about 300 mm. It is to be noted in this regard that, as the diameter of the ingot increases, additional cooling time is required due to the increase in distance that interstitials must diffuse in order to reach sinks at the ingot surface or the vacancy core.

Referring now to FIGS. 30, 31, 32 and 33, the effects of increased cooling time for various ingots may be observed. Each of these figures depicts a portion of an ingot having a nominal diameter of 200 mm, with the cooling time from the temperature of solidification to 1050° C. progressively increasing from FIG. 30 to FIG. 33.

Figure 30:
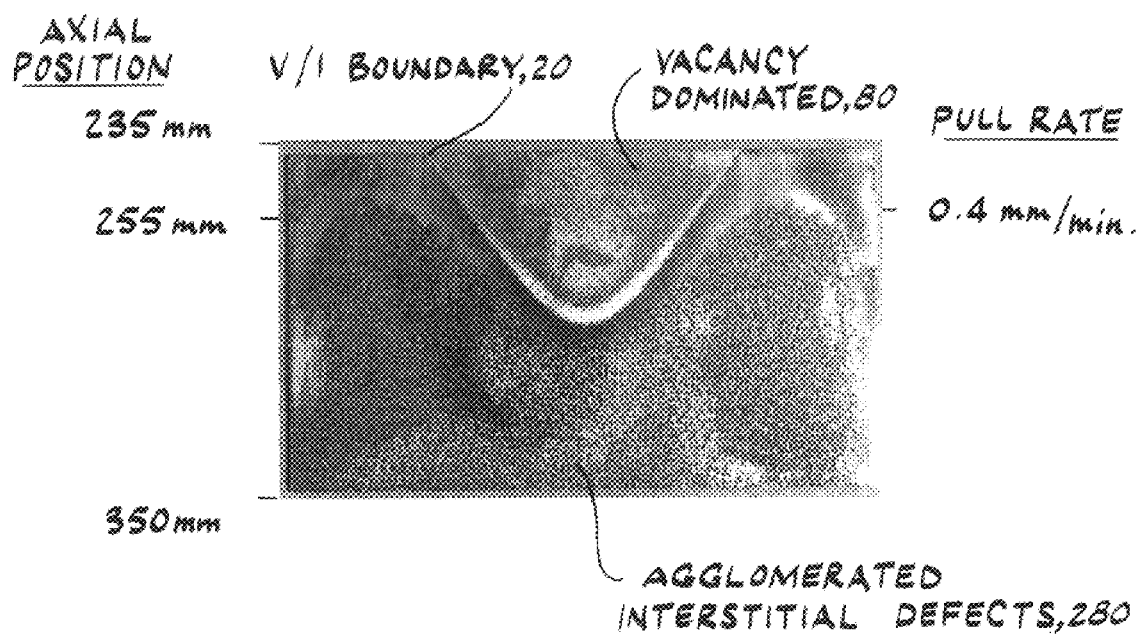
FIG. 30 is a photograph of an axial cut of a segment of an ingot, ranging from about 235 mm to about 350 mm from the shoulder of the ingot, following copper decoration and a defect-delineating etch, described in Example 12.

Referring to FIG. 30, a portion of an ingot, ranging in axial position from about 235 mm to about 350 mm from the shoulder, is shown. At an axial position of about 255 mm, the width of the axially symmetric region free of agglomerated interstitial defects is at a maximum, which is about 45% of the radius of the ingot. Beyond this position, a transition occurs from a region which is free of such defects, to a region in which such defects are present.

Figure 31:
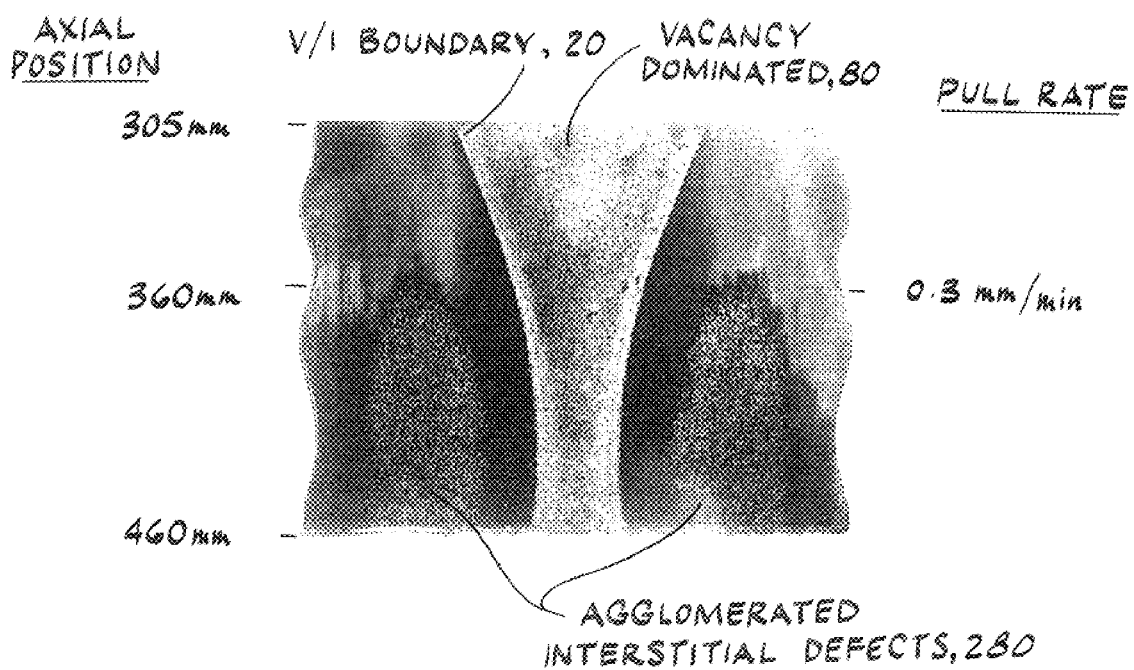
FIG. 31 is a photograph of an axial cut of a segment of an ingot, ranging from about 305 mm to about 460 mm from the shoulder of the ingot, following copper decoration and a defect-delineating etch, described in Example 12.

Referring now to FIG. 31, a portion of an ingot, ranging in axial position from about 305 mm to about 460 mm from the shoulder, is shown. At an axial position of about 360 mm, the width of the axially symmetric region free of agglomerated interstitial defects is at a maximum, which is about 65% of the radius of the ingot. Beyond this position, defect formation begins.

Figure 32:
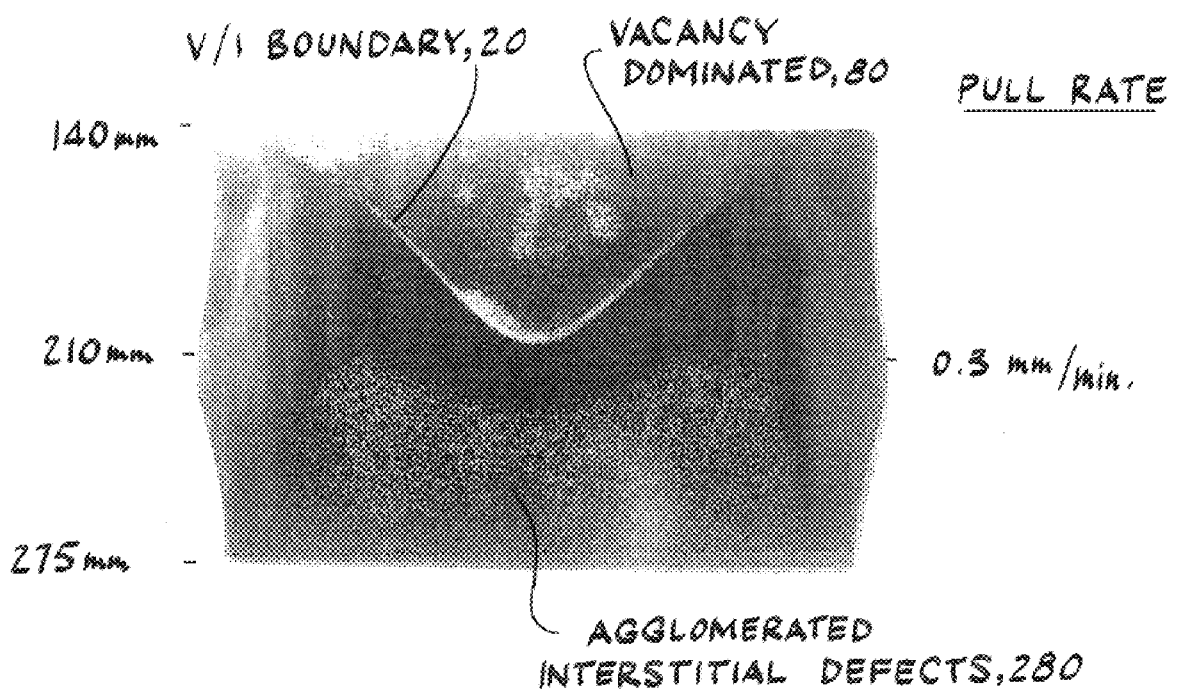
FIG. 32 is a photograph of an axial cut of a segment of an ingot, ranging from about 140 mm to about 275 mm from the shoulder of the ingot, following copper decoration and a defect-delineating etch, described in Example 12.

Referring now to FIG. 32, a portion of an ingot, ranging in axial position from about 140 mm to about 275 mm from the shoulder, is shown. At an axial position of about 210 mm, the width of the axially symmetric region is about equal to the radius of the ingot; that is, a small portion of the ingot within this range is free of agglomerated intrinsic point defects.

Figure 33:
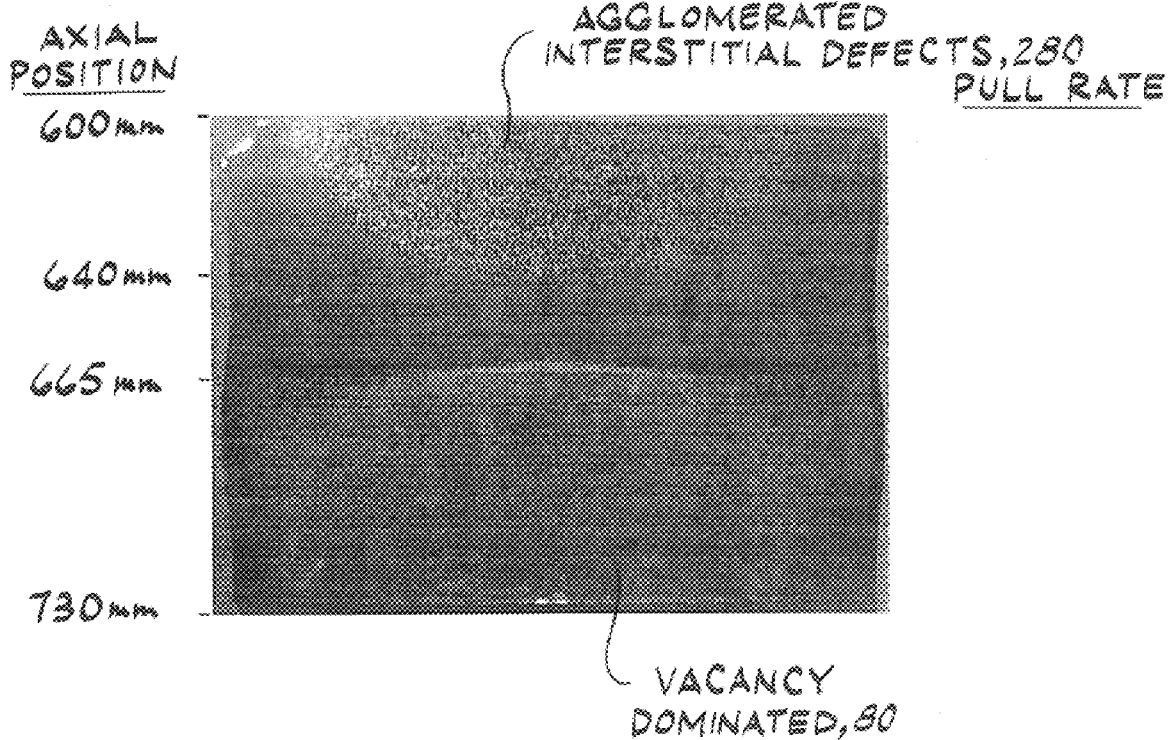
FIG. 33 is a photograph of an axial cut of a segment of an ingot, ranging from about 600 mm to about 730 mm from the shoulder of the ingot, following copper decoration and a defect-delineating etch, described in Example 12.
Figure 34:
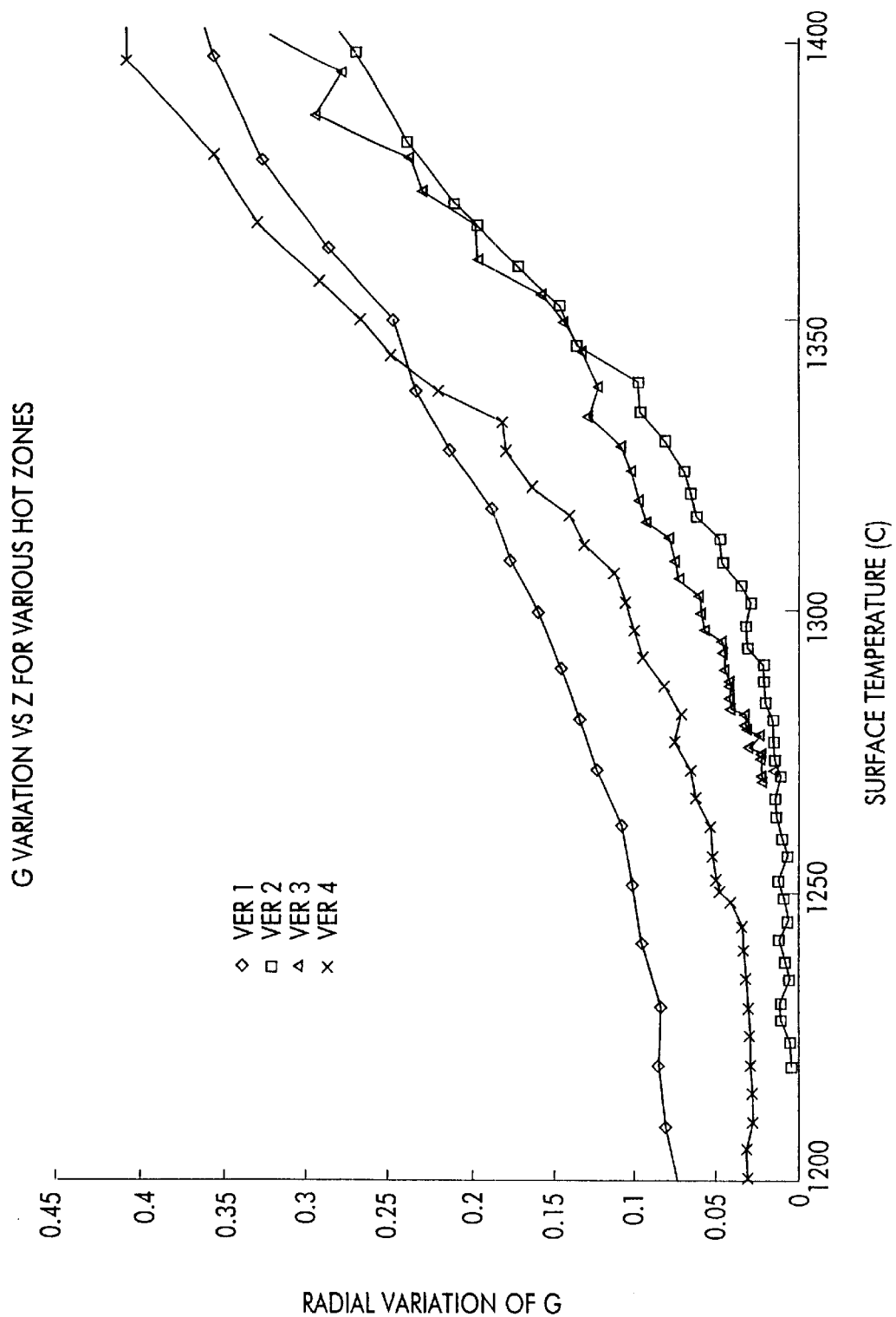
FIG. 34 is a graph illustrating the radial variations in the average axial temperature gradient, $G_0(r)$, which may occur in hot zones of various configurations.
Figure 35:
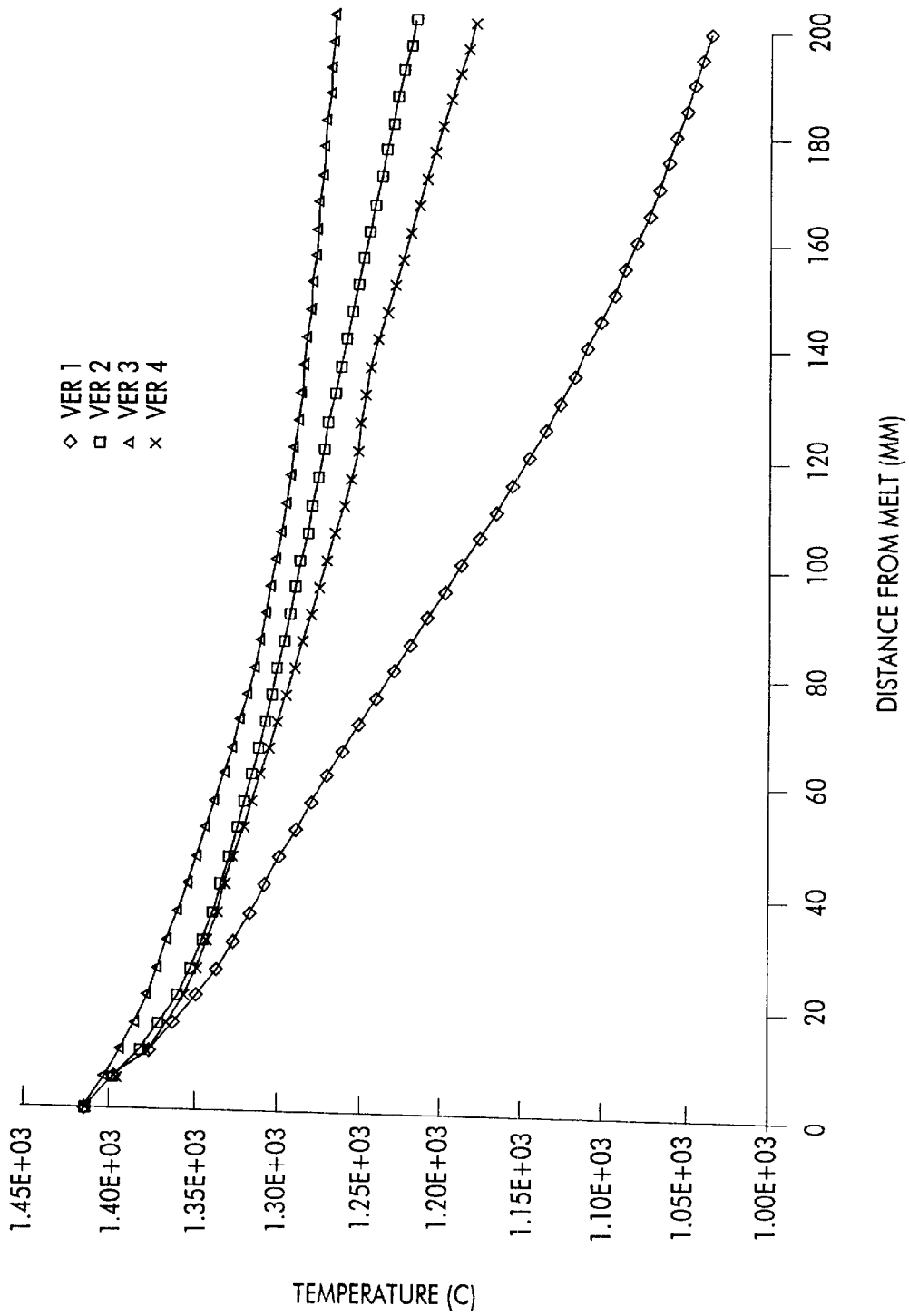
FIG. 35 is a graph illustrating the axial temperature profile for an ingot in four different hot zone configurations.

Referring now to FIG. 33, a portion of an ingot, ranging in axial position from about 600 mm to about 730 mm from the shoulder, is shown. Over an axial position ranging from about 640 mm to about 665 mm, the width of the axially symmetric region is about equal to the radius of the ingot. In addition, the length of the ingot segment in which the width of the axially symmetric region is about equal to the radius of the ingot is greater than what is observed in connection with the ingot of FIG. 32.

When viewed in combination, therefore, FIGS. 30, 31, 32, and 33 demonstrate the effect of cooling time to 1050° C. upon the width and the length of the defect-free, axially symmetric region. In general, the regions containing agglomerated interstitial defects occurred as a result of a continued decrease of the crystal pull rate leading to an initial interstitial concentration which was too large to reduce for the cooling time of that portion of the crystal. A greater length of the axially symmetric region means a larger range of pull rates (i.e., initial interstitial concentration) are available for the growth of such defect-free material. Increasing the cooling time allows for initially higher concentration of interstitials, as sufficient time for radial diffusion may be achieved to suppress the concentration below the critical concentration required for agglomeration of interstitial defects. Stated in other words, for longer cooling times, somewhat lower pull rates (and, therefore, higher initial interstitial concentrations) will still lead to the maximum axially symmetric region 60. Therefore, longer cooling times lead to an increase in the allowable pull rate variation about the condition required for maximum axially symmetric region diameter and ease the restrictions on process control. As a result, the process for an axially symmetric region over large lengths of the ingot becomes easier.

Referring again to FIG. 33, over an axial position ranging from about 665 mm to greater than 730 mm from the shoulder of crystal, a region of vacancy dominated material free of agglomerated defects is present in which the width of the region is equal to the radius of the ingot.

As can be seen from the above data, by means of controlling the cooling rate, the concentration of self-interstitials may be suppressed by allowing more time for interstitials to diffuse to regions where they may be annihilated. As a result, the formation of agglomerated interstitial defects is prevented within a significant portion of the single crystal silicon ingot.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A silicon on insulator structure, the structure comprising:
   a single crystal silicon device layer having a central axis, a circumferential edge, a radius extending from the central axis to the circumferential edge, and a first axially symmetric region in which there is a predominant intrinsic point defect which is substantially free of agglomerated intrinsic point defects;
   a single crystal silicon handle wafer having a central axis, a circumferential edge, a radius extending from the central axis to the circumferential edge, and a second axially symmetric region which is substantially free of agglomerated intrinsic point defects; and,
   an insulating layer between the device layer and the handle wafer.

2. The structure of claim 1 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is at least about 30% of the length of the radius of the layer.

3. The structure of claim 2 wherein the first axially symmetric region is generally annular in shape and the structure additionally comprises a third axially symmetric region, that is generally cylindrical in shape, in which vacancies are the predominant intrinsic point defect, the third region located radially inward of the first region in the device layer.

4. The structure of claim 1 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is at least about 80% of the length of the radius of the layer.

5. The structure of claim 4 wherein the first axially symmetric region is generally annular in shape and the structure additionally comprises a third axially symmetric region, that is generally cylindrical in shape, in which vacancies are the predominant intrinsic point defect, the third region located radially inward of the first region in the device layer.

6. The structure of claim 1 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is about equal to the length of the radius of the layer.

7. The structure as set forth in claim 1 wherein the device layer has as oxygen content which is less than about 13 PPMA.

8. The structure of claim 1 wherein vacancies are the predominant intrinsic point defect within the first axially symmetric region, the first axially symmetric region comprising the central axis of the layer or having a width of at least about 15 mm, as measured along the radius of the layer.

9. The structure of claim 8 further comprising a third axially symmetric region, that is generally annular in shape, in which silicon self-interstitials are the predominant intrinsic point defect, the third region being located radially outward of the first region and being substantially free of agglomerated intrinsic point defects.

10. The structure of claim 8 wherein the first axially symmetric region has a width which is at least about 25% of the length of the radius of the layer.

11. The structure of claim 10 further comprising a third axially symmetric region, that is generally annular in shape, in which silicon self-interstitials are the predominant intrinsic point defect, the third region being located radially outward of the first region and being substantially free of agglomerated intrinsic point defects.

12. The structure of claim 8 wherein the first axially symmetric region has a width with is about equal to the length of the radius of the layer.

13. The structure of claim 1 wherein silicon self-interstitials are the predominant intrinsic point defect within the second axially symmetric region, the second axially symmetric region extending radially inward from the circumferential edge of the handle wafer and having a width, as measured from the circumferential edge radially toward the central axis, which is at least about 30% of the length of the radius of the handle wafer.

14. The structure of claim 13 wherein the second axially symmetric region is generally annular in shape and the structure additionally comprises a third axially symmetric region, that is generally cylindrical in shape, in which vacancies are the predominant intrinsic point defect, the third region located radially inward of the second region in the handle wafer.

15. The structure of claim 1 wherein silicon self-interstitials are the predominant intrinsic point defect within the second axially symmetric region, the second axially symmetric region extending radially inward from the circumferential edge of the handle wafer and having a width, as measured from the circumferential edge radially toward the central axis, which is at least about 80% of the length of the radius of the handle wafer.

16. The structure of claim 1 wherein the second axially symmetric region is generally annular in shape and the structure additionally comprises a third axially symmetric region, that is generally cylindrical in shape, in which vacancies are the predominant intrinsic point defect, the third region located radially inward of the second region in the device layer.

17. The structure of claim 1 wherein silicon self-interstitials are the predominant intrinsic point defect within the second axially symmetric region, the second axially symmetric region extending radially inward from the circumferential edge of the handle wafer and having a width, as measured from the circumferential edge radially toward the central axis, which is about equal to the length of the radius of the handle wafer.

18. The structure of claim 17 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is about equal to the length of the radius of the layer.

19. The structure of claim 17 wherein vacancies are the predominant intrinsic point defect within the first axially symmetric region, the first axially symmetric region extending radially inward from the circumferential edge of the device layer and having a width, as measured from the circumferential edge radially toward the central axis, which is about equal to the length of the radius of the layer.

20. The structure as set forth in claim 1 wherein the handle wafer has as oxygen content which is less than about 13 PPMA.

21. The structure of claim 1 wherein vacancies are the predominant intrinsic point defect within the second axially symmetric region, the second axially symmetric region comprising the central axis of the layer or having a width of at least about 15 mm, as measured along the radius of the handle wafer.

22. The structure of claim 21 further comprising a third axially symmetric region, that is generally annular in shape, in which silicon self-interstitials are the predominant intrinsic point defect, the third region being located radially outward of the second region and being substantially free of agglomerated intrinsic point defects.

23. The structure of claim 21 wherein the second axially symmetric region has a width which is at least about 25% of the length of the radius of the handle wafer.

24. The structure of claim 23 further comprising a third axially symmetric region, that is generally annular in shape, in which silicon self-interstitials are the predominant intrinsic point defect, the third region being located radially outward of the second region and being substantially free of agglomerated intrinsic point defects.

25. The structure of claim 21 wherein the second axially symmetric region has a width with is about equal to the length of the radius of the handle wafer.

26. The structure of claim 21 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is about equal to the length of the radius of the layer.

27. The structure of claim 21 wherein vacancies are the predominant intrinsic point defect within the first axially symmetric region, the first axially symmetric region extending radially inward from the circumferential edge of the device layer and having a width, as measured from the circumferential edge radially toward the central axis, which is about equal to the length of the radius of the layer.

28. The structure of claim 13 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is at least about 30% of the length of the radius of the device layer.

29. The structure of claim 28 wherein the first axially symmetric region is generally annular in shape and the structure additionally comprises a third axially symmetric region, that is generally cylindrical in shape, in which vacancies are the predominant intrinsic point defect, the third region located radially inward of the first region in the device layer.

30. The structure of claim 29 wherein the second axially symmetric region is generally annular in shape and the structure additionally comprises a fourth axially symmetric region, that is generally cylindrical in shape, in which vacancies are the predominant intrinsic point defect, the fourth region located radially inward of the first region in the device layer.

31. The structure of claim 13 wherein vacancies are the predominant intrinsic point defect within the first axially symmetric region, the first axially symmetric region comprising the central axis of the layer or having a width of at least about 15 mm, as measured along the radius of the layer.

32. The structure of claim 31 further comprising a third axially symmetric region, that is generally annular in shape, in which silicon self-interstitials are the predominant intrinsic point defect, the third region being located radially outward of the first region and being substantially free of agglomerated intrinsic point defects.

33. The structure of claim 32 wherein the second axially symmetric region is generally annular in shape and the structure additionally comprises a fourth axially symmetric region, that is generally cylindrical in shape, in which vacancies are the predominant intrinsic point defect, the fourth region located radially inward of the first region in the device layer.

34. The structure of claim 21 wherein silicon self-interstitials are the predominant intrinsic point defect within the first axially symmetric region, the first axially symmetric region extending radially inward from the circumferential edge of the device layer and having a width, as measured from the circumferential edge radially toward the central axis, which is at least about 30% of the length of the radius of the device layer.

35. The structure of claim 34 wherein the first axially symmetric region is generally annular in shape and the structure additionally comprises a third axially symmetric region, that is generally cylindrical in shape, in which vacancies are the predominant intrinsic point defect, the third region located radially inward of the first region in the device layer.

36. The structure of claim 21 further comprising a fourth axially symmetric region, that is generally annular in shape, in which silicon self-interstitials are the predominant intrinsic point defect, the fourth region being located radially outward of the second region and being substantially free of agglomerated intrinsic point defects.

37. The structure of claim 21 wherein vacancies are the predominant intrinsic point defect within the first axially symmetric region, the first axially symmetric region comprising the central axis of the layer or having a width of at least about 15 mm, as measured along the radius of the layer.

38. The structure of claim 37 further comprising a third axially symmetric region, that is generally annular in shape, in which silicon self-interstitials are the predominant intrinsic point defect, the third region being located radially outward of the first region and being substantially free of agglomerated intrinsic point defects.

39. The structure of claim 38 further comprising a fourth axially symmetric region, that is generally annular in shape, in which silicon self-interstitials are the predominant intrinsic point defect, the fourth region being located radially outward of the second region and being substantially free of agglomerated intrinsic point defects.

40. The structure of claim 1 wherein the handle wafer further comprises two major, generally parallel surfaces, one of which is the front surface and the other of which is the back surface of the silicon wafer, a central plane between the front and back surfaces, the circumferential edge joining the front and back surfaces, a surface layer which comprises a first region of the silicon wafer between the front surface and a distance, $D_1$, of at least about 10 micrometers, as measured from the front surface and toward the central plane, and a bulk layer which comprises a second region of the silicon wafer between the central plane and the first region, the silicon wafer having a non-uniform distribution of crystal lattice vacancies with the concentration of vacancies in the bulk layer being greater than the concentration of vacancies in the surface layer, with the vacancies having a concentration profile in which the peak density of the vacancies is at or near the central plane with the concentration generally decreasing from the position of peak density in the direction of the front surface of the handle wafer.

41. The structure of claim 1 wherein the handle wafer further comprises two major, generally parallel surfaces, one of which is the front surface and the other of which is the back surface of the silicon wafer, a central plane between the front and back surfaces, the circumferential edge joining the front and back surfaces, and a denuded zone which comprises the region of the silicon wafer from the front surface to a distance, $D_1$, of at least about 10 micrometers, as measured in the direction of the central plane, and which contains interstitial oxygen, the silicon wafer having a concentration of interstitial oxygen in the denuded zone at a distance equal to about one-half of $D_1$ is at least about 75% of the maximum concentration of interstitial oxygen in the denuded zone.

42. The structure of claim 1 wherein the handle wafer further comprises two major, generally parallel surfaces, one of which is the front surface and the other of which is the back surface of the silicon wafer, a central plane between the front and back surfaces, the circumferential edge joining the front and back surfaces, a front surface layer consisting of a first region of the silicon wafer within a distance, $D_2$, of no more than about 15 micrometers from the front surface and a bulk layer comprising a second region of the silicon wafer between the central plane and the front surface layer, the bulk layer having a substantially uniform oxygen concentration and a concentration of crystal lattice vacancies such that upon subjecting the silicon wafer to an oxygen precipitation heat treatment consisting essentially of annealing the silicon wafer at 800° C. for four hours and then at 1000° C. for sixteen hours, the silicon wafer will contain oxygen precipitates having a concentration profile in which the peak density of the precipitates in the bulk layer is at or near the central plane with the concentration of the precipitates in the bulk layer generally decreasing in the direction of the front surface layer.

* * * * *